US012672444B2

(12) United States Patent
Zhu et al.

(10) Patent No.: US 12,672,444 B2
(45) Date of Patent: Jun. 30, 2026

(54) DISPLAY SUBSTRATE AND DISPLAY APPARATUS

(71) Applicant: BOE Technology Group Co., Ltd., Beijing (CN)

(72) Inventors: Jianchao Zhu, Beijing (CN); Guangliang Shang, Beijing (CN); Libin Liu, Beijing (CN); Shiming Shi, Beijing (CN); Yuxin Zhang, Beijing (CN)

(73) Assignee: BOE Technology Group Co Ltd, Beijing (CN)

( * ) Notice: Subject to any disclaimer, the term of this patent is extended or adjusted under 35 U.S.C. 154(b) by 486 days.

(21) Appl. No.: 18/033,339

(22) PCT Filed: May 30, 2022

(86) PCT No.: PCT/CN2022/096056
§ 371 (c)(1),
(2) Date: Apr. 22, 2023

(87) PCT Pub. No.: WO2023/230785
PCT Pub. Date: Dec. 7, 2023

(65) Prior Publication Data
US 2024/0381710 A1      Nov. 14, 2024

(51) Int. Cl.
*H10K 59/122* (2023.01)
*H10K 59/131* (2023.01)
*H10K 59/80* (2023.01)

(52) U.S. Cl.
CPC ......... *H10K 59/131* (2023.02); *H10K 59/122* (2023.02); *H10K 59/8792* (2023.02)

(58) Field of Classification Search
CPC .. H10K 59/122; H10K 59/123; H10K 59/121; H10K 59/8792; H10K 50/865; H10L 59/1213
See application file for complete search history.

(56) References Cited

U.S. PATENT DOCUMENTS 10,756,136 B1      8/2020   Ma et al.
2016/0240802 A1 *   8/2016   Lee ...................... H10K 59/351
(Continued)

FOREIGN PATENT DOCUMENTS

CN      109599053  A      4/2019
CN      109830509  A      5/2019
(Continued)

OTHER PUBLICATIONS

Office Action dated Jun. 15, 2023 for Chinese Patent Application No. 202211497510.5 and English Translation.
(Continued)

*Primary Examiner* — Chad M Dicke
*Assistant Examiner* — Valerie N Newton

(57)      ABSTRACT
A display substrate includes: a first display region (A1). The first display region (A1) includes multiple display island regions (A11) spaced apart from each other, a light-transmissive region (A12) between adjacent display island regions, and a connection region (A13) connecting adjacent display island regions (A11). A display island region (A11) includes a first pixel unit (P1). The first pixel unit (P1) includes: a first region pixel circuit (13) and a first region light emitting element (11). The display island region (A11) has an arc edge.

20 Claims, 30 Drawing Sheets

(56)                    References Cited

U.S. PATENT DOCUMENTS

| | | | | | |
|---|---|---|---|---|---|
| 2017/0371463 | A1* | 12/2017 | Choi | | H10K 59/131 |
| 2018/0046221 | A1* | 2/2018 | Choi | | H05B 33/22 |
| 2020/0409419 | A1 | 12/2020 | He et al. | | |
| 2021/0233970 | A1 | 7/2021 | Wang et al. | | |
| 2021/0265430 | A1 | 8/2021 | Chang et al. | | |
| 2021/0376033 | A1 | 12/2021 | Chae et al. | | |
| 2021/0408146 | A1 | 12/2021 | Ying et al. | | |
| 2022/0077423 | A1* | 3/2022 | Zhang | | H10K 71/621 |
| 2022/0085130 | A1 | 3/2022 | Zhai | | |
| 2022/0123094 | A1 | 4/2022 | Qiu et al. | | |
| 2022/0190055 | A1 | 6/2022 | Lou et al. | | |
| 2022/0376003 | A1 | 11/2022 | Wang et al. | | |
| 2022/0384747 | A1 | 12/2022 | Sun et al. | | |
| 2023/0075199 | A1 | 3/2023 | Tian et al. | | |
| 2023/0230204 | A1 | 7/2023 | Xu et al. | | |
| 2023/0269985 | A1 | 8/2023 | Chen et al. | | |

FOREIGN PATENT DOCUMENTS

| | | | |
|---|---|---|---|
| CN | 110061014 | A | 7/2019 |
| CN | 110070801 | A | 7/2019 |
| CN | 110289292 | A | 9/2019 |
| CN | 110444570 | A | 11/2019 |
| CN | 110634937 | A | 12/2019 |
| CN | 111180483 | A | 5/2020 |
| CN | 111326560 | A | 6/2020 |
| CN | 111341936 | A | 6/2020 |
| CN | 111554714 | A | 8/2020 |
| CN | 111968522 | A | 11/2020 |
| CN | 112489585 | A | 3/2021 |
| CN | 112490272 | A | 3/2021 |
| CN | 113053982 | A | 6/2021 |
| CN | 113764470 | A | 12/2021 |
| CN | 113793864 | A | 12/2021 |
| CN | 113871418 | A | 12/2021 |
| CN | 113972336 | A | 1/2022 |
| WO | 2021147374 | A1 | 7/2021 |

OTHER PUBLICATIONS

Notice of Allowance dated Aug. 2, 2023 for Chinese Patent Application No. 202211497510.5 and English Translation.
Office Action dated Dec. 16, 2022 for Chinese Patent Application No. 202280001581.3 and English Translation.
Office Action dated Mar. 25, 2023 for Chinese Patent Application No. 202280001581.3 and English Translation.
Notice of Allowance dated May 29, 2023 for Chinese Patent Application No. 202280001581.3 and English Translation.

* cited by examiner

A13

A12-1

A13

A12-1

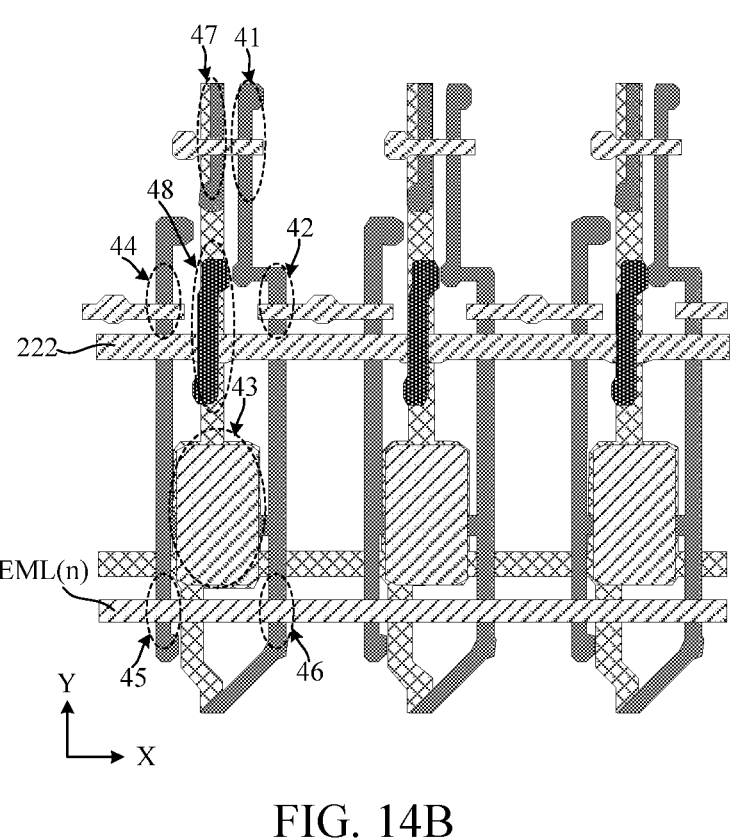
FIG. 14B
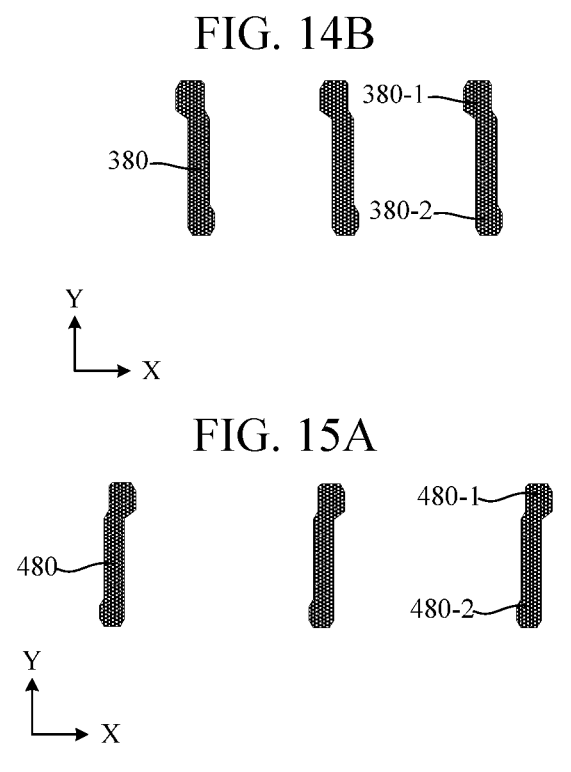
FIG. 15A
FIG. 15B

DISPLAY SUBSTRATE AND DISPLAY APPARATUS

CROSS-REFERENCE TO RELATED APPLICATION

The present application is a U.S. National Phase Entry of International Application No. PCT/CN2022/096056 having an international filing date of May 30, 2022, the content of which is incorporated into this application by reference.

TECHNICAL FIELD

The present disclosure relates to, but is not limited to, the field of display technology, in particular to a display substrate and a display apparatus.

BACKGROUND

An Organic Light Emitting Diode (OLED) and a Quantum dot Light Emitting Diode (QLED) are active light emitting display devices, and have advantages of self-illumination, a wide viewing angle, a high contrast ratio, low power consumption, an extremely high response speed, lightness and thinness, bendability, and a low cost, etc.

SUMMARY

The following is a summary of subject matters described herein in detail. The summary is not intended to limit the protection scope of claims.

Embodiments of the present disclosure provide a display substrate and a display apparatus.

In one aspect, the present embodiment provides a display substrate including: a first display region. The first display region includes multiple display island regions spaced apart from each other, a light-transmissive region between adjacent display island regions, and a connection region connecting adjacent display island regions. A display island region includes a first pixel unit arranged on a base, wherein the first pixel unit includes a first region pixel circuit and a first region light emitting element electrically connected with the first region pixel circuit; an orthographic projection of the first region pixel circuit on the base overlaps with an orthographic projection of the first region light emitting element electrically connected with the first region pixel circuit on the base. The display island region has an arc edge.

In some exemplary embodiments, the display island region is circular or oval.

In some exemplary embodiments, edges of the light-transmissive region include: a first edge contacting the connection region, and a second edge contacting the display island region; first edges and second edges are connected in an interleaved mode, and the second edge is arc-shaped.

In some exemplary embodiments, the light-transmissive region is octagonal.

In some exemplary embodiments, the first edge of the light-transmissive region is linear, wavy, or a folding line shape.

In some exemplary embodiments, the display island region includes a first pixel unit, the first pixel unit includes three first region light emitting elements; the three first region light emitting elements include a first light emitting element emitting light of a first color, a second light emitting element emitting light of a second color, and a third light emitting element emitting light of a third color.

In some exemplary embodiments, light emitting regions of the first light emitting element, the second light emitting element, and the third light emitting element as a whole are formed as a circular or oval shape.

In some exemplary embodiments, the first pixel unit further includes three first region pixel circuits, the three first region pixel circuits and the three first region light emitting elements are electrically connected in a one-to-one correspondence. The three first region pixel circuits are sequentially arranged along a first direction; the first light emitting element and the second light emitting element are sequentially arranged in a second direction, and the third light emitting element is located on a same side of the first light emitting element and the second light emitting element in the first direction; wherein the first direction intersects the second direction.

In some exemplary embodiments, the display island region further includes multiple data lines; at least one first region pixel circuit is electrically connected with a data line, and an orthographic projection of the first region pixel circuit on the base overlaps with orthographic projections of two data lines on the base. At least one of the multiple data lines surrounds out sides of all first region pixel circuits of the first pixel unit.

In some exemplary embodiments, the first pixel unit includes three first region pixel circuits; the three first region pixel circuits include a first pixel circuit, a second pixel circuit and a third pixel circuit arranged in sequence in a first direction. The display island region includes a first data line to a twelfth data line arranged in sequence along the first direction. The first to third data line are located on a side of the three first region pixel circuits in the first direction, and the tenth to twelfth data line are located on the other side of the three first region pixel circuits in the first direction. The first pixel circuit is electrically connected with the fourth data line, and an orthographic projection of the first pixel circuit on the base overlaps with orthographic projections of the fourth data line and the fifth data line on the base. The second pixel circuit is electrically connected with the sixth data line, and an orthographic projection of the second pixel circuit on the base overlaps with orthographic projections of the sixth data line and the seventh data line on the substrate. The third pixel circuit is electrically connected to the eighth data line, and an orthographic projection of the third pixel circuit on the base overlaps with orthographic projections of the eighth data line and the ninth data line on the base.

In some exemplary embodiments, the first data line to the third data line, and the tenth data line to the twelfth data line are all arc-shaped wirings that bend towards a direction away from the first region pixel circuit in the first direction, wherein a bending direction of the first data line to the third data line is different from a bending direction of the tenth data line to the twelfth data line.

In some exemplary embodiments, the first data line to third data line and the tenth data line to twelfth data line are of a same layer structure and are located on a side of the fourth data line to ninth data line away from the base.

In some exemplary embodiments, the first region pixel circuit includes: at least one first-type transistor, at least one second-type transistor, and a storage capacitor, and a transistor type of the first-type transistor is different from a transistor type of the second-type transistor.

In some exemplary embodiments, in a direction perpendicular to the display substrate, the first display region at least includes: a base, and a first semiconductor layer, a second conductive layer, a second semiconductor layer, a third conductive layer, a fourth conductive layer, a fifth conductive layer and a sixth conductive layer that are disposed on the base. The first semiconductor layer at least includes an active layer of the first-type transistor of the first region pixel circuit. The second conductive layer at least includes: a gate of the first-type transistor of the first region pixel circuit. The second semiconductor layer at least includes an active layer of the second-type transistor of the first region pixel circuit. The third conductive layer at least includes a gate of the second-type transistor of the first region pixel circuit. The fourth conductive layer at least includes: multiple scan signal lines electrically connected to the first region pixel circuit. The fifth conductive layer at least includes multiple data lines electrically connected or overlapped with the first region pixel circuit. The sixth conductive layer at least includes multiple data lines located on periphery of the first region pixel circuit.

In some exemplary embodiments, the first semiconductor layer, the second conductive layer, the second semiconductor layer, the third conductive layer, the fourth conductive layer, the fifth conductive layer and the sixth conductive layer are sequentially arranged on the base.

In some exemplary embodiments, the sixth conductive layer of the display island region further includes: a power supply transmission line for transmitting a first voltage signal, a power supply transmission line for transmitting a second voltage signal, an initial transmission line for transmitting a first initial signal, and an initial transmission line for transmitting a second initial signal.

In some exemplary embodiments, the display substrate further includes a second display region located on at least one side of the first display region; the second display region includes a second pixel unit disposed on the base, the second pixel unit includes a second region pixel circuit and a second region light emitting element electrically connected with the second region pixel circuit; an orthographic projection of the second region pixel circuit on the base overlaps with an orthographic projection of the second region light emitting element electrically connected with the second region pixel circuit on the base. Herein, a density of first pixel units in the first display region is lower than a density of the second pixel units in the second display region.

In some exemplary embodiments, two rows of second pixel units of the second display region correspond to one row of first pixel units of the first display region, and two columns of second pixel units of the second display region correspond to one column of first pixel units of the first display region.

In some exemplary embodiments, the second display region further includes multiple data lines, a second region pixel circuit in a 2n-th row and a j-th column is connected to a different data line from a second region pixel circuit in a (2n−1)-th row and the j-th column, wherein both n and j are integers.

In some exemplary embodiments, the first display region further includes: a pixel define layer, and a black matrix located on a side of the pixel define layer away from the base. The pixel define layer of the display island region has a pixel opening that exposes a portion of an anode of the first region light emitting element; the black matrix has a matrix opening; an orthographic projection of the matrix opening on the base covers an orthographic projection of the pixel opening on the base, and an orthographic projection of the anode of the first region light emitting element on the base covers the orthographic projection of the matrix opening on the base.

In some exemplary embodiments, the black matrix covers the connection region.

In another aspect, an embodiment of the present disclosure provides a display apparatus, which includes the aforementioned display substrate and a sensor located on a non-display side of the display substrate, and an orthographic projection of the sensor on the display substrate overlaps with the first display region of the display substrate.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

FIG. 14B is a partially enlarged schematic diagram of a display substrate after a second semiconductor layer is formed in a second display region according to at least one embodiment of the present disclosure.

FIG. 15A is a schematic diagram of the second semiconductor layer in FIG. 14A.

FIG. 15B is a schematic diagram of the second semiconductor layer in FIG. 14B.

DETAILED DESCRIPTION

Figure 1:
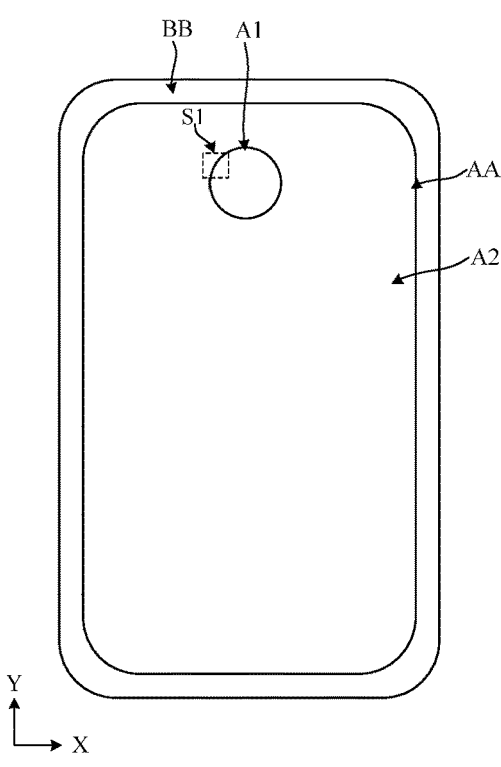
FIG. 1 is a schematic diagram of a display substrate according to at least one embodiment of the present disclosure.

The embodiments of the present disclosure will be described below in combination with the drawings in detail. Implementations may be implemented in multiple different forms. Those of ordinary skill in the art may easily understand such a fact that manners and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other without conflict.

In the drawings, a size(s) of one or more constituent elements, a thickness of a layer, or a region is sometimes exaggerated for clarity. Therefore, an implementation of the present disclosure is not necessarily limited to the dimension, and a shape(s) and a size(s) of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not set to make a limit in quantity. In the present disclosure, "multiple" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case where constituent elements are connected together through an element with a certain electrical effect. The "element having some electrical effect" is not particularly limited as long as electrical signals between the connected constituent elements may be transmitted. Examples of the "element having some electrical effect" not only include an electrode and a wiring, but also further include a switch element such as a transistor, a resistor, an inductor, a capacitor, another element with multiple functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case where transistors with opposite polarities are used, or in a case where a direction of a current changes during work of a circuit, or the like, functions of the "source electrode" and the "drain electrode" may sometimes be exchangeable. Therefore, the "source electrode" and the "drain electrode" may be exchangeable in the specification. In addition, the gate may also be referred to as a control electrode.

In the specification, "parallel" refers to a state in which an angle formed by two straight lines is −10° or more than −10° and 10° or less than 10°, and thus also includes a state in which the angle is −5° or more than −5° and 5° or less than 5°. In addition, "perpendicular" refers to a state in which an angle formed by two straight lines is 80° or more than 80° and 100° or less than 100°, and thus also includes a state in which the angle is 85° or more than 85° and 95° or less than 95°.

In this specification, a circle, oval, triangle, rectangle, trapezoid, pentagon or hexagon, etc. is not strictly speaking, but may be an approximate circle, oval, triangle, rectangle, trapezoid, pentagon or hexagon, etc. Some small deformations due to tolerances may exist, for example, guide angles, curved edges and deformations thereof may exist.

A "light transmission rate" in the present disclosure refers to a capability of light to pass through a medium, and refers to a percentage of luminous flux passing through a transparent or translucent body to its incident luminous flux.

In the present disclosure, "about" and "substantially" refer to a case where a boundary is not defined strictly and a process and measurement error within a range is allowed. In the present disclosure, "substantially the same" is a case where values differ by less than 10%.

In the present disclosure, "A extends in a B direction" means that A may include a main portion, which is a line, a line segment or a strip-shaped body, and a secondary portion connected with the main portion, the main portion extends in the B direction, and a length of the main portion extending in the B direction is greater than a length of the secondary portion extending in another direction. "A extends in a B direction" in the present disclosure means "a main portion of A extends in a B direction".

With the wide development and deep application of OLED technology, the pursuit of a high screen ratio display and a full screen that have better visual experience has become one of the trends of current display technology development. For example, under screen fingerprint identification technology, beauty's peak screen and other technologies have greatly increased the screen ratio of the display screen. However, limited by the light transmittance of multiple film structures and the "screen door effect" of the metal wirings of the array base, etc., the manufacturing process of the front camera is restricted, and the light transmittance, display effect and camera effect of the display product need to be improved.

An embodiment of the present disclosure provides a display substrate including: a first display region. The first display region includes multiple display island regions spaced apart from each other, a light-transmissive region between adjacent display island regions, and a connection region connecting adjacent display island regions. A display island region includes a first pixel unit arranged on a base, wherein the first pixel unit includes a first region pixel circuit and a first region light emitting element electrically connected with the first region pixel circuit. An orthographic projection of the first region pixel circuit on the base overlaps with an orthographic projection of the first region light emitting element electrically connected with the first region pixel circuit on the base. The display island region has an arc edge. In some examples, the edge shape of the display island region may be determined by the arrangement and form of the signal wirings in the display island region, or, the edge shape of the display island region may be determined by an edge of a black matrix arranged in the display island region. However, this embodiment is not limited thereto.

The display substrate provided by the embodiment can reduce the light diffraction effect of the display substrate by arranging the edge of the display island region as an arc shape, thereby improving the display effect and the shooting effect of the display apparatus.

In some exemplary embodiments, the display island region may be circular or oval. However, this embodiment is not limited thereto. In some other examples, the edge of the display island region may be formed by connecting multiple arc segments. The radians of the multiple arc segments may be the same, or the radians of some of the multiple arc segments may be the same, or the radians of the multiple arc segments may be different.

In some exemplary embodiments, edges of the light-transmissive region may include a first edge in contact with the connection region, and a second edge in contact with the display island region. The first edges and the second edges are connected in an interleaved mode. The second edge is of an arc shape. An angle formed between the first edge and the second edge is not a right angle, that is, neither of the first edge nor the second edge is a right angle edge, so that the light diffraction effect of the display substrate can be reduced.

In some examples, the light-transmissive region may be octagonal. For example, the light-transmissive region may be surrounded by four display island regions and four connection regions, thereby forming an octagonal light-transmissive region.

In some examples, the first edge of the light-transmissive region may be linear, wavy, or a folding line shape. For example, the connection region may be a strip region, and the connection region may communicate with an adjacent display island region. A first edge of the light-transmissive region is an edge of the connection region near the light-transmissive region, and the first edge may be a flat edge, or the first edge may be uneven, for example, the first edge may at least include one of the following: a protrusion part, a depression part. Similarly, a second edge of the connection region may be an arcuate flat edge, or may at least include one of the following: a protrusion part, a depression part.

In some exemplary embodiments, a display island region may include a first pixel unit. The first pixel unit may include three first region light emitting elements. The three first region light emitting elements may include a first light emitting element emitting light of a first color, a second light emitting element emitting light of a second color, and a third light emitting element emitting light of a third color. The light of a first color, the light of a second color and the light of a third color may be light of different colors. For example, the light of the first color may be green light, the light of the second color may be red light, and the light of the third color may be blue light. However, this embodiment is not limited thereto. In this example, by providing an independent first pixel unit in the display island region, the first pixel units can be evenly distributed, thereby effectively improving the display effect of the first display region.

In some exemplary embodiments, light emitting regions of the first light emitting element, the second light emitting element, and the third light emitting element in the display island region as a whole may be formed as a circular or oval shape. In this way, it may be ensured that there is no right angle edge in the light-transmissive region, thereby reducing the diffraction effect of the display substrate. In the present disclosure, the light emitting region of the light emitting element may be a portion of the light emitting element which is located at a pixel opening of a pixel define layer.

In some exemplary embodiments, the first pixel unit may further include three first region pixel circuits, the three first region pixel circuits and the three first region light emitting elements are electrically connected in a one-to-one correspondence. The three first region pixel circuits may be sequentially arranged along a first direction. The first light emitting element and the second light emitting element are sequentially arranged in a second direction, and the third light emitting element may be located on a same side of the first light emitting element and the second light emitting element in the first direction; wherein the first direction intersects the second direction. For example, the first direction and the second direction are perpendicular to each other.

In some exemplary embodiments, the display island region may further include multiple data lines. The first region pixel circuit of the pixel island region is electrically connected with a data line, and an orthographic projection of the first region pixel circuit on the base overlaps with orthographic projections of two data lines on the base. At least one of the multiple data lines of the pixel island region surrounds an outside of all first region pixel circuits of the first pixel unit. In this example, multiple data lines of the display island region may be divided into two groups, the first group of data lines may pass through the first region pixel circuit, and the second group of data lines may bypass the first region pixel circuit, thereby reducing mutual interference between the data lines and the first region pixel circuit. In some examples, in a direction perpendicular to the display substrate, the second group of data lines may be located on a side of the first group of data lines away from the base.

In some exemplary embodiments, the first region pixel circuit may include: at least one first-type transistor, at least one second-type transistor, and a storage capacitor, and transistor types of the first-type transistor and the second-type transistor may be different. For example, the first-type transistor may be a P-type transistor, and the second-type transistor may be an N-type transistor.

In some exemplary embodiments, the display substrate may further include: a second display region located on at least one side of the first display region. The second display region may include at least one second pixel unit disposed on the base. The second pixel unit may include: at least one second region pixel circuit and at least one second region light emitting element; the at least one second region pixel circuit is electrically connected to the at least one second region light emitting element, and an orthographic projection of the at least one second region pixel circuit on the base overlaps with an orthographic projection of the at least one second region light emitting element on the base. Herein, a density of the first pixel units in the first display region may be lower than a density of the second pixel units in the second display region. The display substrate of this example can ensure the light transmittance of the first display region.

In some exemplary embodiments, two rows of second pixel units of the second display region may correspond to one row of first pixel units of the first display region, and two columns of second pixel units of the second display region may correspond to one column of first pixel units of the first display region.

Solutions of the embodiments will be described below through some examples.

FIG. 1 is a schematic diagram of a display substrate according to at least one embodiment of the present disclosure. In some examples, as shown in FIG. 1, the display substrate may include a display region AA and a periphery region BB located on the periphery of the display region AA. The display region AA of the display substrate may include a first display region A1 and a second display region A2. The second display region A2 may be located on at least one side of the first display region A1. For example, the first display region A1 may be located in the middle of the top of the display region AA, and the second display region A2 may surround the first display region A1. However, this embodiment is not limited thereto. For example, the first display region A1 may be located in other positions, such as an upper left corner or an upper right corner of the display region AA.

In some examples, the first display region A1 may also be referred to as an Under Display Camera (UDC) region; the second display region A2 may also be referred to as a normal display region. For example, an orthographic projection of hardware such as a sensor (such as a camera, an infrared sensor) on the display substrate may be located in the first display region A1 of the display substrate. In some examples, as shown in FIG. 1, the first display region A1 may be circular, and a size of an orthographic projection of the sensor on the display substrate may be less than or equal to a size of the first display region A1. However, this embodiment is not limited thereto. In some other examples, the first display region A1 may be rectangular, and a size of the orthographic projection of the sensor on the display substrate may be less than or equal to a size of an inscribed circle of the first display region A1.

In some examples, as shown in FIG. 1, the display region AA may be a rectangle, e.g., a rounded rectangle. The first display region A1 may be circular or oval. However, this embodiment is not limited thereto. For example, the first display region A1 may be rectangular, pentagonal, hexagonal or in another shape.

In some examples, the display region AA may be a flat region, and the display region AA may at least include multiple pixel units arranged regularly. Multiple pixel units may be configured to display dynamic pictures or still images. In some examples, the display substrate may adopt a flexible base, and accordingly the display substrate may be deformable, for example, can be crimped, bent, folded, or curled. A pixel unit may include three sub-pixels, which may be respectively a red sub-pixel, a green sub-pixel, and a blue sub-pixel. However, this embodiment is not limited thereto. In some other examples, one pixel unit may include four sub-pixels, which may be a red sub-pixel, a green sub-pixel, a blue sub-pixel, and a white sub-pixel respectively.

In some examples, at least one sub-pixel may include a pixel circuit and a light emitting element. The pixel circuit may be configured to drive a light emitting element that is connected with the pixel circuit. For example, the pixel circuit may be configured to provide a drive current to drive the light emitting element to emit light. The pixel circuit may include multiple transistors and at least one capacitor. For example, the pixel circuit may be of a 3T1C (three transistors and one capacitor) structure, an 8T1C (eight transistors and one capacitor) structure, a 7T1C (seven transistors and one capacitor) structure, or a 5T1C (five transistors and one capacitor) structure. In some examples, the light emitting element may be an Organic Light Emitting Diode (OLED), and the light emitting element emits red light, green light, blue light, or white light, etc. when driven by a pixel circuit corresponding to the light emitting element. A color of light emitted from the light emitting element may be determined as required. The light emitting element may include an anode, a cathode and an organic light emitting layer disposed between the anode and the cathode. The anode of the light emitting element may be electrically connected with a corresponding pixel circuit. However, this embodiment is not limited thereto.

In some examples, a shape of the light emitting element may be a rectangle, a rhombus, a pentagon, or a hexagon. When a pixel unit includes three sub-pixels, light emitting elements of the three sub-pixels may be arranged side by side horizontally, side by side vertically, or in a manner of a Chinese character "品". When a pixel unit includes four sub-pixels, light emitting elements of the four sub-pixels may be arranged side by side horizontally, side by side vertically, or in a manner to form a square. However, this embodiment is not limited thereto.

In some examples, the pixel circuit may include: at least one first-type transistor, at least one second-type transistor, and a storage capacitor. For example, the first-type transistor may be a P-type transistor, and the second-type transistor may be an N-type transistor. For example, the first-type transistor may be a Low Temperature Poly-Silicon thin film transistor, and the second-type transistor may be an oxide thin film transistor. An active layer of a Low Temperature Poly-Silicon thin film transistor may be made of Low Temperature Poly-Silicon (LTPS), and an active layer of an oxide thin film transistor may be made of an oxide semiconductor (Oxide). A Low-temperature Poly-Silicon thin film transistor has advantages such as a high mobility, and fast charging, etc., while an oxide thin film transistor has advantages such as a low leakage current, etc. The Low Temperature Poly-Silicon thin film transistor and the oxide thin film transistor are integrated on one display substrate to form a Low Temperature Polycrystalline Oxide (LTPS+ Oxide) display substrate, and advantages of both the Low Temperature Poly-Silicon thin film transistor and the oxide thin film transistor can be utilized, which can achieve low frequency drive, reduce power consumption, and improve display quality. However, this embodiment is not limited thereto.

Figure 2:
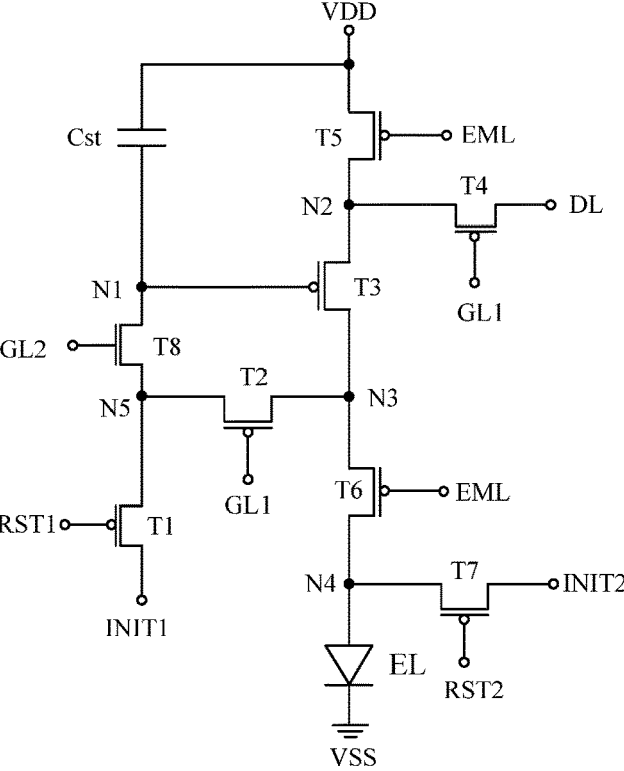
FIG. 2 is an equivalent circuit diagram of a pixel circuit according to at least one embodiment of the present disclosure.

FIG. 2 is an equivalent circuit diagram of a pixel circuit according to at least one embodiment of the present disclosure. In some examples, the pixel circuit may have an 8T1C structure, that is, may include a first transistor T1 to an eighth transistor T8 and a storage capacitor Cst. Herein, the first transistor T1 to the seventh transistor T7 may be first-type transistors, such as P type transistors, and the eighth transistor T8 may be a second-type transistor, such as an N type transistor. However, this embodiment is not limited thereto. For example, the multiple transistors of the pixel circuit may each be a P-type transistor, or each be an N-type transistor.

In some examples, the first-type transistor (e.g., the first transistor T1 to the seventh transistor T7) may adopt a low temperature polysilicon thin film transistor, and the second-type transistor (e.g., the eighth transistor T8) may adopt an oxide thin film transistor. However, this embodiment is not limited thereto. For example, the multiple transistors of the pixel circuit may each adopt a Low Temperature Polysilicon thin film transistor, or each adopts an oxide thin film transistor.

In some examples, as shown in FIG. 2, the pixel circuit may be electrically connected to ten signal lines (including, for example, a data line DL, a first power supply line VDD, a second power supply line VSS, a first scan signal line GL1, a second scan signal line GL2, a third scan signal line RST1, a fourth scan signal line RST2, a light emitting control line EML, a first initial signal line INIT1, a second initial signal line INIT2), respectively.

In some examples, the first power supply line VDD may be configured to provide a constant first voltage signal to the pixel circuit, and the second power supply line VSS may be configured to provide a constant second voltage signal to the pixel circuit, and the first voltage signal may be greater than the second voltage signal. The first scan signal line GL1 may be configured to provide a first scan signal SCAN1 to the pixel circuit, the second scan signal line GL2 may be configured to provide a second scan signal SCAN2 to the pixel circuit, the third scan signal line RST1 may be configured to provide a first reset control signal RESET1 to the pixel circuit, and the fourth scan signal line RST2 may be configured to provide a second reset control signal RESET2 to the pixel circuit. The data line DL may be configured to provide a data signal DATA to the pixel circuit, and the light emitting control line EML may be configured to provide a light emitting control signal EM to the pixel circuit.

In some examples, in the n-th row of pixel circuits, the third scan signal line RST1 may be connected to the first scan signal line GL1 of the (n–1)-th row of pixel circuits to be input with the first scan signal SCAN1($n$–1), that is, the first reset control signal RESET1($n$) and the first scan signal SCAN1($n$–1) may be the same In some examples, the fourth scan signal line RST2 electrically connected to the n-th row of pixel circuits and the third scan signal line RST1 electrically connected to the n-th row of pixel circuits may be an integrated structure. That is, the first reset control signal RESET1($n$) and the second reset control signal RESET2($n$) may be the same. Thus, signal lines of the display substrate can be reduced, and a narrow bezel of the display substrate can be achieved.

In some examples, the first initial signal line INIT1 may be configured to provide a first initial signal to the pixel circuit, the second initial signal line INIT2 may be configured to provide a second initial signal to the pixel circuit. For example, the first initial signal may be different from the second initial signal. The first initial signal and the second initial signal may be constant voltage signals, and their magnitudes may be between, for example, the first voltage signal provided by the first power supply line VDD and the second voltage signal provided by the second power supply line VSS, but are not limited to this. In some other examples, the first initial signal and the second initial signal may be the same, and only the first initial signal line may be provided to provide the first initial signal.

In some examples, as shown in FIG. 2, a gate of the third transistor T3 is electrically connected with the first node N1, a first electrode of the third transistor T3 is electrically connected with a second node N2, and a second electrode of the third transistor T3 is electrically connected with a third node N3. The third transistor T3 may be referred to as a drive transistor. A gate of the fourth transistor T4 is electrically connected with the first scan signal line GL1, a first electrode of the fourth transistor T4 is electrically connected with the data line DL, and a second electrode of the fourth transistor T4 is electrically connected with the second node N2. The fourth transistor T4 may be referred to as a data writing transistor. A gate of the second transistor T2 is electrically connected with the first scan signal line GL1, the first electrode of the second transistor T2 is electrically connected with the fifth node N5, and the second electrode of the second transistor T2 is electrically connected with the third node N3. The second transistor T2 may be referred to as a threshold compensation transistor. A gate of the fifth transistor T5 is electrically connected with the light emitting control line EML, a first electrode of the fifth transistor T5 is electrically connected with the first power supply line VDD, and a second electrode of the fifth transistor T5 is electrically connected with the second node N2. A gate of the sixth transistor T6 is electrically connected with the light emitting control line EML, a first electrode of the sixth transistor T6 is electrically connected with the third node N3, and a second electrode of the sixth transistor T6 is electrically connected with the fourth node N4. The fifth transistor T5 and the sixth transistor T6 may be referred to as light emitting control transistors. A gate of the first transistor T1 is electrically connected with the third scan signal line RST1, a first electrode of the first transistor T1 is electrically connected with the first initial signal line INIT1, and a second electrode of the first transistor T1 is electrically connected with the fifth node N5. A gate of the seventh transistor T7 is electrically connected with the fourth scan signal line RST2, a first electrode of the seventh transistor T7 is electrically connected with the second initial signal line INIT2, and a second electrode of the seventh transistor T7 is electrically connected with the fourth node N4. The first transistor T1 and the seventh transistor T7 may be referred to as reset control transistors. A gate of the eighth transistor T8 is electrically connected with the second scan signal line GL2, a first electrode of the eighth transistor T8 is electrically connected with the fifth node N5, and a second electrode of the eighth transistor T8 is electrically connected with the first node N1. A first capacitor electrode plate of the storage capacitor Cst is electrically connected to the first node N1, and a second capacitor electrode plate of the storage capacitor Cst is electrically connected to the first power supply line VDD.

In this example, the first node N1 is a connection point of the storage capacitor Cst, the eighth transistor T8, and the third transistor T3, the second node N2 is a connection point of the fifth transistor T5, the fourth transistor T4, and the third transistor T3, the third node N3 is a connection point of the third transistor T3, the second transistor T2, and the sixth transistor T6, the fourth node N4 is a connection point of the sixth transistor T6, the seventh transistor T7, and the light emitting element EL, and the fifth node N5 is a connection point of the first transistor T1, the second transistor T2, and the eighth transistor T8.

In some examples, the light emitting element EL may be an OLED including a first electrode (anode), an organic light emitting layer, and a second electrode (cathode), which are stacked, or may be a QLED including a first electrode (anode), a quantum dot light emitting layer, and a second electrode (cathode), which are stacked. A second electrode of the light emitting element EL may be electrically connected with a second power supply line VSS. The signal of the second power supply line VSS may be a continuously provided low-level signal, and the signal of the first power supply line VDD may be a continuously provided high-level signal.

Figure 3:
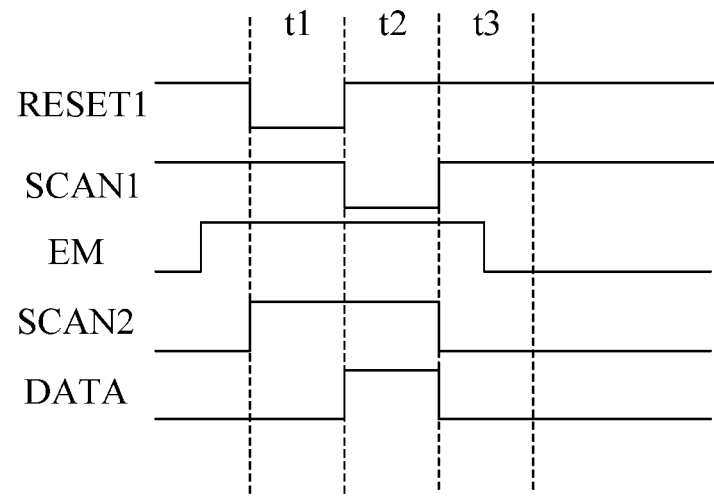
FIG. 3 is an operating timing diagram of the pixel circuit shown in FIG. 2.

FIG. 3 is a working timing diagram of the pixel circuit shown in FIG. 2. A working process of the pixel circuit shown in FIG. 2 will be described below with reference to FIG. 3. Herein, descriptions are made by taking the first transistor T1 to the seventh transistor T7 of the pixel circuit being P-type transistors, and the eighth transistor T8 being an N-type transistor as an example. The first reset control signal RESET1 provided by the third scan signal line RST1 to which the pixel circuit is electrically connected and the second reset control signal RESET2 provided by the fourth scan signal line RST2 may be the same.

In some examples, as shown in FIG. 2 and FIG. 3, during one frame display period, the working process of the pixel circuit may include a first stage t1, a second stage t2, and a third stage t3.

The first stage t1 (referred to as a reset stage): The first reset control signal RESET1 provided by the third scan signal line RST1 is a low-level signal, which turns on the first transistor T1 and the seventh transistor T7. The second scan signal SCAN2 provided by the second scan signal line GL2 is a high-level signal, which turns on the eighth transistor T8. The first initial signal provided by the first initial signal line INIT1 is provided to the fifth node N5 and the first node N1 to initialize the first node N1 and clear an original data voltage in the storage capacitor Cst. A second initial signal provided by the second initial signal line INIT2 is provided to the fourth node N4 to initialize the fourth node N4. The first scan signal SCAN1 provided by the first scan line GL1 is a high-level signal, and the light emitting control signal EM provided by the light emitting control line EML is a high-level signal, so that the fourth transistor T4, the second transistor T2, the fifth transistor T5 and the sixth transistor T6 are turned off. In this stage, the light emitting element EL does not emit light.

The second stage t2 (referred to as a data writing stage or a threshold compensation stage): The first scan signal SCAN1 provided by the first scan signal line GL1 is a low-level signal. The second scan signal SCAN2 provided by the second scan signal line GL2, the first reset control signal RESET1 provided by the third scan signal line RST1, and the light control signal EM provided by the light control line EML are all high-level signals, and the data signal DATA is output by the data line DL. In this stage, the third transistor T3 is turned on because the first capacitor electrode plate of the storage capacitor Cst is at a low-level. The first scan signal SCAN1 is a low-level signal, so that the second transistor T2 and the fourth transistor T4 are turned on. The second transistor T2, the fourth transistor T4, and the eighth transistor T8 are turned on, so that a data voltage Vdata outputted by the data line DL is provided to the first node N1 through the second node N2, the turned-on third transistor T3, the third node N3, the turned-on second transistor T2, the fifth node N5, and the turned-on eighth transistor T8, and a difference between the data voltage Vdata outputted by the data line DL and a threshold voltage Vth of the third transistor T3 is charged to the storage capacitor Cst. The first reset control signal RESET1 provided by the third scan signal line RST1 is a high-level signal, so that the first transistor T1 and the seventh transistor T7 are turned off. The light emitting control signal EM provided by the light emitting control line EML is a high-level signal, so that the fifth transistor T5 and the sixth transistor T6 are turned off.

The third stage t3 (referred to as a light emitting stage): The light emitting control signal EM provided by the light emitting control line EML changes from a high-level signal to a low-level signal, and the light emitting control signal EM is a low-level signal, so that the fifth transistor T5 and the sixth transistor T6 are turned on. The second scan signal SCAN2 provided by the second scan signal line GL2 is a low-level signal, so that the eighth transistor T8 is turned off. The first scan signal SCAN1 provided by the first scan signal line GL1 and the first reset control signal RESET1 provided by the third scan signal line RST1 are high-level signals, so that the second transistor T2, the fourth transistor T4, the seventh transistor T7, and the first transistor T1 are turned off. The first voltage signal outputted by the first power supply line VDD provides a drive voltage to the anode of the light emitting element EL through the fifth transistor T5, the third transistor T3, and the sixth transistor T6 which are turned on, to drive the light emitting element EL to emit light.

In a drive process of the pixel circuit, a drive current flowing through the third transistor T3 is determined by a voltage difference between the control electrode and the first electrode of the third transistor T3. Since the voltage of the first node N1 is Vdata−|Vth|, the drive current of the third transistor T3 may be:

$$I = K \times (Vgs - Vth)^2 =$$
$$K \times [(Vdd - Vdata + |Vth|) - Vth]^2 = K \times [Vdd - Vdata]^2.$$

Herein, I is the drive current flowing through the third transistor T3, that is, a drive current for driving the light emitting element EL, K is a constant, Vgs is the voltage difference between the control electrode and the first electrode of the third transistor T3, Vth is the threshold voltage of the third transistor T3, Vdata is the data voltage outputted by the data line DL, and Vdd is the first voltage signal outputted by the first power supply line VDD.

It may be seen from the above formula that a current flowing through the light emitting element is independent of the threshold voltage of the third transistor T3. Therefore, the pixel circuit according to the present embodiment can better compensate the threshold voltage of the third transistor T3.

Figure 4:
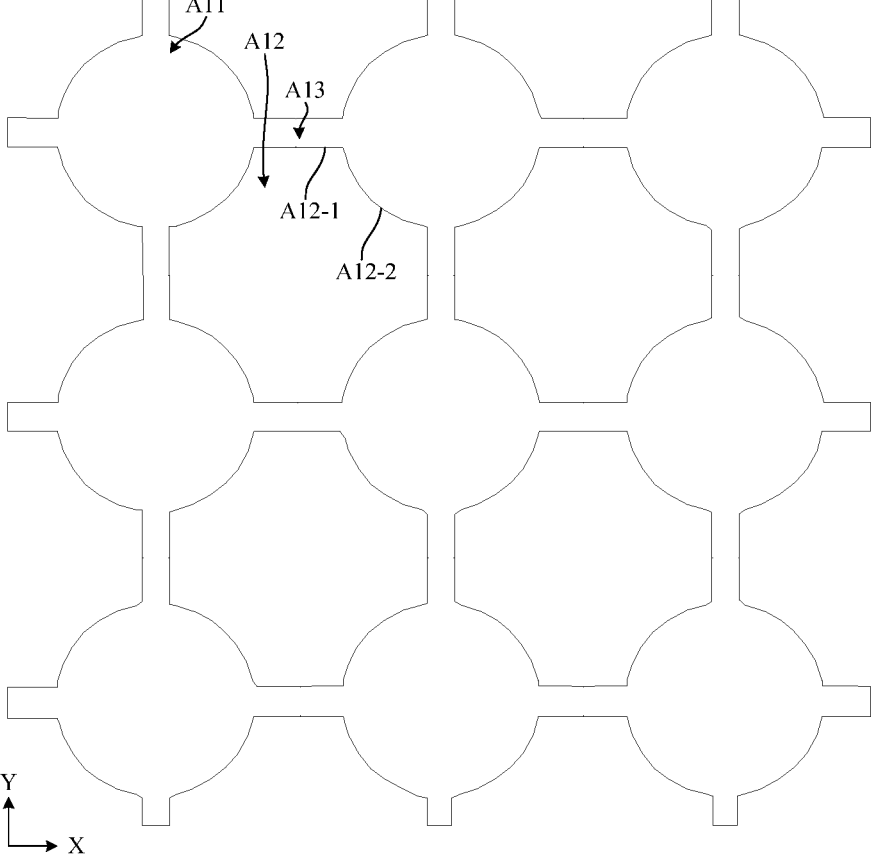
FIG. 4 is a partial schematic diagram of a first display region according to at least one embodiment of the present disclosure.

FIG. 4 is a partial schematic diagram of a first display region according to at least one embodiment of the present disclosure. In some examples, as shown in FIG. 4, in a plane parallel to the display substrate, the first display region A1 may include multiple display island regions A11 spaced apart from each other, a light-transmissive region A12 between adjacent display island regions A11, and a connection region A13 connecting adjacent display island regions A11. Each display island region A11 may be configured to perform image display, each light-transmissive region A12 may be configured to provide a light transmission space, and each connection region A13 may be configured to arrange signal wirings.

In some examples, as shown in FIG. 4, in a plane parallel to the display substrate, shapes of the multiple display island regions A11 may be substantially the same, for example, are all circular. Multiple connection regions A13 may connect multiple display island regions A11 to each other. The connection region A13 may be a strip-shaped region extending in the first direction X or the second direction Y. For example, each display island region A13 may be connected with four connection regions A13. Four connection regions A13 connected to one display island region A11 may extend in different directions. For example, two connection regions A13 may extend in the first direction X and the other two connection regions A13 may extend in the second direction Y. The first direction X intersects the second direction Y, for example, the first direction X may be perpendicular to the second direction Y. One display island region A11 may be connected to four other display island regions surrounding the display island region A11 by four connection lines A13. However, this embodiment is not limited thereto. In some other examples, the display island region may be oval; or, the display island region may be other shapes without right-angled sides. In some other examples, shapes of multiple display island regions may be different.

In some examples, as shown in FIG. 4, in a plane parallel to the display substrate, the shapes of the multiple light-transmissive regions A12 may be substantially the same, for example, they may all be octagonal. One light-transmissive region A12 may be surrounded by four connection regions A13 and four display island regions A11. Edges of the light-transmissive region A12 may include a first edge A12-1 contacting the connection region A13, and a second edge A12-2 contacting the display island region A11. The first edges A12-1 and the second edges A12-2 are connected in an interleaved mode. The first edge A12-1 is an edge of the connection region A13 near the light-transmissive region A12. The first edge A12-1 may be a flat edge, for example, may be a straight line type. The second edge A12-2 is an edge of the display island region A11 near the light-transmissive region A12. The second edge A12-2 may be of an arc shape. The second edge A12-2 may be an arc-shaped flat edge, or may be an uneven edge, such as a small deformation due to tolerances. In this example, the first edge A12-1 and the second edge A12-2 of the light-transmissive region A12 are connected without forming a right angle, which can reduce the light diffraction effect. For example, it can be beneficial to reduce the diffraction of the camera under the first display region of the display substrate during shooting, thereby improving the shooting effect.

Figure 5:
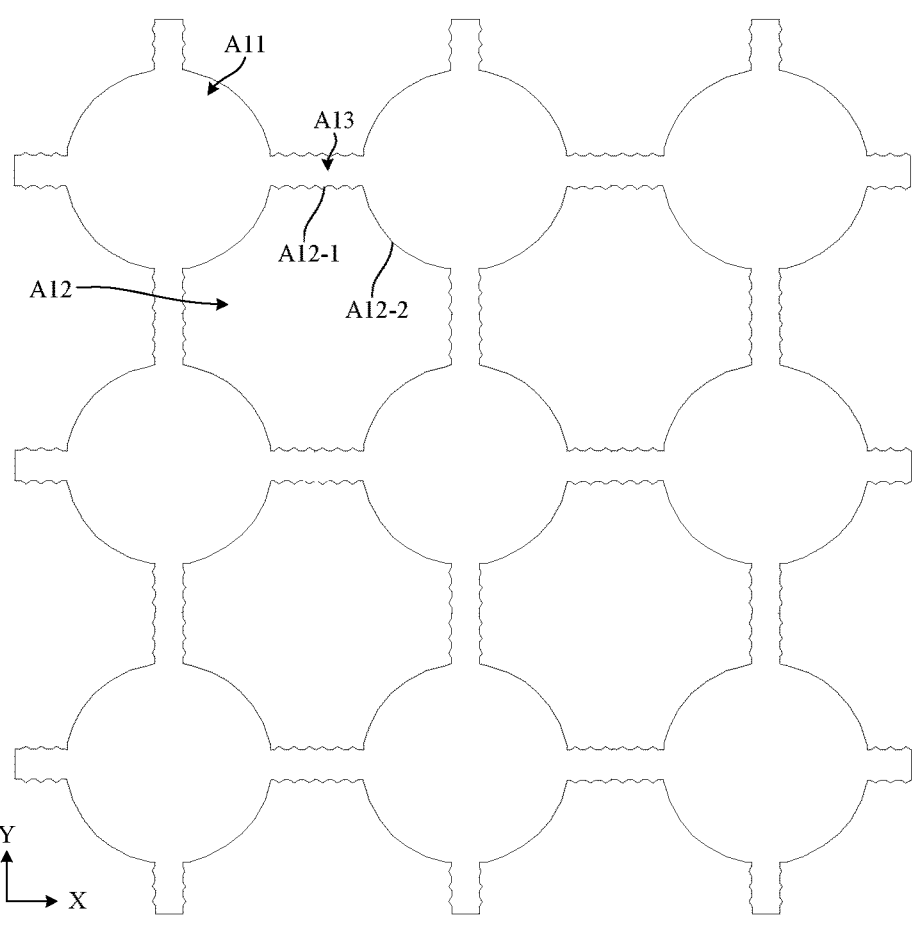
FIG. 5 is another partial schematic diagram of a first display region according to at least one embodiment of the present disclosure.

FIG. 5 is another partial schematic diagram of a first display region according to at least one embodiment of the present disclosure. In some examples, as shown in FIG. 5, in a plane parallel to the display substrate, the second edge A12-2 of the light-transmissive region A12 may be arcuate. The first edge A12-1 of the light-transmissive region A12 may be an uneven edge. In this example, the first edge A12-1 and the second edge A12-2 of the light-transmissive region A12 are connected without forming right-angle edges, which can reduce the light diffraction effect.

Figure 6A:
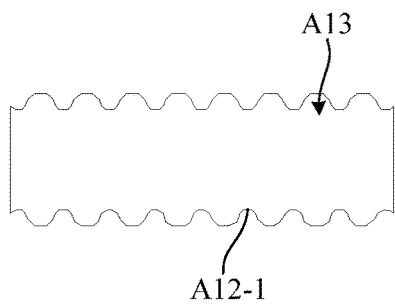
FIG. 6A to 6D are partially enlarged schematic diagrams of the first edge according to at least one embodiment of the present disclosure.
Figure 6B:
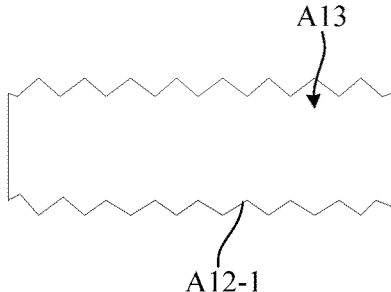
Figure 6C:
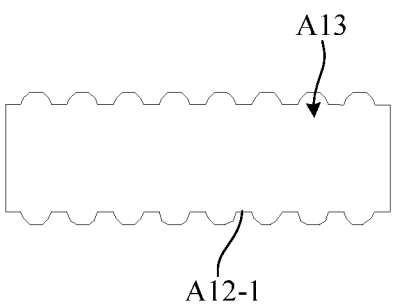
Figure 6D:
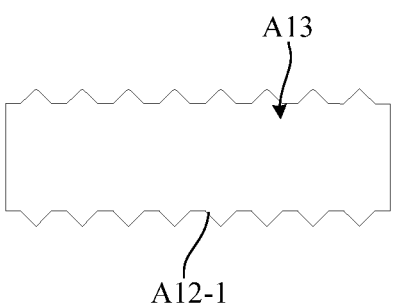

FIGS. 6A to 6D are partially enlarged schematic diagrams of the first edge according to at least one embodiment of the present disclosure. In some examples, as shown in FIG. 6A, in a plane parallel to the display substrate, the first edge A12-1 of the light-transmissive region may be wavy. The first edge A12-1 may be formed by connecting multiple continuous arc segments. For example, the first edge A12-1 may include protrusion parts and depression parts connected in an interleaved mode, and the protrusion parts and depression parts may be semicircular or semi-oval. In some other examples, as shown in FIG. 6B, the first edge A12-1 of the light-transmissive region may be of a folding line shape. The first edge A12-1 may be formed by connecting multiple continuous straight line segments. For example, the first edge A12-1 may include protrusion parts and depression parts connected in an interleaved mode, and the protrusion parts and depression parts may be triangular. In some other examples, as shown in FIG. 6C, the first edge A12-1 of the light-transmissive region may include multiple protrusion parts, and the protrusion parts may be semicircular or semi-oval. The first edge A12-1 may be formed by arcs and straight line segments connected in an interleaved mode. In some other examples, as shown in FIG. 6D, the first edge A12-1 of the light-transmissive region may include multiple protrusion parts, and the protrusion parts may be triangular. The first edge A12-1 may be formed by connecting multiple straight line segments with different inclination directions. However, this embodiment is not limited thereto. In some other examples, the protrusion parts or depression parts may be quadrilateral or pentagonal. In some other examples, the second edge of the light-transmissive region may be an uneven edge such as having a protrusion part or a depression part. The non-flat shape of the second edge may be similar to the non-flat shape of the first edge on the basis of ensuring the second edge to be an arc shape, the non-flat shape of the second edge is not repeated herein.

In some examples, the shape of the second edge of the light-transmissive region may be determined by the shape of the peripheral edge of the signal wirings within the display island. The shape of the first edge of the light-transmissive region may be determined by the shape of the peripheral edge of the signal wirings (e.g., the light shielding wirings) of the connection region. However, this embodiment is not limited thereto. In some other examples, the shapes of the first and second edges of the light-transmissive region may be determined by the shape of the peripheral edge of the black matrix. The black matrix may cover the non-light emitting region and the connection region of the display island region.

In some examples, the first display region A1 may include: multiple first region light emitting elements and multiple first region pixel circuits. At least one first region pixel circuit is electrically connected with at least one first region light emitting element. For example, multiple first region pixel circuits and multiple first region light emitting elements may be electrically connected in a one-to-one correspondence. An orthographic projection of the at least one first region pixel circuit on the base and an orthographic projection of the at least one first region light emitting element electrically connected with the at least one first region pixel circuit on the base may at least partially overlap.

In some examples, the second display region A2 may include: multiple second region light emitting elements and multiple second region pixel circuits. At least one second region pixel circuit is electrically connected to at least one second region light emitting element. For example, the multiple second region light emitting elements and the multiple second region pixel circuits may be electrically connected in one-to-one correspondence. An orthographic projection of the at least one second region pixel circuit on the base and an orthographic projection of the at least one second region light emitting element electrically connected with the at least one second region pixel circuit on the base may at least partially overlap.

Figure 7A:
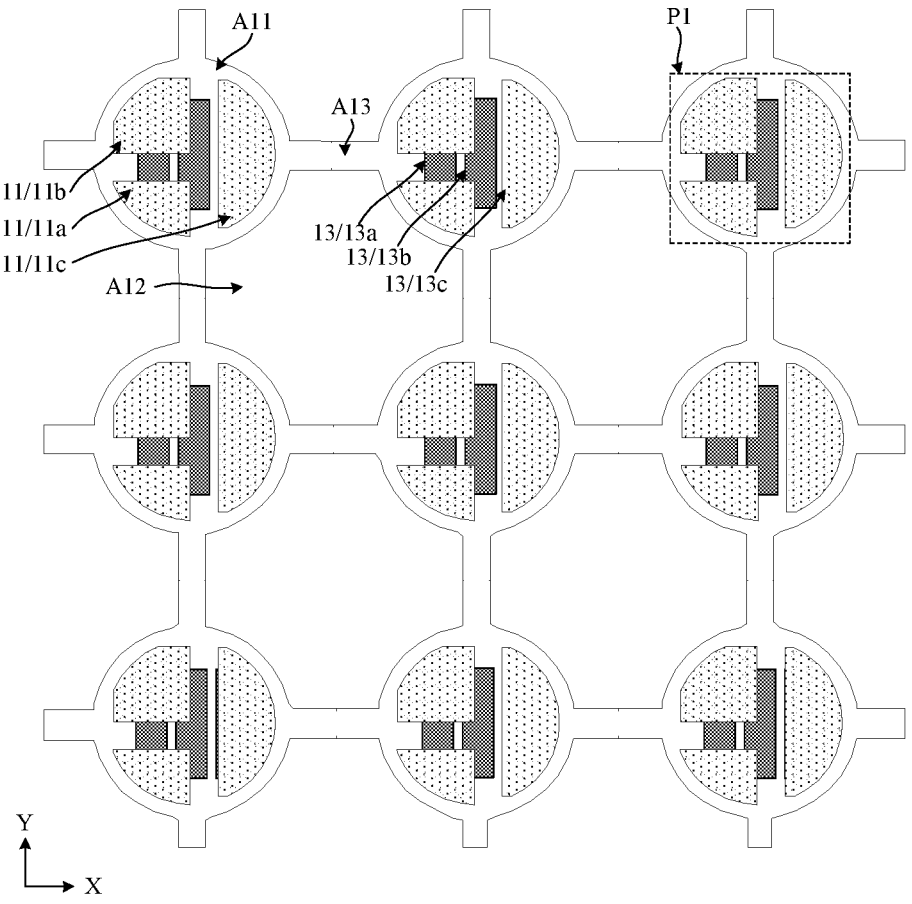
FIG. 7A is a schematic diagram of an arrangement of first region light emitting elements and first region pixel circuits of the first display region according to at least one embodiment of the present disclosure.

FIG. 7A is a schematic diagram of an arrangement of first region light emitting elements and first region pixel circuits of the first display region according to at least one embodiment of the present disclosure. In some examples, as shown in FIG. 7A, a display island region A11 may include a first pixel unit P1. The first pixel unit P1 may include three first sub-pixels emitting light of different colors, and each first sub-pixel may include a first region pixel circuit 13 and a first region light emitting element 11. In this example, the three first region light emitting elements 11 of the display island region A11 may include a first light emitting element 11a, which emits light of a first color, a second light emitting element 11b, which emits light of a second color, and a third light emitting element 11c, which emits light of a third color. The three first region pixel circuits 13 of the display island region A11 may include a first pixel circuit 13a electrically connected to the first light emitting element 11a, a second pixel circuit 13b electrically connected to the second light emitting element 11b, and a third pixel circuit 13c electrically connected to the third light emitting element 11c. The first light emitting element 11a may be configured to emit light under the drive of the first pixel circuit 13a, the second light emitting element 11b may be configured to emit light under the drive of the second pixel circuit 13b, and the third light emitting element 11c may be configured to emit light under the drive of the third pixel circuit 13c. An orthographic projection of the first light emitting element 11a on the base may overlap with an orthographic projection of the first pixel circuit 13a on the base, an orthographic projection of the second light emitting element 11b on the base may overlap with an orthographic projection of the second pixel circuit 13b on the base, and an orthographic projection of the third light emitting element 11c on the base may overlap with an orthographic projection of the third pixel circuit 13c on the base. In this example, an independent first pixel unit is provided in each display island region A11 instead of providing multiple first pixel units in clusters, which can make the pixel units more evenly distributed, thus effectively improving the display effect.

In some examples, light of the first color may be green light, light of the second color may be red light, and light of the third color may be blue light. However, this embodiment is not limited thereto.

In some examples, as shown in FIG. 7A, the three first region light emitting elements 11 within the display island region A11 may be arranged in a shape of a Chinese character " 品 " The second light emitting element 11b and the first light emitting element 11a in the display island region A11 may be arranged in sequence along the second direction Y, and the third light emitting element 11c may be located on the same side of the first light emitting element 11a and the second light emitting element 11c in the first direction X. Three first region pixel circuits 13 within the display island region A11 may be arranged side by side in the first direction X. The first pixel circuit 13a, the second pixel circuit 13b, and the third pixel circuit 13c in the display island region A11 may be arranged in sequence along the first direction X.

In some examples, as shown in FIG. 7A, the first light emitting element 11a of the display island region A11 may have a first light emitting region, the second light emitting element 11b may have a second light emitting region, and the third light emitting element 11c may have a third light emitting region. The first light emitting region, the second light emitting region and the third light emitting region as a whole may be combined as a circular shape. For example, the first light emitting region of the first light emitting element 11a may be surrounded by two straight edges and an arc edge, and the two straight edges may be perpendicular to each other. The second light emitting region of the second light emitting element 11b may be surrounded by two straight edges and an arc edge, and the two straight edges may be perpendicular to each other. The third light emitting region of the third light emitting element 11c may be surrounded by a straight edge and an arc edge. For example, the first light emitting region may be smaller than the second light emitting region. The shapes of the first light emitting region and the second light emitting region may be similar to a quarter-circle shape, and the shape of the third light emitting region may be similar to a semicircle shape.

Figure 7B:
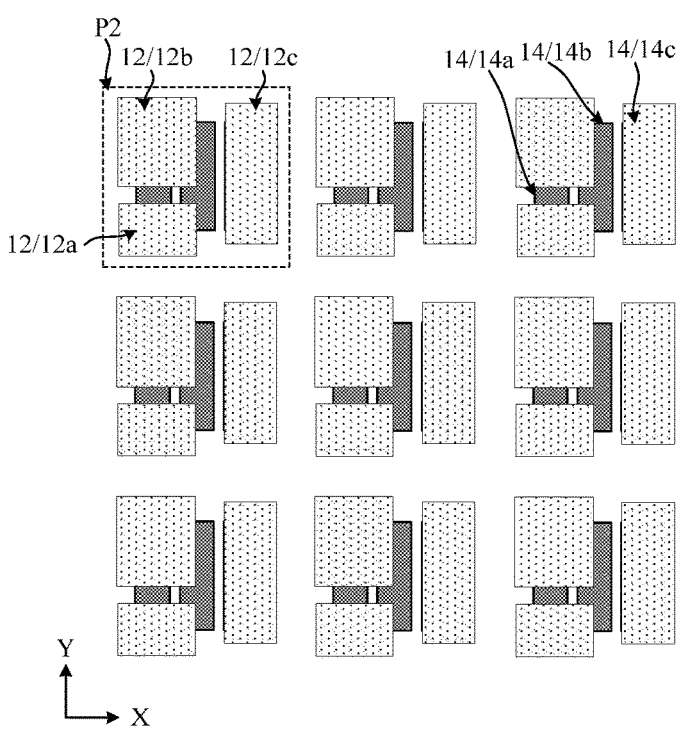
FIG. 7B is a schematic diagram of an arrangement of second-region light emitting elements and second-region pixel circuits of the second display region according to at least one embodiment of the present disclosure.

FIG. 7B is a schematic diagram of an arrangement of second-region light emitting elements and second-region pixel circuits of the second display region according to at least one embodiment of the present disclosure. In some examples, as shown in FIG. 7B, the second display region A2 may include multiple second pixel units P2 regularly arranged. A second pixel unit P2 may include: three second sub-pixels emitting different colors of light. Each second sub-pixel may include a second region pixel circuit 14 and a second region light emitting element 12. In this example, the three second region light emitting elements 12 of one second pixel unit P2 of the second display region A2 may include a fourth light emitting element 12a that emits light of a first color, a fifth light emitting element 12b that emits light of a second color, and a sixth light emitting element 12c that emits light of a third color. The three second region pixel circuits 14 of the second display region A2 may include a fourth pixel circuit 14a electrically connected to the fourth light emitting element 12a, a fifth pixel circuit 14b electrically connected to the fifth light emitting element 12b, and a sixth pixel circuit 14c electrically connected to the sixth light emitting element 12c. The fourth light emitting element 12a may be configured to emit light under the drive of the fourth pixel circuit 14a, the fifth light emitting element 12b may be configured to emit light under the drive of the fifth pixel circuit 14b, and the sixth light emitting element 12c may be configured to emit light under the drive of the sixth pixel circuit 14c. An orthographic projection of the fourth light emitting element 12a on the base may overlap with an orthographic projection of the fourth pixel circuit 14a on the base, an orthographic projection of the fifth pixel circuit 14b on the base may overlap with an orthographic projection of the fifth pixel circuit 14b on the base, and an orthographic projection of the sixth light emitting element 12c on the base may overlap with an orthographic projection of the sixth pixel circuit 14c on the base.

In some examples, as shown in FIG. 7B, the three second region light emitting elements 12 of the second pixel unit P2 may be arranged in a shape of a Chinese character " 品 ". The fifth light emitting element 12b and the fourth light emitting element 12a may be sequentially arranged in the second direction Y, and the sixth light emitting element 12c may be located on the same side of the fourth light emitting element 12a and the fifth light emitting element 12b in the first direction X. Three second region pixel circuits 14 of the second pixel unit P2 may be arranged side by side in the first direction X. The fourth pixel circuit 14a, the fifth pixel circuit 14b, and the sixth pixel circuit 14c may be sequentially arranged in the first direction X.

In some examples, as shown in FIG. 7B, the fourth light emitting element 12a of the second pixel unit P2 may have a fourth light emitting region, the fifth light emitting element 12b may have a fifth light emitting region, and the sixth light emitting element 12c may have a sixth light emitting region. The fourth light emitting region, the fifth light emitting region and the sixth light emitting region may be combined as a rectangular shape as a whole. For example, the fourth light emitting region, the fifth light emitting region, and the sixth light emitting region may each be a rectangular. For example, the fourth light emitting region may be smaller than the fifth light emitting region.

Figure 7C:
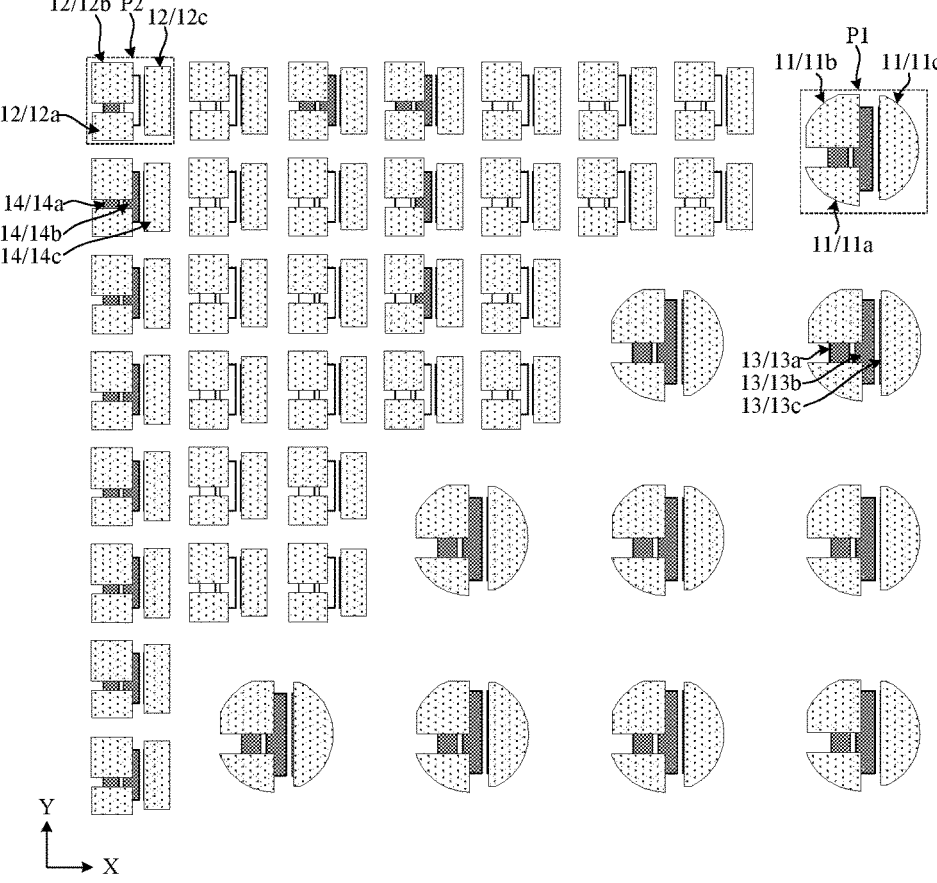
FIG. 7C is a partial schematic diagram of the region S1 in FIG. 1.

FIG. 7C is a partial schematic diagram of the region S1 in FIG. 1. FIG. 7C illustrates the arrangement of light emitting elements and pixel circuits at the junction of the first display region A1 and the second display region A2. In some examples, as shown in FIG. 7C, a density of the first pixel units P1 of the first display region A1 may be less than a density of the second pixel units P2 of the second display region A2. A density of the first region light emitting elements 11 of the first display region A1 may be less than a density of the second region light emitting elements 12 of the second display region A2. In this way, a light transmission rate of the first display region A1 can be improved.

In some examples, as shown in FIG. 7C, two rows of second pixel units P2 in the second display region A2 may correspond to one row of first pixel units P1 in the first display region A1, and two columns of second pixel units P2 in the second display region A2 may correspond to one column of first pixel units P1 in the first display region A1.

In the present disclosure, a row of As may represent multiple As arranged in a first direction X, and a column of As may represent multiple As arranged in a second direction Y.

In some examples, as shown in FIG. 7C, the first region pixel circuit 13 within the first display region A1 and the second region pixel circuit 14 of the second display region A2 may both be of the 8T1C structure shown in FIG. 2. In the second display region A2, the second region pixel circuit at 2n-th row and j-th column and the second region pixel circuit are (2n−1)-th row and j-th column may be electrically connected to different data lines. The first scan signal, the second scan signal, the first reset control signal, the second reset control signal, and the light emitting control signal received by the second region pixel circuit at the 2n-th row and j-th column and the second region pixel circuit at the (2n−1)-th row and the j-th column may be the same, and the same or different data signals may be received through different data lines, wherein, both n and j are positive integers. For example, the second at pixel circuits at the 2n-th row and the (2n−1)-th row in the second display region A2 corresponds to a row of first region pixel circuits in the first display region A1. The second region pixel circuits at the 2n-th row and the (2n−1)-th row in the second display region A2 and the corresponding row of first region pixel circuits in the first display region A1 may receive the same first scan signal, second scan signal, first reset control signal, second reset control signal and light emitting control signal. The second pixel units at the (k−1)-th column and the k-th column in the second display region A2 correspond to a column of first pixel units in the first display region A1. The second pixel units at the (k−1)-th column and the k-th column include a total of six columns of second region pixel circuits. Since the second region pixel circuits of the odd-numbered rows and the even-numbered rows are connected to different data lines, six columns of second region pixel circuits may be electrically connected with twelve data lines. Six of the twelfth data lines (e.g. fourth to ninth data lines arranged in a first direction) may pass through a corresponding column of first pixel units (e.g. including three columns of first region pixel circuits), and the remaining six data lines (e.g. first to third data lines and tenth to twelfth data lines arranged in the first direction) may bypass the column of first pixel units. Herein, K is a positive integer. In this example, by arranging the second region pixel circuits of odd-numbered lines and even-numbered lines in the second display region to connect different data lines, it can be ensured that the data signal better matches the parasitic capacitor of the second region pixel circuit, thereby improving the display effect.

Figure 8:
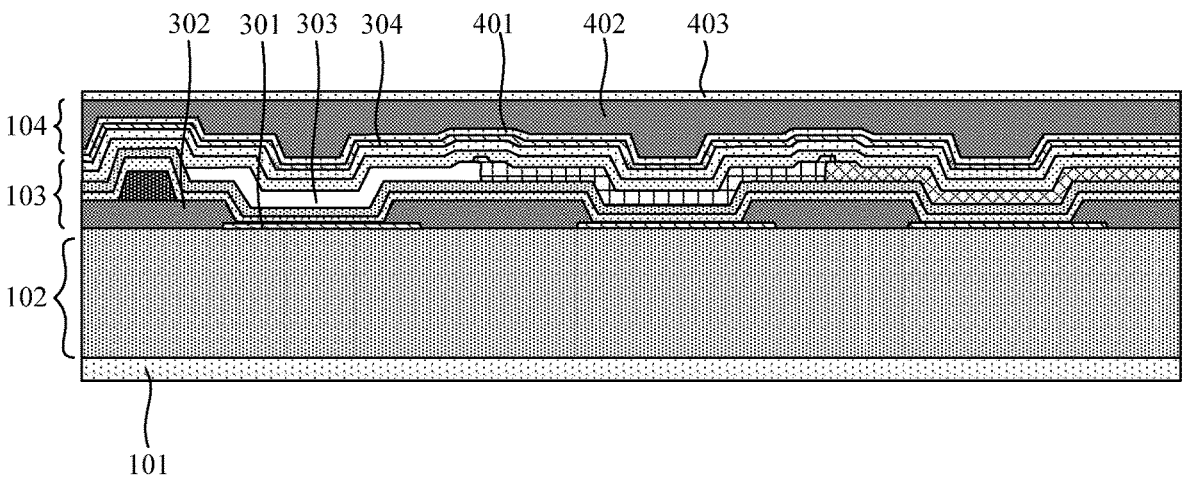
FIG. 8 is a schematic partial sectional view of a display region according to at least one embodiment of the present disclosure.

FIG. 8 is a schematic partial sectional view of a display region according to at least one embodiment of the present disclosure. In some examples, in a direction perpendicular to the display substrate, the display substrate may include: a base 101, a drive circuit layer 102, a light emitting structure layer 103, and an encapsulation structure layer 104 that are sequentially disposed on the base 101. In some possible implementations, the display substrate may include other film layers, such as a touch structure layer, and a color filter layer, which is not limited here in the present disclosure.

In some examples, the base 101 may be a flexible base or may be a rigid base. The drive circuit layer 102 may include multiple second region pixel circuits located in the second display region A2 and multiple first region pixel circuits located in the first display region A1. The light emitting structure layer 103 may include multiple first region light emitting elements located in the first display region A1 and multiple second region light emitting elements located in the second display region A2. For example, the light emitting structure layer 103 may at least include an anode layer 301, a pixel define layer 302, an organic light emitting layer 303 and a cathode 304. The anode layer 301 may be electrically connected with the pixel circuit of the drive circuit layer. The organic light emitting layer 303 is connected with the anode layer 301. The cathode layer 304 is connected with the organic light emitting layer 303. The organic light emitting layer 303 is driven by the anode layer 301 and the cathode layer 304 to emit light of a corresponding color. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, to form an inorganic material/organic material/inorganic material stack structure, thus ensuring that external water vapor cannot enter the light emitting structure layer 103.

In some examples, the drive circuit layer 102 may include: a first conductive layer, a first semiconductor layer, a second conductive layer, a second semiconductor layer, a third conductive layer, a fourth conductive layer, a fifth conductive layer, and a sixth conductive layer disposed on the base 101 in sequence. In some examples, the drive circuit layer 102 may also include a first insulating layer, a second insulating layer, a third insulating layer, a fourth insulating layer, a fifth insulating layer, a sixth insulating layer, a seventh insulating layer, and an eighth insulating layer. The first insulating layer may be provided between the first conductive layer and the first semiconductor layer, the second insulating layer may be provided between the first semiconductor layer and the second conductive layer, the third insulating layer may be provided between the second conductive layer and the second semiconductor layer, the fourth insulating layer may be provided between the second semiconductor layer and the third conductive layer, the fifth insulating layer may be provided between the third conductive layer and the fourth conductive layer, the sixth insulating layer may be provided between the fourth conductive layer and the fifth conductive layer, the seventh insulating layer may be provided between the fifth conductive layer and the sixth conductive layer, and the eighth insulating layer may be provided on a side of the sixth conductive layer away from the base. In some examples, the first insulating layer to the fifth insulating layer each may be an inorganic insulating layer, and the sixth insulating layer to the eighth insulating layer each may be an organic insulating layer However, this embodiment is not limited thereto.

The structure and preparation process of the display substrate are exemplarily described below with reference to FIGS. 9A to 30B. In the following example, illustration is made by taking a first pixel unit of a display island region of the first display region A1 and a second pixel unit of the second display region A2 as an example, and a row where the second pixel unit is located and a next row of the second pixel unit in the second display region A2 may correspond to a row where the first pixel unit is located.

The "patterning process" mentioned in the embodiments of the present disclosure includes processings, such as photoresist coating, mask exposure, development, etching and photoresist stripping for metal materials, inorganic materials or transparent conductive materials, and includes processings, such as organic material coating, mask exposure and development for organic materials. Deposition may be any one or more of sputtering, evaporation, and chemical vapor deposition. Coating may be any one or more of spray coating, spin coating, and ink-jet printing. Etching may be any one or more of dry etching and wet etching. The present disclosure is not limited thereto. A "thin film" refers to a layer of thin film formed by a certain material on a base substrate through deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B are disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" means that a boundary of the orthographic projection of B falls within a range of a boundary of the orthographic projection of A, or the boundary of the orthographic projection of A is coincided with the boundary of the orthographic projection of B.

In some exemplary implementations, a preparation process of a display substrate may include the following acts.

(1) A base is provided. In some examples, the base may be a rigid base or a flexible base. For example, the rigid base may be made of, but not limited to, one or more of glass and quartz. The flexible base may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some examples, the flexible base may include a first flexible material layer, a first inorganic material layer, a second flexible material layer and a second inorganic material layer which are stacked. The first flexible material layer and the second flexible material layer may be made of a material such as polyimide (PI), polyethylene terephthalate (PET), or a polymer soft film on which surface treatment is performed, and a material of the first inorganic material layer and the second inorganic material layer may be silicon nitride (SiNx) or silicon oxide (SiOx), etc., which are used to improve resistance to water and oxygen of the base.

(2) A first conductive layer is formed. In some examples, a first conductive thin film is deposited on the base, and the first conductive thin film is patterned through a patterning process to form a first conductive layer. In some examples, the first conductive layer may also be referred to as a Light Shielding (LS) layer.

Figure 9A:
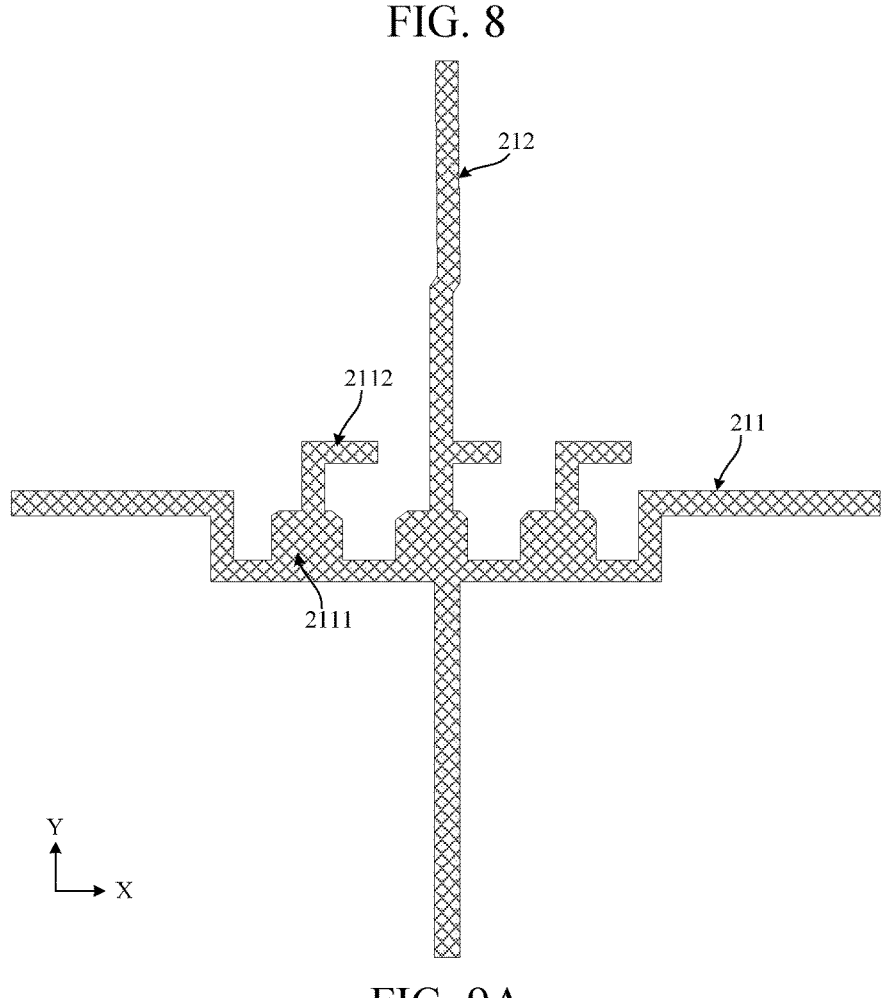
FIG. 9A is a partially enlarged schematic diagram of a display substrate after a first conductive layer is formed in a first display region according to at least one embodiment of the present disclosure.

FIG. 9A is a partially enlarged schematic diagram of a display substrate after a first conductive layer is formed in a first display region according to at least one embodiment of the present disclosure. In some examples, as shown in FIG. 9A, the first conductive layer of a single display island region of the first display region may at least include a first shielding wiring 211 and a second shielding wiring 212. The first shielding wiring 211 may extend along the first direction X, and may extend along the first direction X to connection regions on both sides of the display island region in the first direction X. The second shielding wiring 212 may extend in the second direction Y, and may extend in the second direction Y to connection regions on both sides of the display island region in the second direction Y. The first shielding wiring 211 and the second shielding wiring 212 may be of an integrated structure. The first shielding wirings 211 of the adjacent display island regions of the first display region may be of an integrated structure, and the second shielding wirings 212 of the adjacent display island regions may be of an integrated structure. In the first display region, the first shielding wiring 211 and the second shielding wiring 212 may be connected to form a mesh structure.

In some examples, as shown in FIG. 9A, the first shielding wiring 211 may include three first shielding portions 2111 and three second shielding portions 2112. The first shielding portion 2111 may extend outward in the second direction Y from a main body portion of the first shielding wiring 211, and the second shielding portion 2112 may extend outward in the second direction Y from the first shielding portion 2111. An orthographic projection of the first shielding portion 2111 on the base may be a rectangle, for example, a rounded rectangle. An orthographic projection of the second shielding portion 2112 on the base may be L-shaped. The second first shielding portion 2111 and the second shielding portion 2112 arranged in the first direction X may be electrically connected to the second shielding wiring 212.

Figure 9B:
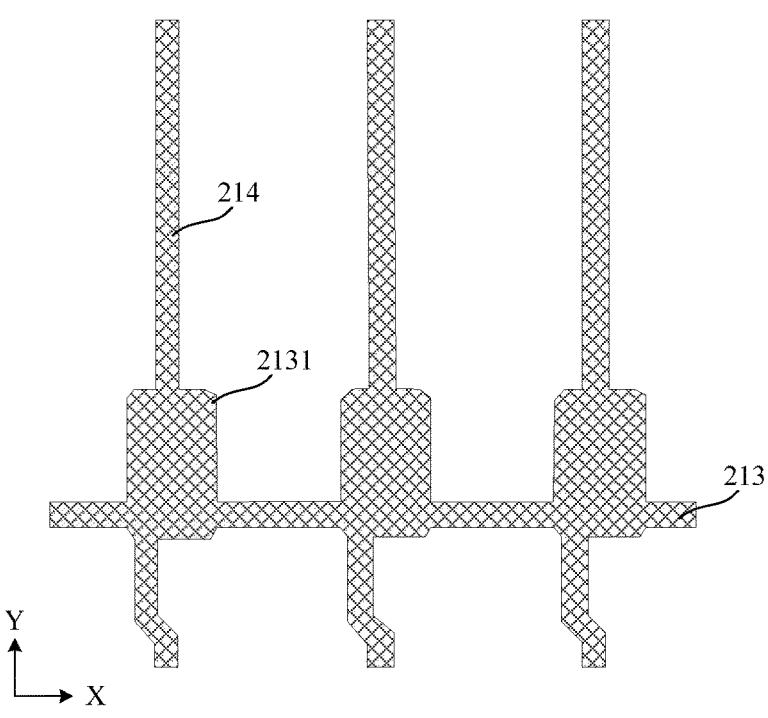
FIG. 9B is a partially enlarged schematic diagram of a display substrate after a first conductive layer is formed in a second display region according to at least one embodiment of the present disclosure.

FIG. 9B is a partially enlarged schematic diagram of a display substrate after a first conductive layer is formed in a second display region according to at least one embodiment of the present disclosure. In some examples, as shown in FIG. 9B, the first conductive layer of the second display region may include a third shielding wiring 213 and a fourth shielding wiring 214. The third shielding wiring 213 may extend along the first direction X, and multiple third shielding wirings 213 may be arranged sequentially along the second direction Y. The fourth shielding wiring 214 extends along the second direction Y, and multiple the fourth shielding wirings 214 may be arranged sequentially along the first direction X. The third shielding wiring 213 may include a third shielding portion 2131, which may extend outward from a main body portion of the third shielding wiring 213 in the second direction Y. An orthographic projection of the third shielding portion 2131 on the base may be a rectangle, for example, a rounded rectangle. The third shielding portion 2131 is electrically connected to the fourth shielding wiring 214. The third shielding wiring 213 and the fourth shielding wiring 214 may be of an integral structure. In the second display region, the third shielding wiring 213 and the fourth shielding wiring 214 may be connected to form a mesh structure.

In some examples, the third shielding wiring 213 of the second display region may be electrically connected to the first shielding wiring 211 of the first display region, for example, may form an integrated structure. The fourth shielding wiring 214 of the second display region may be electrically connected to the second shielding wiring 212 of the first display region, for example, may form an integrated structure.

In some examples, the first shielding wiring 211 second shielding wiring 212 third shielding wiring 213 and fourth shielding wiring 214 may be electrically connected to the first power supply line. For example, the first shielding wiring 211 and the third shielding wiring 213 may extend to the periphery region in the first direction X, and be electrically connected to the first power supply line of the periphery region. As another example, the second and fourth shielding wirings 212 and 214 may extend to the periphery region in the second direction X, and be electrically connected to the first power supply line of the periphery region. However, this embodiment is not limited thereto.

In some examples, the first conductive layer of at least one connection region of the first display region may include a first shielding wiring 211 or a second shielding wiring 212.

(3) A first semiconductor layer is formed. In some examples, the first insulating thin film and the first semiconductor thin film are sequentially deposited on the base on which the aforementioned patterns are formed, and the first semiconductor thin film is patterned through a patterning process to form the first insulating layer and the first semiconductor layer provided on the base. In some examples, a material of the first semiconductor layer may be amorphous silicon (a-Si), polycrystalline silicon (p-Si), hexathiophene or polythiophene, and another material.

Figure 10A:
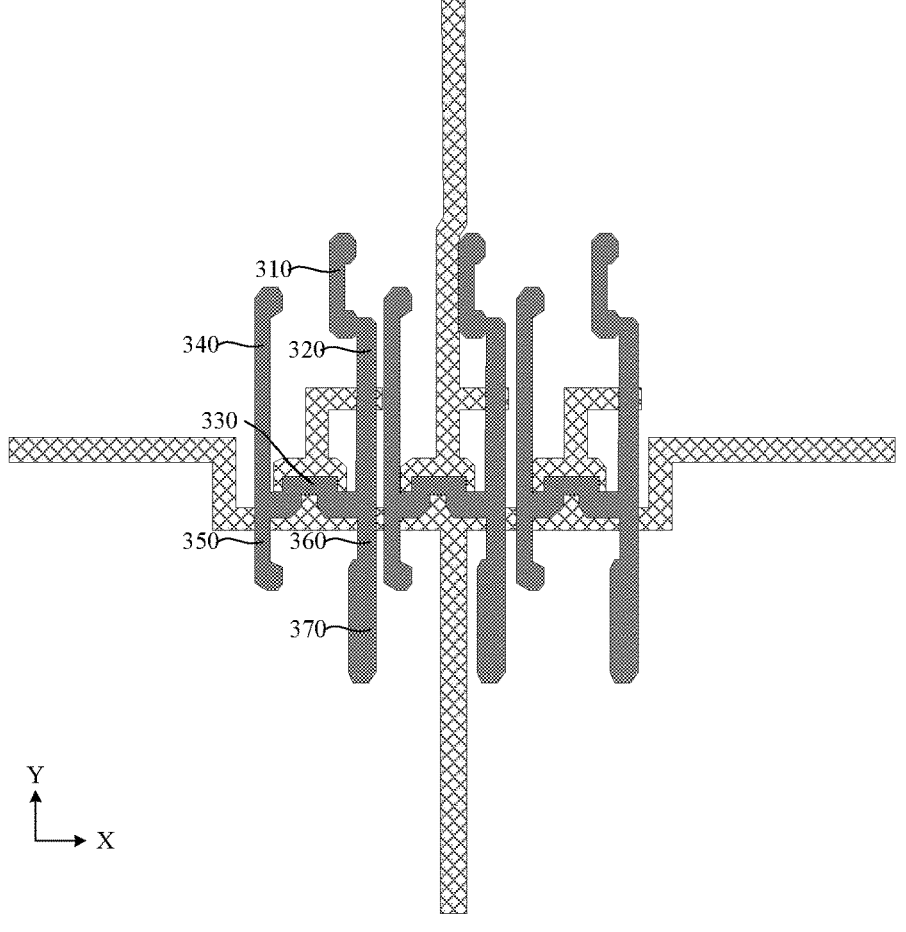
FIG. 10A is a partially enlarged schematic diagram of a display substrate after a first semiconductor layer is formed in a first display region according to at least one embodiment of the present disclosure.
Figure 11A:
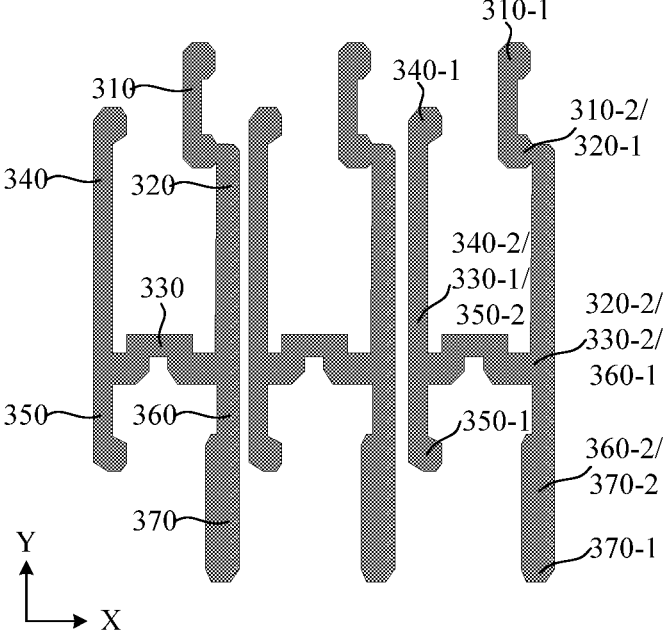
FIG. 11A is a schematic diagram of the first semiconductor layer in FIG. 10A.

FIG. 10A is a partially enlarged schematic diagram of a display substrate after a first semiconductor layer is formed in a first display region according to at least one embodiment of the present disclosure. FIG. 11A is a schematic diagram of a first semiconductor layer in FIG. 10A. In some examples, as shown in FIGS. 10A and 11A, the first semiconductor layer of a single display island region of the first display region may include a first active layer 310 of a first transistor 31 to a seventh active layer 37 of a seventh transistor 37 of three first region pixel circuits (for example, including a first pixel circuit, a second pixel circuit, and a third pixel circuit arranged in sequence along a first direction X). The first active layer 310 of the first transistor 31 to the seventh active layer 370 of the seventh transistor 37 of a first region pixel circuit may be of an integrated structure connected to each other.

In some examples, as shown in FIG. 11A, illustration is made by taking the first active layer 310 of the first transistor 31 to the seventh active layer 370 of the seventh transistor 37 of the first pixel circuit as an example. The first active layer 310, the second active layer 320, and the fourth active layer 340 of the first pixel circuit may be located on one side of the third active layer 330 of the first pixel circuit in the second direction Y. The fifth active layer 350, the sixth active layer 360, and the seventh active layer 370 may be located on the other side of the third active layer 330 of the first pixel circuit in the second direction Y.

In some examples, the first active layer 310, the second active layer 320, the fourth active layer 340, the fifth active layer 350, the sixth active layer 360, and the seventh active layer 370 of the first pixel circuit may all have an I shape, as shown in FIG. 11A. The shape of the third active layer 330 may be n-shaped. However, this embodiment is not limited thereto.

In some examples, as shown in FIG. 11A, the active layer 310 of the first transistor 31 to the active layer 370 of the seventh transistor 37 of the first pixel circuit may each include: a first region, a second region, and a channel region disposed between the first and second regions. The first region 310-1 of the first active layer 310, the first region 340-1 of the fourth active layer 340, the first region 350-1 of the fifth active layer 350 and the first region 370-1 of the seventh active layer 370 may be disposed separately. A second region 310-2 of the first active layer 310 may also serve as a first region 320-1 of the second active layer 320. A second region 320-2 of the second active layer 320 may also serve as the second region 330-2 of the third active layer 330 and the first region 360-1 of the sixth active layer 360. A first region 330-1 of the third active layer 330 may also serve as the second region 340-2 of the fourth active layer 340 and the second region 350-2 of the fifth active layer 350. A second region 360-2 of the sixth active layer 360 may also serve as the second region 370-2 of the seventh active layer 370.

In some examples, as shown in FIG. 10A, an orthographic projection of a first shielding portion 2111 of the first shielding wiring 211 on the base may cover an orthographic projection of the channel region of the third active layer 330 of the third transistor of the first pixel circuit on the base. An orthographic projection of a second shielding portion 2112 of the first shielding wiring 211 on the base may cover an orthographic projection of the channel region of the second active layer 320 of the second transistor of the first pixel circuit on the base. Similarly, an orthographic projection of the first shielding wiring 211 on the base may also cover the orthographic projections of channel regions of the third active layers of the third transistors and channel regions of the second active layers of the second transistors of the second pixel circuit and the third pixel circuit on the base.

Figure 10B:
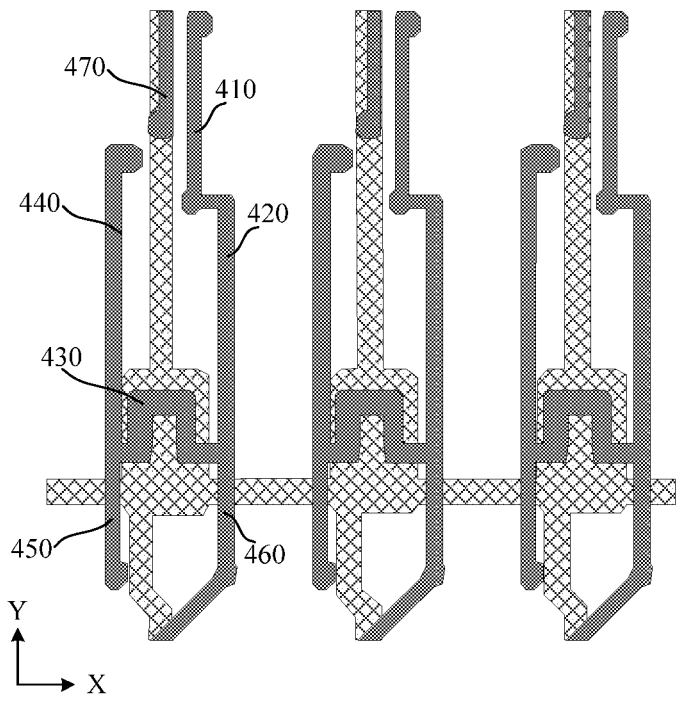
FIG. 10B is a partially enlarged schematic diagram of a display substrate after a first semiconductor layer is formed in a second display region according to at least one embodiment of the present disclosure.
Figure 11B:
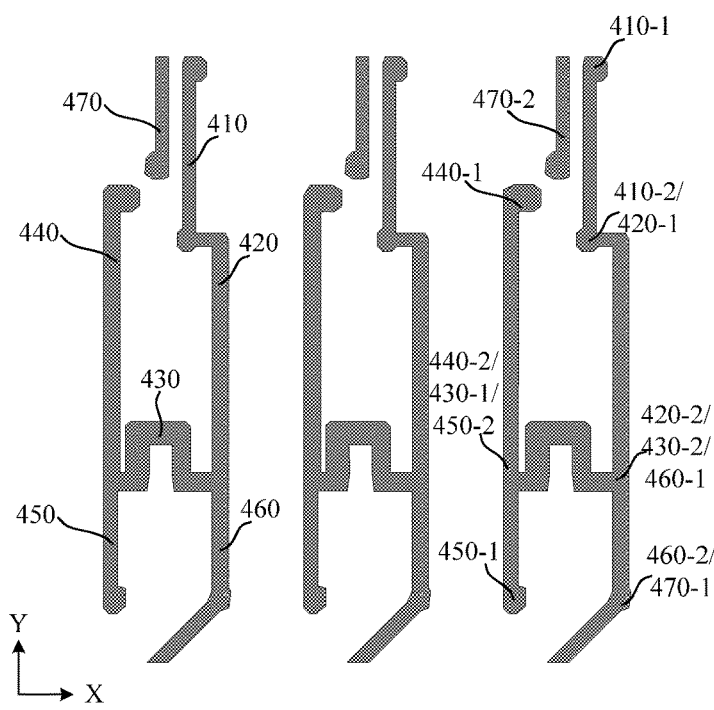
FIG. 11B is a schematic diagram of the first semiconductor layer in FIG. 10B.

FIG. 10B is a partially enlarged schematic diagram of a display substrate after a first semiconductor layer is formed in a second display region according to at least one embodiment of the present disclosure. FIG. 11B is a schematic diagram of the first semiconductor layer in FIG. 10B. In some examples, as shown in FIGS. 10B and 11B, the second conductive layer of the second display region may include first active layers 410 of first transistors 41 to seventh active layers 470 of seventh transistors 47 of multiple second region pixel circuits (for example, including a fourth pixel circuit, a fifth pixel circuit, and a sixth pixel circuit arranged in sequence along a first direction X). The first active layer 410 of the first transistor 41 to the seventh active layer 470 of the seventh transistor 47 of a second region pixel circuit may be of an integrated structure connected to each other. In this example, illustration is made by taking a first transistor 41 to a sixth transistor 46 of a second region pixel circuit in one row and a seventh transistor 47 of a second region pixel circuit in the previous row as an example.

In some examples, as shown in FIG. 11B, illustration is made by taking the first active layer 410 of the first transistor 41 to the seventh active layer 470 of the seventh transistor 47 of the fourth pixel circuit as an example. The first active layer 410, the second active layer 420, and the fourth active layer 440 of the fourth pixel circuit may be located on one side of the third active layer 430 of the fourth pixel circuit in the second direction Y. The fifth active layer 450, the sixth active layer 460, and the seventh active layer 470 may be located on the other side of the third active layer 430 of the fourth pixel circuit in the second direction Y.

In some examples, as shown in FIG. 11B, the shapes of the first active layer 410, the fourth active layer 440, the fifth active layer 450, and the seventh active layer 470 of the fourth pixel circuit may all be I-shaped. The shape of the second active layer 420 may be L-shaped. The shape of the sixth active layer 460 may be a folding line shape. The shape of the third active layer 430 may be n-shaped. However, this embodiment is not limited thereto.

In some examples, as shown in FIG. 11B, the active layer 410 of the first transistor 41 to the active layer 470 of the seventh transistor 47 of the fourth pixel circuit may each include: a first region, a second region, and a channel region disposed between the first and second regions. The first region 410-1 of the first active layer 410, the first region 440-1 of the fourth active layer 440, the first region 450-1 of the fifth active layer 450 and the first region 470-1 of the seventh active layer 470 may be disposed separately. A second region 410-2 of the first active layer 410 may also serve as a first region 420-1 of the second active layer 420. A second region 420-2 of the second active layer 420 may also serve as the second region 430-2 of the third active layer 430 and the first region 460-1 of the sixth active layer 460. A first region 430-1 of the third active layer 430 may also serve as the second region 440-2 of the fourth active layer 440 and the second region 450-2 of the fifth active layer 450. A second region 460-2 of the sixth active layer 460 may also serve as the second region 470-2 of the seventh active layer 470.

In some examples, as shown in FIG. 10B, an orthographic projection of a third shielding portion 2131 of the third shielding wiring 213 on the base may cover an orthographic projection of the channel region of the third active layer 430 of the third transistor of the fourth pixel circuit on the base. Similarly, an orthographic projection of the third shielding wiring 213 on the base may also cover orthographic projections of the channel regions of the third active layers of the third transistors of the fifth pixel circuit and the sixth pixel circuit on the base.

In some examples, after the first semiconductor layer is formed, the connection region of the first display region may include: a base, and a first conductive layer and a first insulating layer sequentially disposed on the base. The light-transmissive region of the first display region may include a base and a first insulating layer disposed on the base.

(4) A second conductive layer is formed. In some examples, a second insulation thin film and a second conductive thin film are sequentially deposited on the base on which the aforementioned patterns are formed, and the second conductive thin film is patterned through a patterning process to form a second insulating layer covering the first semiconductor layer and a second conductive layer disposed on the second insulating layer. In some examples, the second conductive layer may be referred to as a first gate metal layer.

Figure 12A:
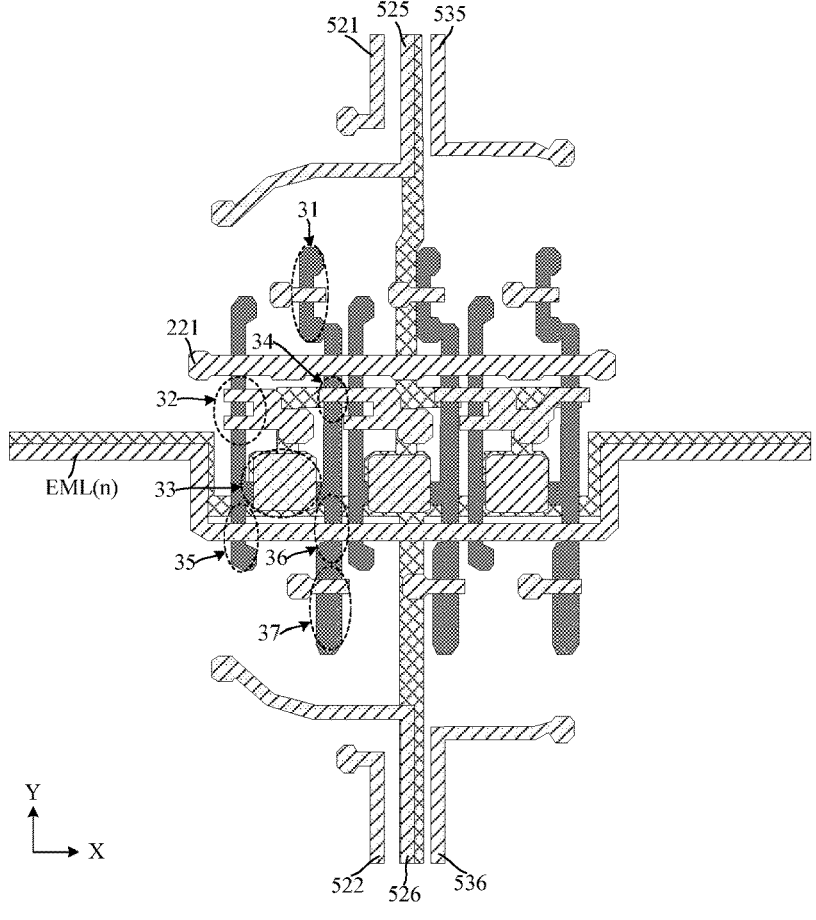
FIG. 12A is a partially enlarged schematic diagram of a display substrate after a second conductive layer is formed in a first display region according to at least one embodiment of the present disclosure.
Figure 13A:
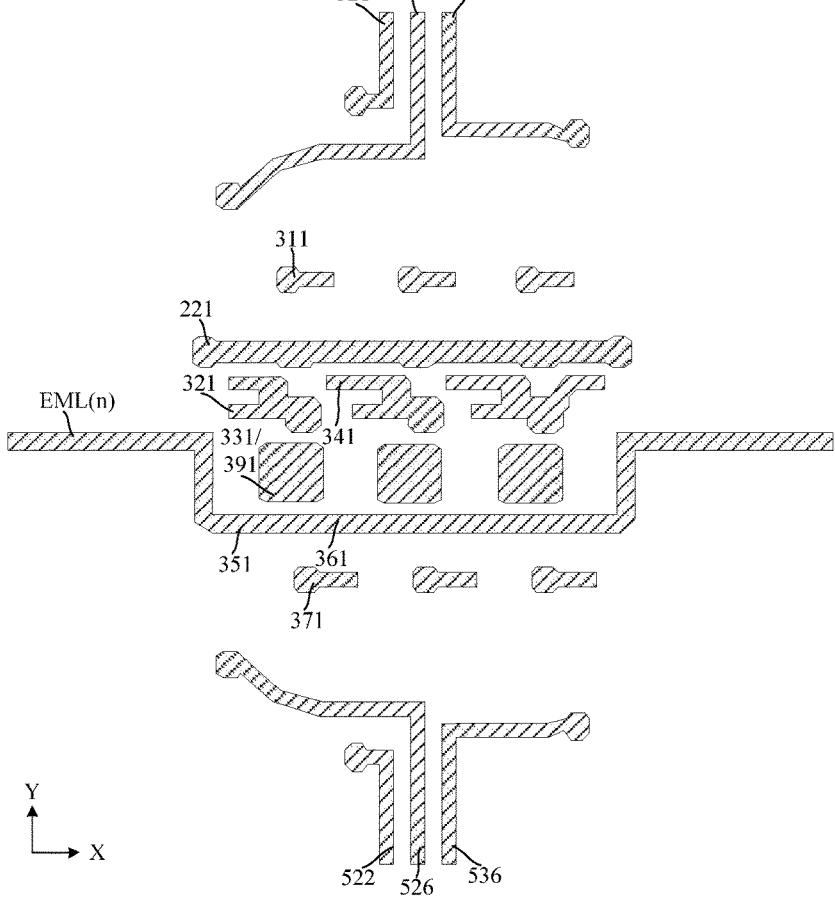
FIG. 13A is a schematic diagram of the second conductive layer in FIG. 12A.

FIG. 12A is a partially enlarged schematic diagram of a display substrate after a second conductive layer is formed in a first display region according to at least one embodiment of the present disclosure. FIG. 13A is a schematic diagram of the second conductive layer in FIG. 12A. In some examples, as shown in FIGS. 12A and 13A, the second conductive layer of a single display island region of the first display region may include: gates of first transistors 31 to seventh transistors 37 and first capacitor electrode plates 391 of storage capacitors of three first region pixel circuits (i.e. first pixel circuit to third pixel circuit), a light emitting control line EML(n), a fifth shielding wiring 221, and multiple data connection lines (including, for example, a first data connection line 521, a second data connection line 522, a fifth data connection line 525, a sixth data connection line 526, a fifteenth data connection line 535, and a sixteenth data connection line 536).

In some examples, as shown in FIG. 13A, taking the first pixel circuit as an example, orthographic projections of the gate 311 of the first transistor 31 and the gate 371 of the seventh transistor 37 of the first pixel circuit on the base may be substantially the same, for example, substantially in a key shape. An orthographic projection of the gate 321 of the second transistor 32 on the base may be substantially U-shaped. The gate 341 of the fourth transistor 34 of a first region pixel circuit and the gate 321 of the second transistor 32 of an adjacent first region pixel circuit may have an integrated structure. For example, the gate 341 of the fourth transistor 34 of the first pixel circuit of the display island region and the gate of the second transistor of the second pixel circuit may have an integrated structure, and the gate of the fourth transistor of the second pixel circuit, the gate of the second pixel circuit of the third pixel circuit, and the gate of the fourth transistor of the third pixel circuit may have an integrated structure. In this way, the arrangement space can be reasonably saved. The gate 331 of the third transistor 33 and the first capacitor electrode plate 391 of the storage capacitor of the first pixel circuit may be an integrated structure, for example, may be a rounded rectangular. The gates 351 of the fifth transistors 35 and the gates 361 of the sixth transistors 36 of the first pixel circuit to the third pixel circuit and the light emitting control line EML(n) may be an integrated structure. The light emitting control line EML(n) may bypass the first capacitor electrode plate 391 of the storage capacitor in the second direction Y in the display island region and extend in the first direction X to the connection regions on both sides of the display island region.

In some examples, as shown in FIG. 13A, the fifth shielding wiring 221 may extend in the first direction X within the display island region. The fifth shielding wiring 221 may be located in the second direction Y between the gate 311 of the first transistor 31 and the gate 321 of the second transistor 32 of the first pixel circuit.

In some examples, as shown in FIG. 13A, the first data connection line 521, the fifth data connection line 525, and the fifteenth data connection line 535 may be located on a side of the gate 311 of the first transistor 31 away from the fifth shielding wiring 221 in the second direction Y. The first data connection line 521, the fifth data connection line 525, and the fifteenth data connection line 535 may be arranged in sequence along the first direction X. The first data connection line 521, the fifth data connection line 525, and the fifteenth data connection line 535 may extend towards a side away from the gate 311 of the first transistor 31 in the second direction Y to the connection region.

In some examples, as shown in FIG. 13A, the second data connection line 522, the sixth data connection line 526, and the sixteenth data connection line 536 may be located on a side of the gate 371 of the seventh transistor 37 away from the light emitting control line EML(n) in the second direction Y. The second data connection line 522, the sixth data connection line 526, and the sixteenth data connection line 536 may be arranged in sequence along the first direction X. The second data connection line 522, the sixth data connection line 526, and the sixteenth data connection line 536 may extend towards a side away from the gate 371 of the seventh transistor 37 in the second direction Y to the connection region.

In some examples, as shown in FIG. 13A, orthographic projections of the first data connection line 521, the second data connection line 522, the fifth data connection line 525, the sixth data connection line 526, the fifteenth data connection line 535, and the sixteenth data connection line 536 on the base may all be substantially L-shaped. The first data connection line 521 and the second data connection line 522 may be substantially symmetrical about a center line of the display island region in the second direction Y. The fifth data connection line 525 and the sixth data connection line 526 may be substantially symmetrical about a center line of the display island region in the second direction Y. The fifteenth data connection line 535 and the sixteenth data connection line 536 may be substantially symmetrical about a center line of the display island region in the second direction Y.

Figure 12B:
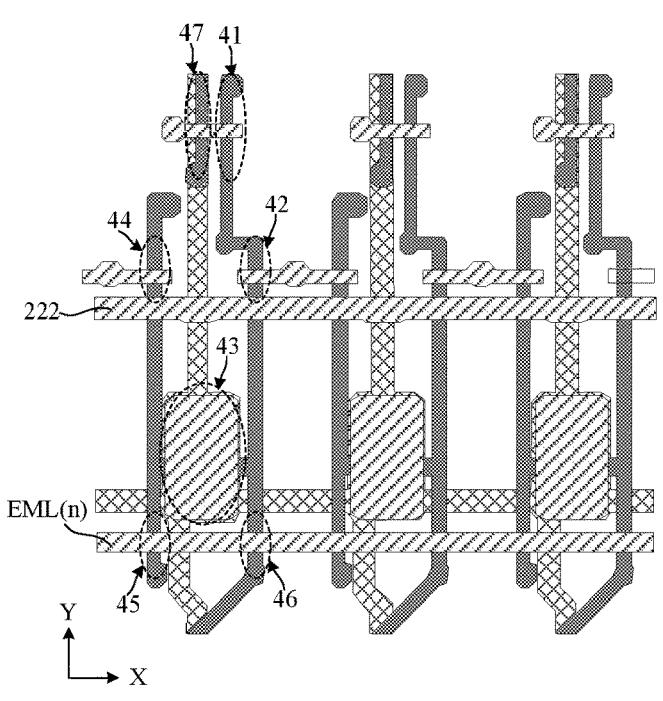
FIG. 12B is a partially enlarged schematic diagram of a display substrate after a second conductive layer is formed in a second display region according to at least one embodiment of the present disclosure.
Figure 13B:
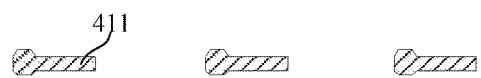
FIG. 13B is a schematic diagram of the second conductive layer in FIG. 12B.
Figure 13B:
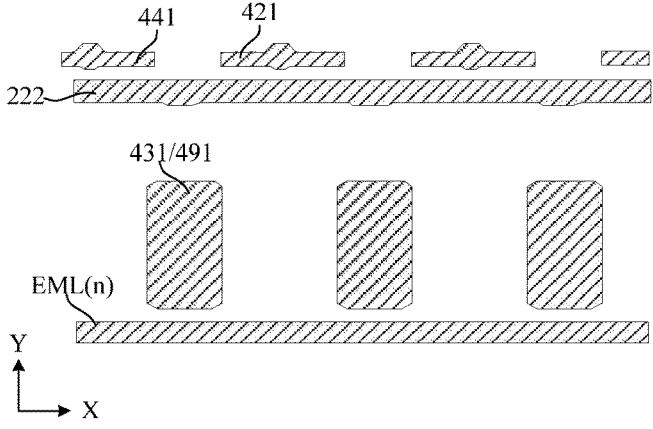

FIG. 12B is a partially enlarged schematic diagram of a display substrate after a second conductive layer is formed in a second display region according to at least one embodiment of the present disclosure. FIG. 13B is a schematic diagram of a second conductive layer in FIG. 12B. In some examples, as shown in FIGS. 12B and 13B, the second conductive layer of the second display region may include gates of first transistors 41 to seventh transistors 47 and first capacitor electrode plates 491 of storage capacitors of multiple second region pixel circuits (e.g. fourth pixel circuit to sixth pixel circuit), a light emitting control line EML(n), and a sixth shielding wiring 222. The light emitting control line EML(n) may extend in the first direction X. The overlapping region of the light emitting control line EML(n) and the active layer 450 of the fifth transistor 45 may serve as a gate of the fifth transistor 45, and the overlapping region of the light emitting control line EML(n) and the active layer 460 of the sixth transistor 46 may serve as a gate of the sixth transistor 46. The gate 421 of the second transistor 42 of one second region pixel circuit and the gate of the fourth transistor of the adjacent second region pixel circuit may have an integrated structure. For example, the gate of the second transistor of the fourth pixel circuit and the gate of the fourth transistor of the fifth pixel circuit may have an integrated structure, and the gate of the second transistor of the fifth pixel circuit and the gate of the fourth transistor of the sixth pixel circuit may have an integrated structure. The gate 411 of the first transistor 41 of the second region pixel circuit in the n-th row and the gate of the seventh transistor 47 of the second region pixel circuit in the previous row may be an integrated structure. The sixth shielding wiring 222 may extend in the first direction X. The sixth shielding wiring 222 may be located between the gate 421 of the second transistor 42 and the gate 431 of the third transistor 43.

In some examples, the light emitting control line EML(n) may extend from the first display region to the second display region via the connection region, or may extend directly from the first display region to the second display region.

In some examples, a second conductive layer of at least one connection region of the first display region may include a light emitting control line extending in a first direction.

In some examples, after the second conductive layer is formed, the light-transmissive region of the first display region may include: a base, and a first insulating layer and a second insulating layer sequentially disposed on the base.

(5) A second semiconductor layer is formed. In some examples, a third insulating thin film and a second semiconductor thin film are sequentially deposited on the base where the abovementioned patterns are formed, and the second semiconductor thin film is patterned through a patterning process to form a third insulating layer covering the second conductive layer and the second semiconductor layer disposed on the third insulating layer. In some examples, a material of the second semiconductor layer may be amorphous indium gallium zinc oxide material (a-IGZO), indium gallium zinc oxide material (IGZO), zinc nitrogen oxide (ZnON), indium zinc tin oxide (IZTO), etc., i.e., the present disclosure is applicable to transistors based on oxide (Oxide) technology.

Figure 14A:
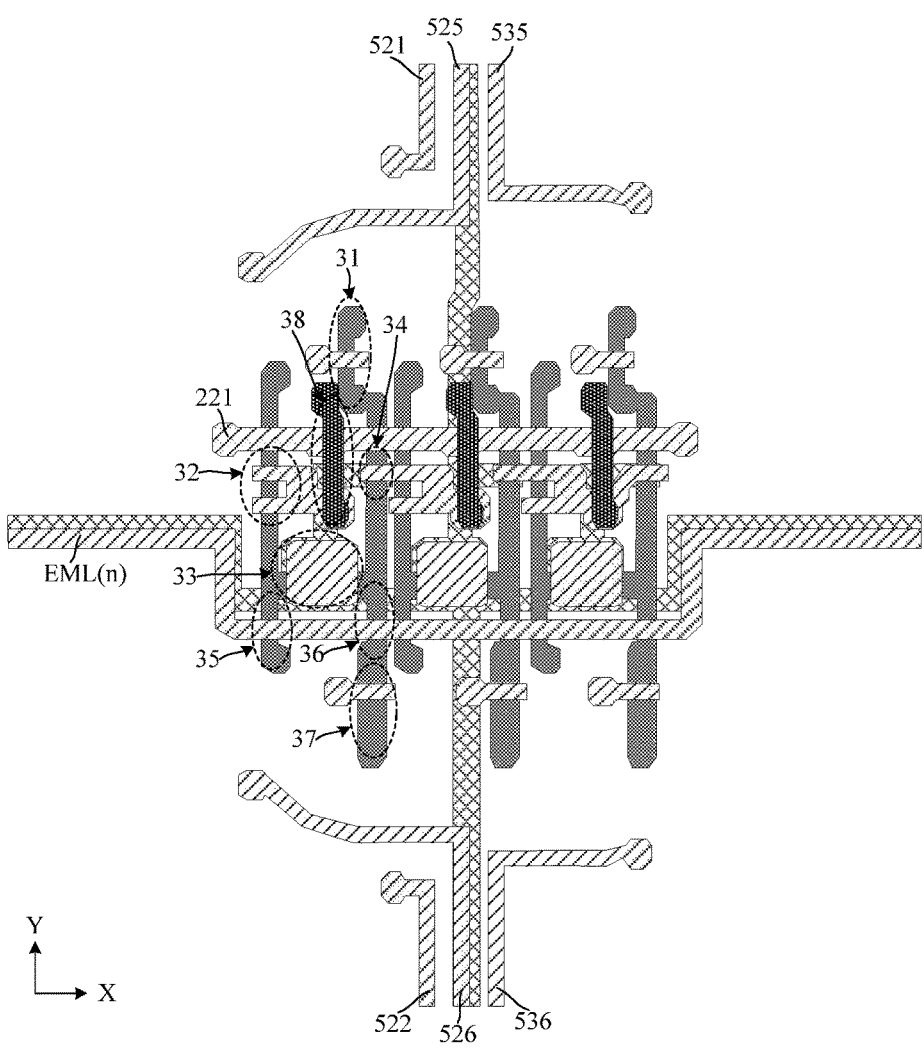
FIG. 14A is a partially enlarged schematic diagram of a display substrate after a second semiconductor layer is formed in a first display region according to at least one embodiment of the present disclosure.

FIG. 14A is a partially enlarged schematic diagram of a display substrate after a second semiconductor layer is formed in a first display region according to at least one embodiment of the present disclosure. FIG. 15A is a schematic diagram of a second semiconductor layer in FIG. 14A. In some examples, as shown in FIG. 14A and FIG. 15A, the second semiconductor layer of a single display island region of the first display region may include: eighth active layers 380 of eighth transistors 38 of the three first region pixel circuits (i.e., the first pixel circuit to the third pixel circuit). Taking the first pixel circuit as an example, the eighth active layer 380 of the first pixel circuit may include a first region 380-1, a second region 380-2, and a channel region located between the first region 380-1 and the second region 380-2. The eighth active layer 380 may have an I-shaped shape. An orthographic projection of the fifth shielding wiring 221 on the base may overlap with each of orthographic projections of the eighth active layers 380 of the eighth transistors 38 of the first pixel circuit to the third pixel circuit on the base.

FIG. 14B is a partially enlarged schematic diagram of a display substrate after a second semiconductor layer is formed in a second display region according to at least one embodiment of the present disclosure. FIG. 15B is a schematic diagram of the second semiconductor layer in FIG. 14B. In some examples, as shown in FIG. 14B and FIG. 15B, the second semiconductor layer of the second display region may include: eighth active layers 480 of the eighth transistors 48 of multiple second region pixel circuits (e.g., fourth pixel circuit through sixth pixel circuit). Taking the fourth pixel circuit as an example, the eighth active layer 480 may include: a first region 480-1, a second region 480-2, and a channel region located between the first region 480-1 and the second region 480-2. The eighth active layer 480 may have an I-shaped shape. An orthographic projection of the sixth shielding wiring 222 on the base may overlap with each of orthographic projections of the eighth active layers 480 of the eighth transistors 48 of the multiple second region pixel circuits on the base.

In some examples, after the second semiconductor layer is formed, the connection region of the first display region may include: a base, and a first conductive layer, a first insulating layer, a second insulating layer, a second conductive layer, and a third insulating layer that are disposed sequentially on the base. The light-transmissive region of the first display region may include: a base, and a first insulating layer, a second insulating layer, and a third insulating layer that are disposed in sequence on the base.

(6) A third conductive layer is formed. In some examples, a fourth insulating thin film and a third conductive thin film are sequentially deposited on the base on which the afore-mentioned patterns are formed, and the third conductive thin film is patterned through a patterning process to form a fourth insulating layer covering the second semiconductor layer and a third conductive layer disposed on the fourth insulating layer. In some examples, the third conductive layer may also be referred to as a second gate metal layer.

Figure 16A:
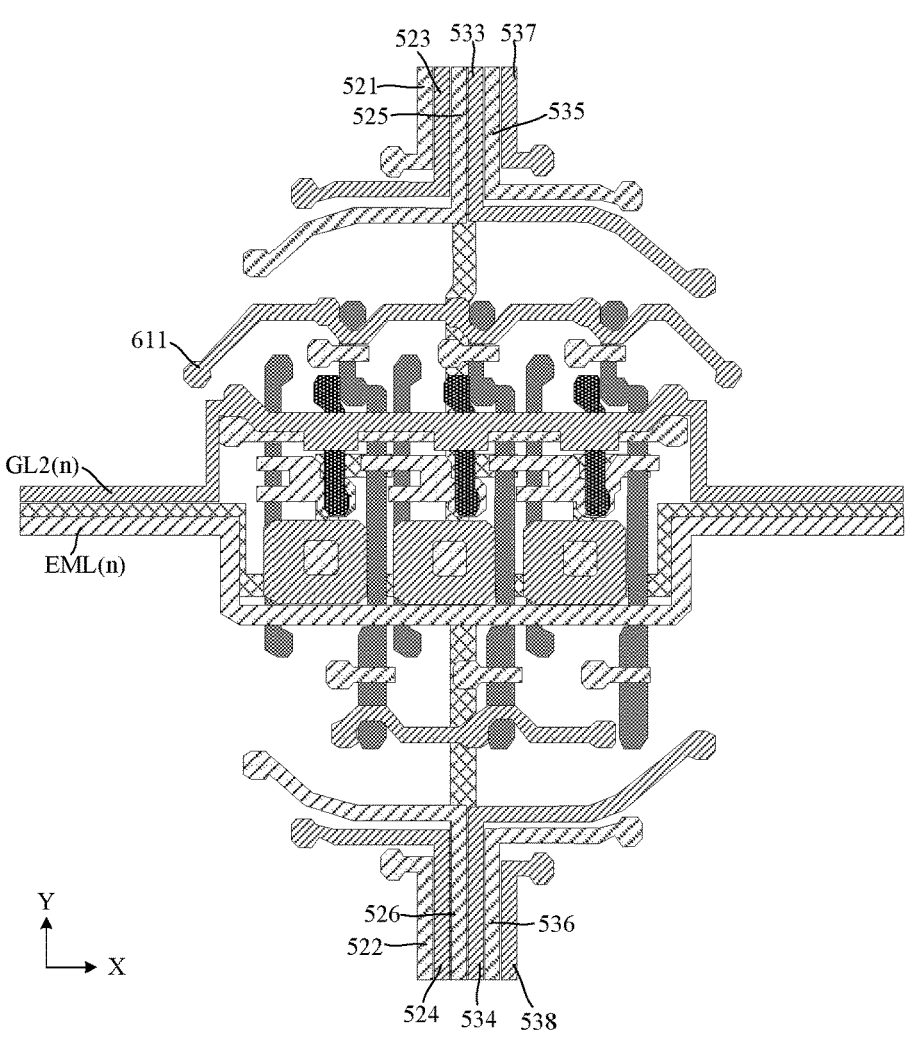
FIG. 16A is a partially enlarged schematic diagram of a display substrate after a third conductive layer is formed in a first display region according to at least one embodiment of the present disclosure.
Figures 17A, 17B:
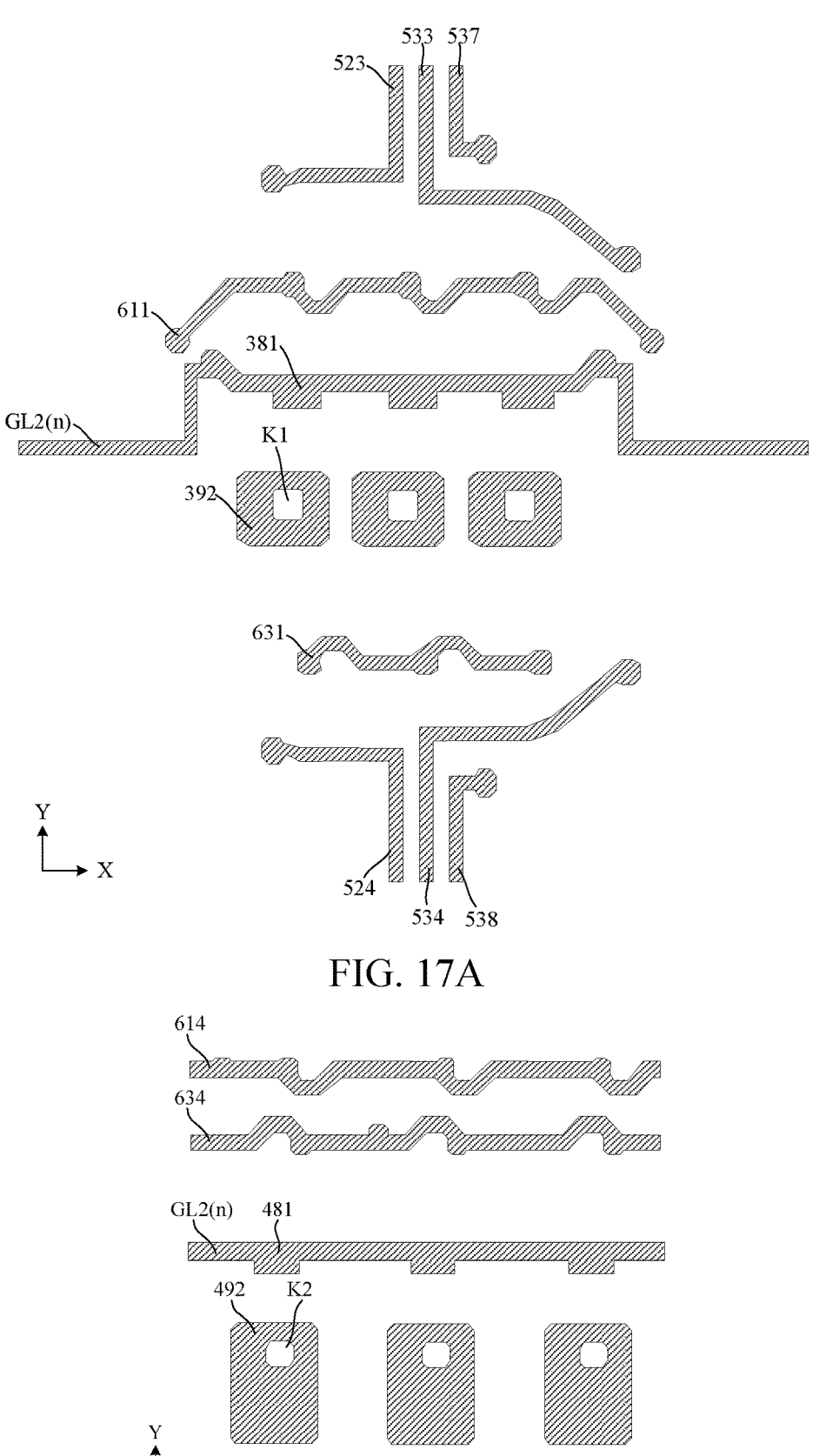
FIG. 17A is a schematic diagram of the third conductive layer in FIG. 16A.
FIG. 17B is a schematic diagram of the third conductive layer in FIG. 16B.

FIG. 16A is a partially enlarged schematic diagram of a display substrate after a third conductive layer is formed in a first display region according to at least one embodiment of the present disclosure. FIG. 17A is a schematic diagram of the third conductive layer in FIG. 16A. In some examples, as shown in FIGS. 16A and 17A, the third conductive layer of a single display island region of the first display region may include: gates 381 of the eighth transistors 38 and the second capacitor electrode plates 392 of the storage capacitors of the three first region pixel circuits (i.e., the first pixel circuit to the third pixel circuit), the second scan signal line GL2($n$), the first initial transmission line 611, the eleventh initial transmission line 631, and multiple data connection lines (e.g. including a third data connection line 523, a fourth data connection line 524, a thirteenth data connection line 533, a fourteenth data connection line 534, a seventeenth data connection line 537, and an eighteenth data connection line 538).

In some examples, as shown in FIGS. 16A and 17A, the second scan signal line GL2($n$) may bypass the second capacitor electrode plate 392 of the storage capacitor in the second direction Y in the display island region, and extend to the connection regions on both sides of the display island region in the first direction X. Taking the first pixel circuit as an example, the gate 381 of the eighth transistor 38 of the first pixel circuit and the second scan signal line GL2($n$) may be an integrated structure. The second capacitor electrode plate 392 of the storage capacitor of the first pixel circuit may have a first hollow structure K1, and an orthographic projection of the first hollow structure K1 on the base may be within the range of an orthographic projection of the first capacitor electrode plate 391 on the base. The first initial transmission line 611 and the eleventh initial transmission line 631 may be located within the display island region, and extend in the first direction X. For example, the length of the eleventh initial transmission line 631 in the first direction X may be smaller than the length of the first initial transmis-sion line 611 in the first direction X.

In some examples, as shown in FIG. 17A, the third data connection line 523, the thirteenth data connection line 533, and the seventeenth data connection line 537 may be located on a side of the first initial transmission line 611 away from the second scan signal line GL2($n$) in the second direction Y. The third data connection line 523, the thirteenth data connection line 533, and the seventeenth data connection line 537 may be arranged in sequence along the first direc-tion X. The third data connection line 523, the thirteenth data connection line 533, and the seventeenth data connection line 537 may extend towards a side away from the first initial transmission line 611 in the second direction Y to the connection region.

In some examples, as shown in FIG. 17A, the fourth data connection line 524, the fourteenth data connection line 534, and the eighteenth data connection line 538 may be located on a side of the eleventh initial transmission line 631 away from the second capacitor electrode plate 392 of the storage capacitor in the second direction Y. The fourth data connec-tion line 524, the fourteenth data connection line 534, and the eighteenth data connection line 538 may be arranged in sequence along the first direction X. The fourth data con-nection line 524, the fourteenth data connection line 534, and the eighteenth data connection line 538 may extend towards a side away from the second initial transmission line 631 in the second direction Y to the connection region.

In some examples, as shown in FIG. 17A, orthographic projections of the third data connection line 523, the fourth data connection line 524, the thirteenth data connection line 533, the fourteenth data connection line 534, the seventeenth data connection line 537, and the eighteenth data connection line 538 on the base may all be substantially L-shaped. The third data connection line 523 and the fourth data connection line 524 may be substantially symmetrical about a center line of the display island region in the second direction Y. The thirteenth data connection line 533 and the fourteenth data connection line 534 may be substantially symmetrical about a center line of the display island region in the second direction Y. The seventeenth data connection line 537 and the eighteenth data connection line 538 may be substantially symmetrical about a center line of the display island region in the second direction Y.

In some examples, as shown in FIG. 16A, an orthographic projection of the third data connection line 523 on the base may be located between an orthographic projection of the first data connection line 521 and an orthographic projection of the fifth data connection line 525 on the base. An orthographic projection of the fourth data connection line 524 on the base may be located between an orthographic projection of the second data connection line 522 and an orthographic projection of the sixth data connection line 526 on the base. An orthographic projection of the thirteenth data connection line 533 on the base may be located between an orthographic projection of the fifth data connection line 525 and an orthographic projection of the fifteenth data connec-tion line 535 on the base. An orthographic projection of the fourteenth data connection line 534 on the base may be located between an orthographic projection of the sixth data connection line 526 and an orthographic projection of the sixteenth data connection line 536 on the base. An ortho-graphic projection of the seventeenth data connection line 537 on the base may be located on a side of the orthographic projection of the fifteenth data connection line 535 on the base away from the thirteenth data connection line 533 in the first direction X. An orthographic projection of the eigh-teenth data connection line 538 on the base may be located in the first direction X on a side of the orthographic projection of the sixteenth data connection line 536 on the base away from the fourteenth data connection line 534 in the first direction X.

Figure 16B:
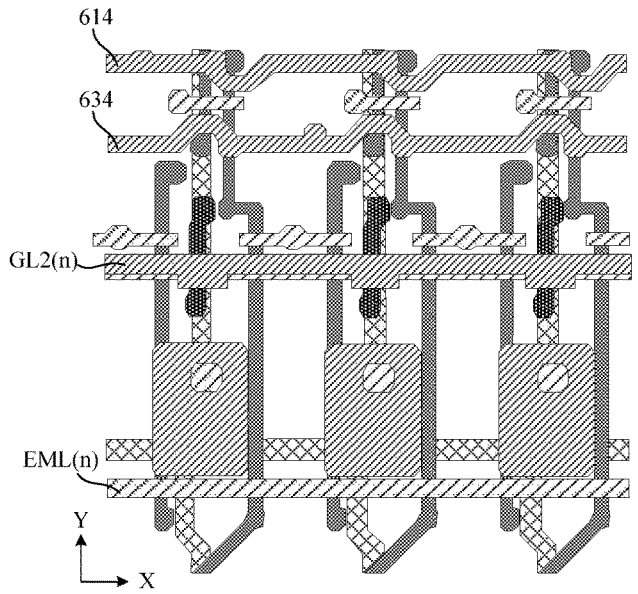
FIG. 16B is a partially enlarged schematic diagram of a display substrate after a third conductive layer is formed in a second display region according to at least one embodiment of the present disclosure.

FIG. 16B is a partially enlarged schematic diagram of a display substrate after a third conductive layer is formed in a second display region according to at least one embodi-ment of the present disclosure. FIG. 17B is a schematic diagram of a third conductive layer in FIG. 16B. In some examples, as shown in FIGS. 16B and 17B, the third conductive layer of the second display region may include gates 481 of eighth transistors 48 and second capacitor electrode plates 492 of the storage capacitors of multiple second region pixel circuits (e.g., a fourth pixel circuit to a sixth pixel circuit), a second scan signal line GL2($n$), a fourth initial transmission line 614, and a fourteenth initial transmission line 634.

In some examples, as shown in FIG. 17B, the second scan signal line GL2($n$) may extend in the first direction X in the second display region. Taking the fourth pixel circuit as an example, the gate 481 of the eighth transistor 48 of the fourth pixel circuit and the second scan signal line GL2($n$) may be an integrated structure. The second capacitor electrode plate 492 of the storage capacitor of the fourth pixel circuit may have a second hollow structure K2, and an orthographic projection of the second hollow structure K2 on the base may be within the range of an orthographic projection of the first capacitor electrode plate 491 on the base. The fourth initial transmission line 614 and the fourteenth initial transmission line 634 may both extend along the first direction X. The fourth initial transmission line 614 is located on a side of the fourteenth initial transmission line 634 away from the second scan signal line GL2($n$) in the second direction Y.

In some examples, the second scan signal line GL2($n$) may extend from the first display region to the second display region via the connection region, or may extend directly from the first display region to the second display region. The first and fourth initial transmission lines 611 and 614 may be configured to transmit a first initial signal and the eleventh and fourteenth initial transmission lines 631 and 634 may be configured to transmit a second initial signal.

In some examples, a third conductive layer of at least one connection region of the first display region may include a second scan signal line. After the third conductive layer is formed, the light-transmissive region of the first display region may include: a base, and a first insulating layer, a second insulating layer, a third insulating layer and a fourth insulating layer sequentially disposed on the base.

(7) A fifth insulating layer is formed. In some examples, a fifth insulating thin film is deposited on the base on which the aforementioned patterns are formed, and the fifth insulating thin film is patterned through a patterning process to form a fifth insulating layer.

Figure 18A:
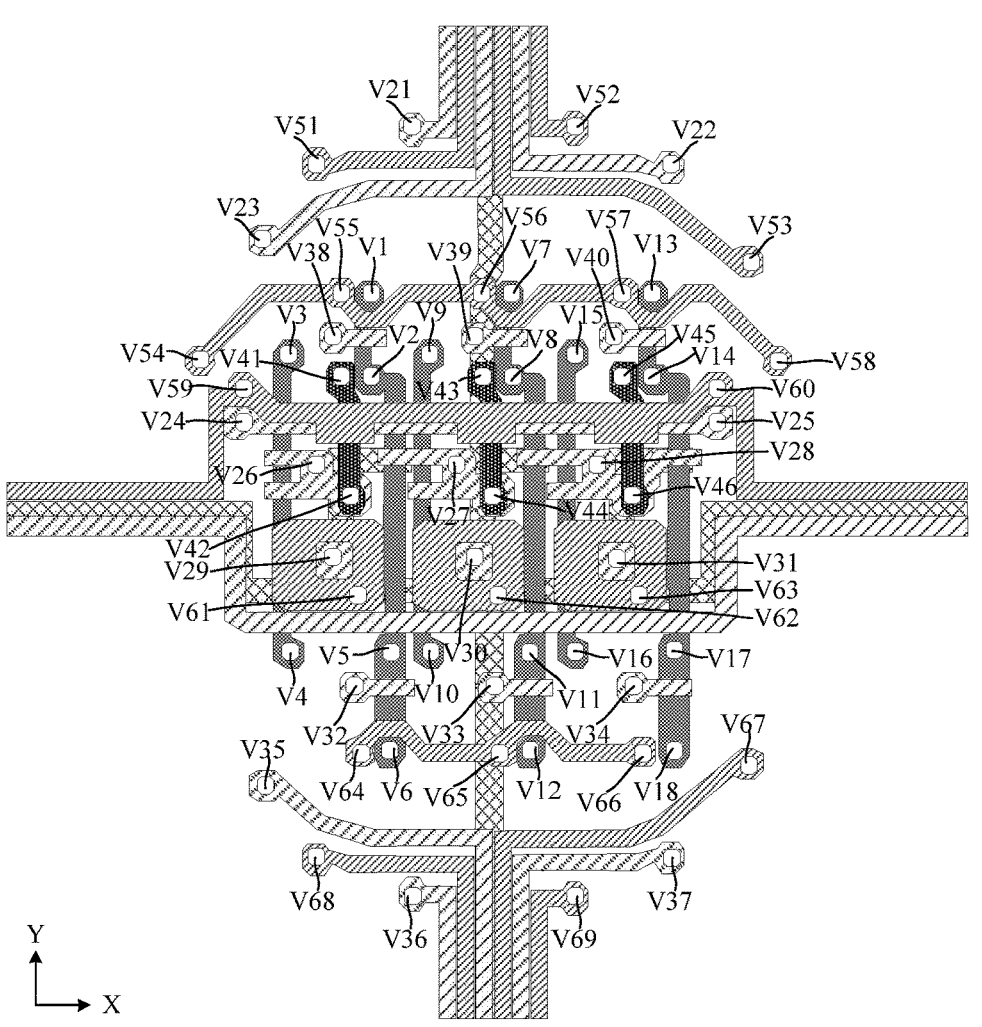
FIG. 18A is a partially enlarged schematic diagram of a display substrate after a fifth insulating layer is formed in a first display region according to at least one embodiment of the present disclosure.

FIG. 18A is a partially enlarged schematic diagram of a display substrate after a fifth insulating layer is formed in a first display region according to at least one embodiment of the present disclosure. In some examples, as shown in FIG. 18A, multiple via holes may be provided in the fifth insulating layer of a single display island region of the first display region. For example, the via holes may include: the first via hole V1 to the eighteenth via hole V18, the twenty-first via hole V21 to the forty-sixth via hole V46, and the fifty-first via hole V51 to the sixty-ninth via hole V69. Herein, the fifth insulating layers, the fourth insulating layers, the third insulating layers and the second insulating layers in the first via hole V1 to the eighteenth via hole V18 are removed, exposing the surface of the first semiconductor layer. The fifth insulating layers, the fourth insulating layers and the third insulating layers in the twenty-first via hole V21 to the fortieth via hole V40 are removed, exposing the surface of the second conductive layer. The fifth insulating layers and the fourth insulating layers in the forty-first via hole V41 and the forty-sixth via hole V46 are removed, exposing the surface of the second semiconductor layer. The fifth insulating layers in the fifty-first via hole V51 to the sixty-ninth via hole V69 are removed, exposing the surface of the third conductive layer.

Figure 18B:
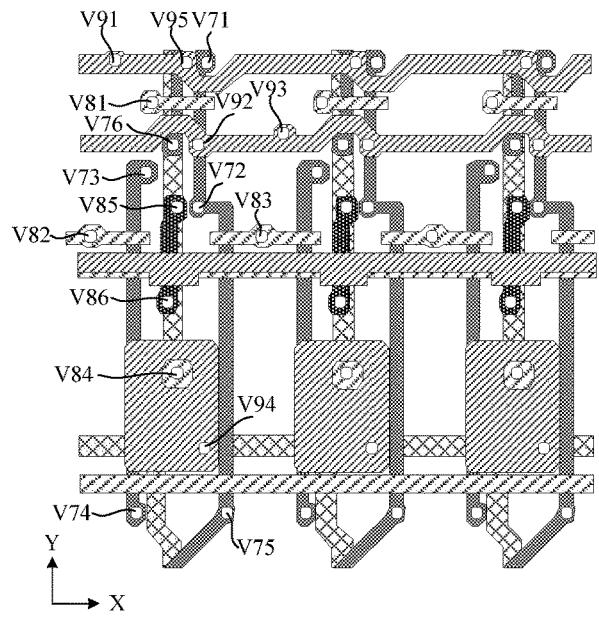
FIG. 18B is a partially enlarged schematic diagram of a display substrate after a fifth insulating layer is formed in a second display region according to at least one embodiment of the present disclosure.

FIG. 18B is a partially enlarged schematic diagram of a display substrate after a fifth insulating layer is formed in a second display region according to at least one embodiment of the present disclosure. In some examples, as shown in FIG. 18B, the fifth insulating layer of the second display region may be provided with multiple via holes. Taking the fourth pixel circuit in the second display region as an example, the via holes provided in the fifth insulating layer in the region where the fourth pixel circuit is located may include, for example, a seventy-first via hole V71 to seventy-sixth via hole V76, an eighty-first via hole V81 to an eighty-sixth via hole V86, and a ninety-first via hole V91 to a ninety-fifth via hole V95. The fifth insulating layers, the fourth insulating layers, the third insulating layers and the second insulating layers in the seventy-first via hole V71 to the seventy-sixth via hole V76 are removed, exposing the surface of the first semiconductor layer. The fifth insulating layers, the fourth insulating layers and the third insulating layers in the eighty-first via hole V81 to the eighty-fourth via hole V84 are removed, exposing the surface of the second conductive layer. The fifth insulating layers and the fourth insulating layers in the eighty-fifth via hole V85 and the eighty-sixth via hole V86 are removed, exposing the surface of the second semiconductor layer. The fifth insulating layers in the ninety-first via hole V91 to the ninety-fifth via hole V95 are removed, exposing the surface of the third conductive layer.

In some examples, after the fifth insulating layer is formed, the connection region of the first display region may include: a base, and a first conductive layer, a first insulating layer, a second insulating layer, a second conductive layer, a third insulating layer, a fourth insulating layer, a third conductive layer and a fifth insulating layer arranged on the base in sequence. The light-transmissive region of the first display region may include: a base, and a first insulating layer, a second insulating layer, a third insulating layer, a fourth insulating layer and a fifth insulating layer sequentially disposed on the base.

(8) A fourth conductive layer is formed. In some examples, a fourth conductive thin film is deposited on the base on which the aforementioned patterns are formed, and the fourth conductive thin film is patterned through a patterning process to form a fourth conductive layer disposed on the fifth insulating layer. In some examples, the fourth conductive layer is also referred to as a first source-drain metal layer.

Figure 19A:
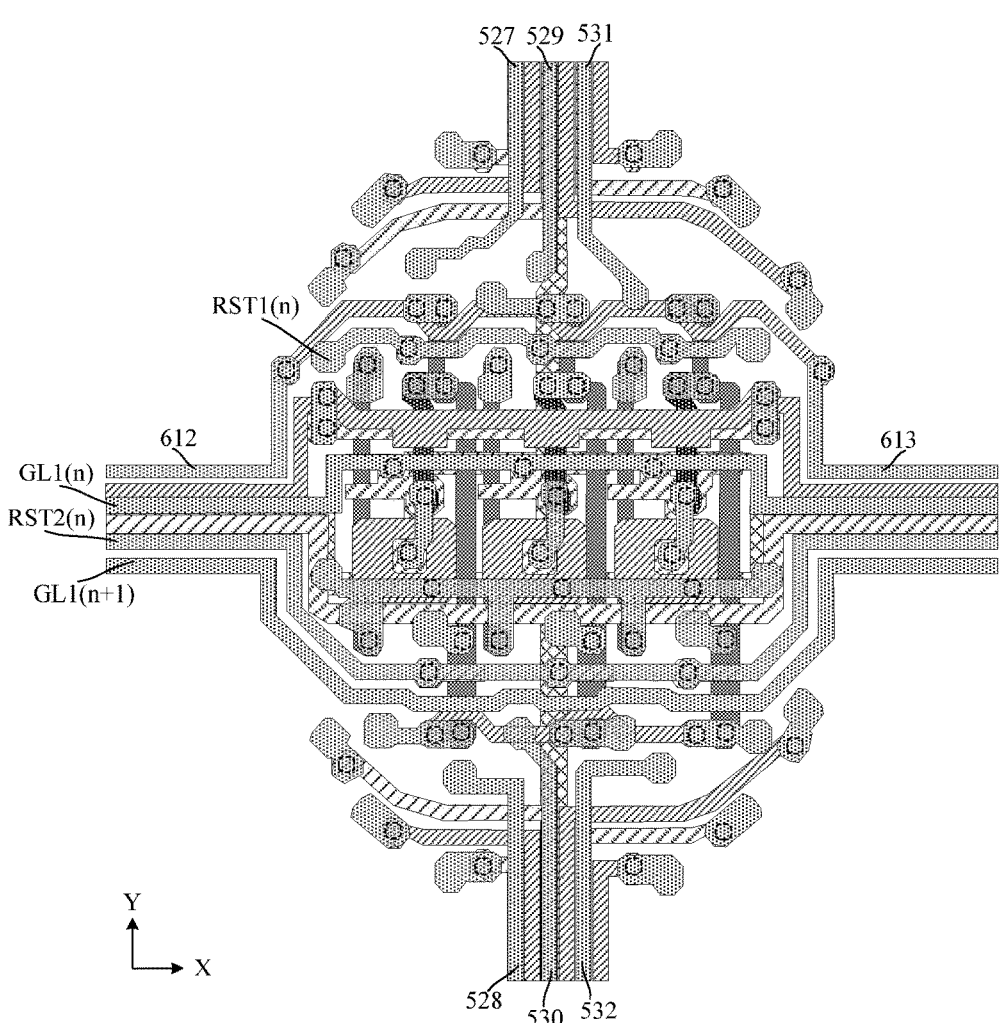
FIG. 19A is a partially enlarged schematic diagram of a display substrate after a fourth conductive layer is formed in a first display region according to at least one embodiment of the present disclosure.
Figures 20A, 20B:
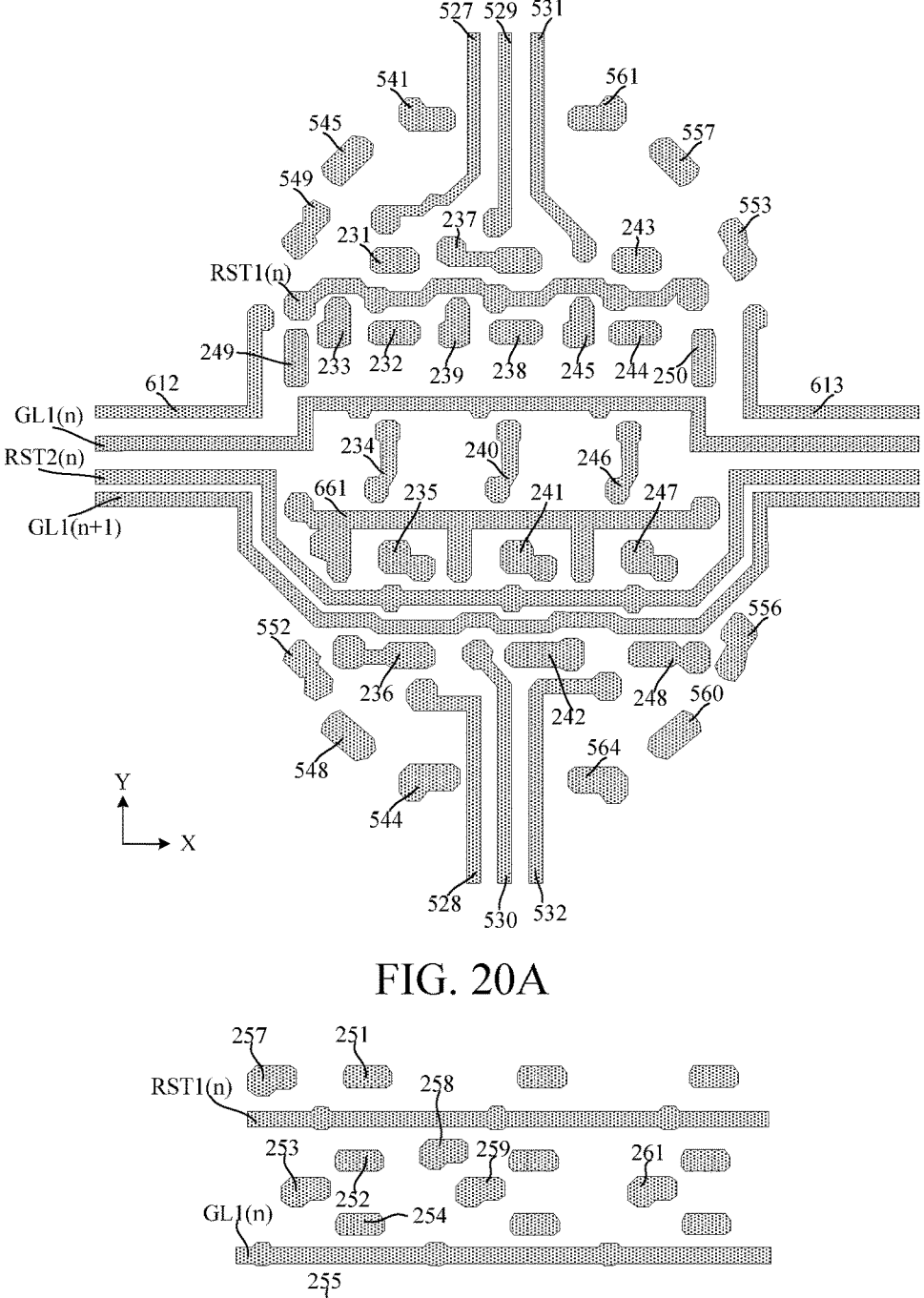
FIG. 20A is a schematic diagram of the fourth conductive layer in FIG. 19A.
FIG. 20B is a schematic diagram of the fourth conductive layer in FIG. 19B.

FIG. 19A is a partially enlarged schematic diagram of a display substrate after a fourth conductive layer is formed in a first display region according to at least one embodiment of the present disclosure. FIG. 20A is a schematic diagram of the fourth conductive layer in FIG. 19A. In some examples, as shown in FIGS. 19A and 20A, the fourth conductive layer of a single display island region of the first display region may at least include multiple connection electrodes (including, for example, a first connection electrode 231 to a twentieth connection electrode 250), a second initial transmission line 612, a third initial transmission line 613, a first power supply transmission line 661, first scan signal lines GL1($n$) and GL1($n$+1), and a fourth scan signal line RST2($n$).

In some examples, as shown in FIG. 18A, FIG. 19A, and FIG. 20A, the first connection electrode 231 may be electrically connected to a first region of the first active layer of the first transistor of the first pixel circuit through the first via hole V1, and may also be electrically connected to the first initial transmission line 611 through the fifty-fifth via hole V55. The second connection electrode 232 may be electrically connected to the first region of the second active layer of the second transistor of the first pixel circuit through the second via hole V2, and may also be electrically connected to the first region of the eighth active layer of the eighth transistor of the first pixel circuit through the forty-first via hole V41. The third connection electrode 233 may be electrically connected to a first region of the fourth active layer of the fourth transistor of the first pixel circuit through a third via hole V3. The fourth connection electrode 234 may be electrically connected to the second region of the eighth active layer of the eighth transistor of the first pixel circuit through the forty-second via hole V42, and may also be electrically connected to the gate of the third transistor of the first pixel circuit through the twenty-ninth via hole V29. The fifth connection electrode 235 may be electrically connected to a second region of the sixth active layer of the sixth transistor of the first pixel circuit through a fifth via hole V5. The sixth connection electrode 236 may be electrically connected to a first region of the seventh active layer of the seventh transistor of the first pixel circuit through the sixth via hole V6, and may also be electrically connected to the eleventh initial transmission line 631 through the sixty-fourth via hole V64.

In some examples, as shown in FIG. 18A, FIG. 19A and FIG. 20A, the seventh connection electrode 237 may be electrically connected to a first region of the first active layer of the first transistor of the second pixel circuit through the seventh via hole V7, and may also be electrically connected to the first initial transmission line 611 through the fifty-sixth via hole V56. The eighth connection electrode 238 may be electrically connected to a first region of the second active layer of the second transistor of the second pixel circuit through the eighth via hole V8, and may also be electrically connected to a first region of the eighth active layer of the eighth transistor of the second pixel circuit through the forty-third via hole V43. The ninth connection electrode 239 may be electrically connected to a first region of the fourth active layer of the fourth transistor of the second pixel circuit through the ninth via hole V9. The tenth connection electrode 240 may be electrically connected to a second region of the eighth active layer of the eighth transistor of the second pixel circuit through the forty-fourth via hole V44, and may also be electrically connected to the gate of the third transistor of the second pixel circuit through the thirtieth via hole V30. The eleventh connection electrode 241 may be electrically connected to a second region of the sixth active layer of the sixth transistor of the second pixel circuit through the eleventh via hole V11. The twelfth connection electrode 242 may be electrically connected to a first region of the seventh active layer of the seventh transistor of the second pixel circuit through the twelfth via hole V12, and may also be electrically connected to the eleventh initial transmission line 631 through the sixty-fifth via hole V65.

In some examples, as shown in FIG. 18A, FIG. 19A and FIG. 20A, the thirteenth connection electrode 243 may be electrically connected to a first region of the first active layer of the first transistor of the third pixel circuit through the thirteenth via hole V13, and may also be electrically connected to the first initial transmission line 611 through the fifty-seventh via hole V57. The fourteenth connection electrode 244 may be electrically connected to a first region of the second active layer of the second transistor of the third pixel circuit through the fourteenth via hole V14, and may also be electrically connected to a first region of the eighth active layer of the eighth transistor of the third pixel circuit through the forty-fifth via hole V45. The fifteenth connection electrode 245 may be electrically connected to a first region of the fourth active layer of the fourth transistor of the third pixel circuit through the fifteenth via hole V15. The sixteenth connection electrode 246 may be electrically connected to a second region of the eighth active layer of the eighth transistor of the third pixel circuit through the forty-sixth via hole V46, and may also be electrically connected to the gate of the third transistor of the third pixel circuit through the thirty-first via hole V31. The seventeenth connection electrode 247 may be electrically connected to a second region of the sixth active layer of the sixth transistor of the third pixel circuit through the seventeenth via hole V17. The eighteenth connection electrode 248 may be electrically connected to a first region of the seventh active layer of the seventh transistor of the third pixel circuit through the eighteenth via hole V18, and may also be electrically connected to the eleventh initial transmission line 631 through the sixty-sixth via hole V66.

In some examples, as shown in FIG. 18A, FIG. 19A, and FIG. 20A, the nineteenth connection electrode 249 may be electrically connected to the fifth shielding wiring 221 located in the second conductive layer through the twenty-fourth via hole V24, and may also be electrically connected to the second scan signal line GL2($n$) located in the third conductive layer through the fifty-ninth via hole V59. The twentieth connection electrode 250 may be electrically connected to the fifth shielding wiring 221 located in the second conductive layer through the twenty-fifth via hole V24, and may also be electrically connected to the second scan signal line GL2($n$) located in the third conductive layer through the sixtieth via hole V60. The nineteenth and twentieth connection electrodes 249 and 250 may be substantially symmetrical about a center line of the display island region in the first direction X. In this example, the overlapping region of the fifth shielding wiring 221 and the eighth active layer 380 of the eighth transistor 38 may serve as the bottom gate of the eighth transistor 38.

In some examples, as shown in FIG. 18A, FIG. 19A, and FIG. 20A, the second initial transmission line 612 may extend from the connection region to the display island region in the first direction X, and extend in the second direction Y in the display island region. The third initial transmission line 613 may extend from the connection region to the display island region in the first direction X and extend in the second direction Y in the display island region. The second initial transmission line 612 and the third initial transmission line 613 may be substantially symmetrical about the center line of the display island along the first direction X. The second initial transmission line 612 may be electrically connected to a terminal of the first initial transmission line 611 through the fifty-fourth via hole V54, and the third initial transmission line 613 may be electrically connected to the other terminal of the first initial transmission line 611 through the fifty-eighth via hole V58. In this example, transmission of the first initial signal to three first region pixel circuits of the display island region can be achieved by electrical connections of the first initial transmission line 611 to the third initial transmission line 613, and the first connection electrode 231, the seventh connection electrode 237, and the thirteenth connection electrode 243.

In some examples, as shown in FIG. 18A and FIG. 20A, in the second direction Y, the first scan signal lines GL1($n$) and GL1($n+1$) may be located on opposite sides of the fourth scan signal line RST2($n$). The third scan signal line RST1($n$) may be located on a side of the first scan signal line GL1($n$) away from the fourth scan signal line RST2($n$). The first scan signal line GL1($n$) may extend in a first direction X from the connection region to the display island region and from the display island region to another connection region. The first scan signal line GL1($n$) may be electrically connected to the gate of the second transistor of the first pixel circuit through the thirty-eighth via hole V38 in the display island region, may also be electrically connected to the gate of the second transistor of the second pixel circuit through the thirty-ninth via hole V39, and may also be electrically connected to the gate of the second transistor of the third pixel circuit through the fortieth via hole V40. The first scan signal line GL1($n$) may be configured to provide a first scan signal to three first region pixel circuits of the display island region.

In some examples, as shown in FIG. 18A and FIG. 20A, the fourth scan signal line RST2($n$) may extend from the connection region to the display island region in the first direction X, after bypassing the third transistor in the second direction Y in the display island region, it then extends in the first direction X to another connection region. The fourth scan signal line RST2($n$) may be electrically connected to the gate of the seventh transistor of the first pixel circuit through a thirty-second via hole V32, may be also electrically connected to the gate of the seventh transistor of the second pixel circuit through a thirty-third via hole V33, and may be also electrically connected to the gate of the seventh transistor of the third pixel circuit through a thirty-fourth via hole V34. The fourth scan signal line RST2($n$) may be configured to provide a second reset control signal to three first region pixel circuits of the display island region.

In some examples, as shown in FIG. 18A and FIG. 20A, the first scan signal line GL1($n$+1) may extend from the connection region to the display island region in the first direction X, and then extend to another connection region in the first direction X after bypassing the third transistor in the second direction Y in the display island region. The first scan signal line GL1($n$+1) may be located on a side of the fourth scan signal line RST2($n$) away from the first scan signal line GL1($n$) in the second direction Y. By providing the first scan signal GL1($n$+1) across the display island region, the first scan signal lines electrically connected to the second region pixel circuits of the (n+1)-th row on both sides of the first display region in the first direction X may be communicated, and signal uniformity can be ensured.

In some examples, as shown in FIG. 18A and FIG. 20A, the first power supply transmission line 661 may be located within the display island region, and may include a first main body portion extending in the first direction X and three first protrusion parts protruding from the same side of the first main body portion in the second direction Y. The first one of the first protrusion parts of the first power supply transmission line 661 may be electrically connected to a first region of the fifth active layer of the fifth transistor of the first pixel circuit through a fourth via hole V4, the second one of the first protrusion parts may be electrically connected to a first region of the fifth active layer of the fifth transistor of the second pixel circuit through a tenth via hole V10, and the third one of the first protrusion parts may be electrically connected to a first region of the fifth active layer of the fifth transistor of the third pixel circuit through a sixteenth via hole V16. The first main body portion of the first power supply transmission line 661 may be electrically connected to the second capacitor electrode plate of the storage capacitor of the first pixel circuit through the sixty-first via hole V61, may also be electrically connected to the second capacitor electrode plate of the storage capacitor of the second pixel circuit through the sixty-second via hole V62, and may also be electrically connected to the second capacitor electrode plate of the storage capacitor of the third pixel circuit through the sixty-third via hole V63.

In some examples, as shown in FIG. 18A, FIG. 19A and FIG. 20A, the fourth conductive layer of a single display island region of the first display region may further include: multiple data connection electrodes (e.g. including: a first data connection electrode 541, a fourth data connection electrode 544, a fifth data connection electrode 545, an eighth data connection electrode 548, a ninth data connection electrode 549, a thirteenth data connection electrode 553, a sixteenth data connection electrode 556, a seventeenth data connection electrode 557, a twentieth data connection electrode 560, a twenty-first data connection electrode 561, and a twenty-fourth data connection electrode 564) and multiple data connection lines (e.g. including: a seventh data connection line 527, an eighth data connection line 528, a ninth data connection line 529, a tenth data connection line 530, an eleventh data connection line 531, and a twelfth data connection line 532).

In some examples, as shown in FIG. 20A, the seventh data connection line 527, the ninth data connection line 529, and the eleventh data connection line 531 may be located on a side of the third scan signal line RST1($n$) away from the first scan signal line GL1($n$) in the second direction Y. The seventh data connection line 527, the ninth data connection line 529, and the eleventh data connection line 531 may be arranged in sequence along the first direction X. The eighth data connection line 528, the tenth data connection line 530, and the twelfth data connection line 532 may be located on a side of the first scan signal line GL1($n$+1) away from the fourth scan signal line RST2($n$) in the second direction Y. The eighth data connection line 528, the tenth data connection line 530, and the twelfth data connection line 532 may be arranged sequentially along the first direction X.

In some examples, as shown in FIG. 18A, FIG. 19A and FIG. 20A, the first data connection electrode 541 may be electrically connected to the first data connection line 521 located in the second conductive layer through the twelfth via hole V12. The fourth data connection electrode 544 may be electrically connected to the second data connection line 522 located in the second conductive layer through the thirty-sixth via hole V36. The fifth data connection electrode 545 may be electrically connected to the third data connection line 523 located in the third conductive layer through the fifty-first via hole V51. The eighth data connection electrode 548 may be electrically connected to the fourth data connection line 524 located in the third conductive layer through the sixty-eighth via hole V68. The ninth data connection electrode 549 may be electrically connected to the fifth data connection line 525 located in the second conductive layer through the twenty-third via hole V23. The twelfth data connection electrode 552 may be electrically connected to the sixth data connection line 526 located in the second conductive layer through the thirty-fifth via hole V35.

In some examples, as shown in FIG. 18A, FIG. 19A and FIG. 20A, the thirteenth data connection electrode 553 may be electrically connected to the thirteenth data connection line 533 in the third conductive layer through the fifty-third via hole V53. The sixteenth data connection electrode 556 may be electrically connected to the fourteenth data connection line 534 in the third conductive layer through the sixty-seventh via hole V67. The seventeenth data connection electrode 557 may be electrically connected to the fifteenth data connection line 535 in the second conductive layer through the twenty-second via hole V22. The twentieth data connection electrode 560 may be electrically connected to the sixteenth data connection line 536 in the second conductive layer through the thirty-seventh via hole V37. The twenty-first data connection electrode 561 may be electrically connected to the seventeenth data connection line 537 in the third conductive layer through the fifty-second via hole V52. The twenty-fourth data connection electrode 564 may be electrically connected to the eighteenth data connection line 538 in the third conductive layer through the sixty-ninth via hole V69.

Figure 19B:
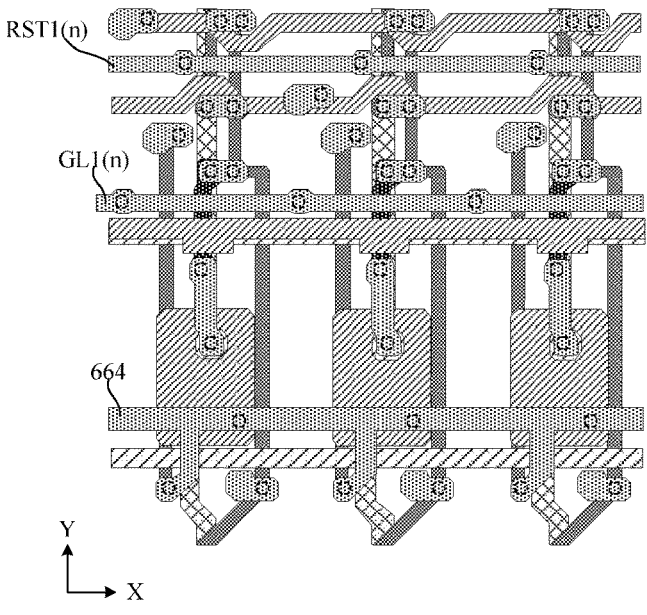
FIG. 19B is a partially enlarged schematic diagram of a display substrate after a fourth conductive layer is formed in a second display region according to at least one embodiment of the present disclosure.

FIG. 19B is a partially enlarged schematic diagram of a display substrate after a fourth conductive layer is formed in a second display region according to at least one embodiment of the present disclosure. FIG. 20B is a schematic diagram of the fourth conductive layer in FIG. 19B. In some examples, the fourth conductive layer of the second display region may include multiple connection electrodes (including, for example, a twenty-first connection electrode 251 to a thirty-second connection electrode 262), a third scan signal line RST1(n), a first scan signal line GL1(n), and a fourth power supply transmission line 664.

In some examples, as shown in FIG. 19B and FIG. 20B, illustration is made by taking a fourth pixel circuit of the second display region as an example. The twenty-first connection electrode 251 may be electrically connected to a first region of the first active layer of the first transistor of the fourth pixel circuit through the seventy-first via hole V71, and may also be electrically connected to the fourth initial transmission line 614 through the ninety-fifth via hole V95. The twenty-second connection electrode 252 may be electrically connected to a first region of the seventh active layer of the seventh transistor of the fourth pixel circuit in the previous row through the seventy-sixth via hole V76, and may also be electrically connected to the fourteenth initial transmission line 634 through the ninety-second via hole V92. The twenty-third connection electrode 253 may be electrically connected to a first region of the fourth active layer of the fourth transistor of the fourth pixel circuit through the seventy-third via hole V73. The twenty-fourth connection electrode 254 may be electrically connected to a first region of the second active layer of the second transistor of the fourth pixel circuit through the seventy-second via hole V72, and may also be electrically connected to a first region of the eighth active layer of the eighth transistor of the fourth pixel circuit through the eighty-fifth via hole V85. The twenty-fifth connection electrode 255 may be electrically connected to a second region of the eighth active layer of the eighth transistor of the fourth pixel circuit through the eighty-sixth via hole V86, and may also be electrically connected to the gate of the third transistor of the fourth pixel circuit through the eighty-fourth via hole V84. The twenty-sixth connection electrode 256 may be electrically connected to a second region of the sixth active layer of the sixth transistor of the fourth pixel circuit through the seventy-fifth via hole V75. The twenty-seventh connection electrode 257 may be electrically connected to the fourth initial transmission line 614 through the ninety-first via hole V91. The twenty-eighth connection electrode 258 may be electrically connected to the fourteenth initial transmission line 634 through the ninety-third via hole V93. The twenty-ninth connection electrode 259 may be electrically connected to a first region of the fourth active layer of the fourth transistor of the fifth pixel circuit. The thirtieth connection electrode 260 may be electrically connected to a second region of the sixth active layer of the sixth transistor of the fifth pixel circuit. The thirty-first connection electrode 261 may be electrically connected to a first region of the fourth active layer of the fourth transistor of the sixth pixel circuit. The thirty-second connection electrode 262 may be electrically connected to a second region of the sixth active layer of the sixth transistor of the sixth pixel circuit.

In some examples, as shown in FIG. 19B and FIG. 20B, the first scan signal line GL1(n) may extend in the first direction X, may be electrically connected to the gate of the fourth transistor of the fourth pixel circuit through the eighty-second via hole V82, and may also be electrically connected to the gate of the second transistor of the fourth pixel circuit through the eighty-third via hole V83. The third scan signal line RST1(n) may extend in the first direction X, and may be electrically connected to the gate of the first transistor of the fourth pixel circuit through the eighty-first via hole V81.

In some examples, as shown in FIG. 19B and FIG. 20B, the fourth power supply transmission line 664 may include a second main body portion extending in the first direction X and three second protrusion parts protruding on the same side of the second main body portion in the second direction Y. One second protrusion part of the fourth power supply transmission line 664 may be electrically connected to a first region of the fifth active layer of the fifth transistor of the fourth pixel circuit through the seventy-fourth via hole V74, and the remaining two second protrusion parts may be electrically connected to first regions of the fifth active layers of the fifth transistors of the fifth pixel circuit and the sixth pixel circuit, respectively. The second main body portion of the fourth power supply transmission line 664 may be electrically connected to the second capacitor electrode plate of the storage capacitor of the fourth pixel circuit through the ninety-fourth via hole V94, and may also be electrically connected to the second capacitor electrode plates of the storage capacitors of the fifth pixel circuit and the sixth pixel circuit.

In some examples, a fourth conductive layer of at least one connection region of the first display region may include a second initial transmission line, a third initial transmission line, a first scan signal line, and a third scan signal line that extend in a first direction X; or, may include multiple data connection lines extending in the second direction Y.

In some examples, the film structure of the light-transmissive region of the first display region does not change after the fourth conductive layer is formed.

(9) A sixth insulating layer is formed. In some examples, a sixth insulating thin film is coated on the base on which the aforementioned patterns are formed, and the sixth insulating thin film is patterned through a patterning process to form a sixth insulating layer.

Figure 21A:
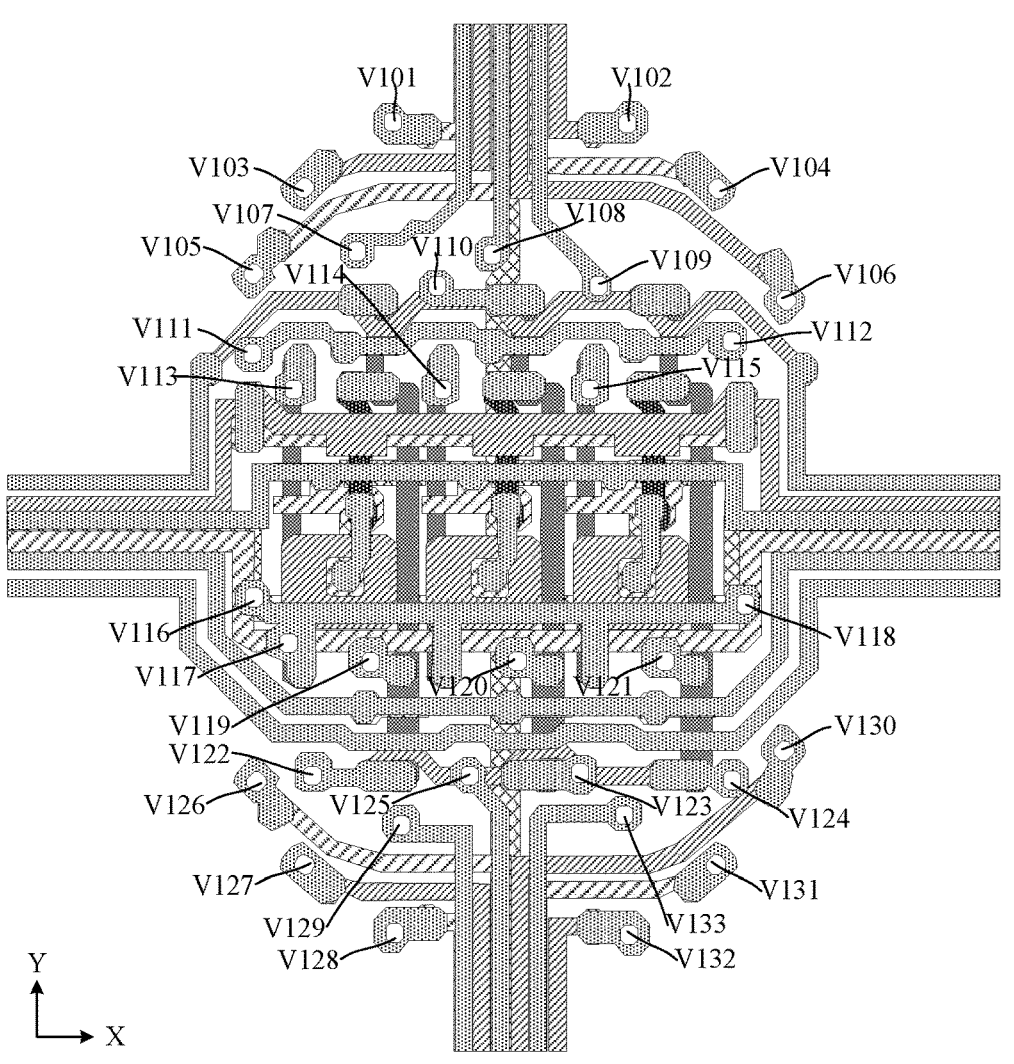
FIG. 21A is a partially enlarged schematic diagram of a display substrate after a sixth insulating layer is formed in a first display region according to at least one embodiment of the present disclosure.

FIG. 21A is a partially enlarged schematic diagram of a display substrate after a sixth insulating layer is formed in a first display region according to at least one embodiment of the present disclosure. In some examples, as shown in FIG. 21A, multiple via holes may be provided in the sixth insulating layer of a single display island region of the first display region. For example, the multiple via holes may include: the 101st via hole V101 to the 133rd via hole V133. The sixth insulating layers in the 101st via hole V101 to the 133rd via hole V133 are removed, exposing the surface of the fourth conductive layer.

Figure 21B:
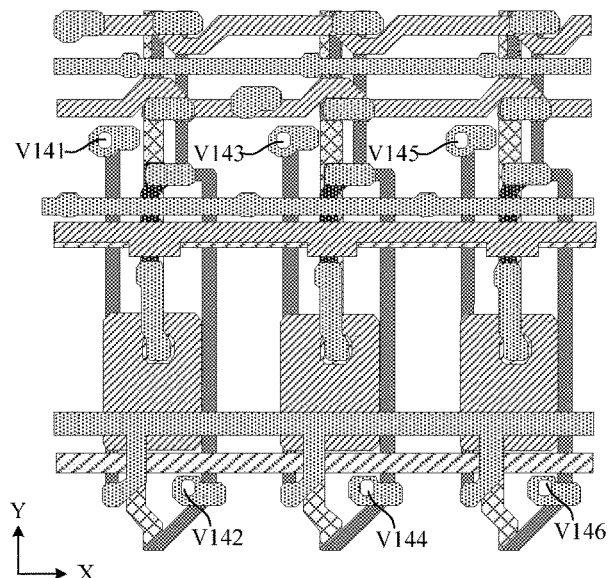
FIG. 21B is a partially enlarged schematic diagram of a display substrate after a sixth insulating layer is formed in a second display region according to at least one embodiment of the present disclosure.

FIG. 21B is a partially enlarged schematic diagram of a display substrate after a sixth insulating layer is formed in a second display region according to at least one embodiment of the present disclosure. In some examples, as shown in FIG. 21B, the sixth insulating layer of the second display region may be provided with multiple via holes. The via holes provided in the sixth insulating layer in the region where a second pixel unit is located may include, for example: the 141st via hole V141 to the 146th via hole V146. The sixth insulating layers in the 141st via hole V141 to the 146th via hole V146 are removed, exposing the surface of the fourth conductive layer.

(10) A fifth conductive layer is formed. In some examples, a fifth conductive thin film is deposited on the base on which the aforementioned patterns are formed, and the fifth conductive thin film is patterned through a patterning process to form a fifth conductive layer disposed on the sixth insulating layer. In some examples, the fifth conductive layer may also be referred to as a second source-drain metal layer.

Figure 22A:
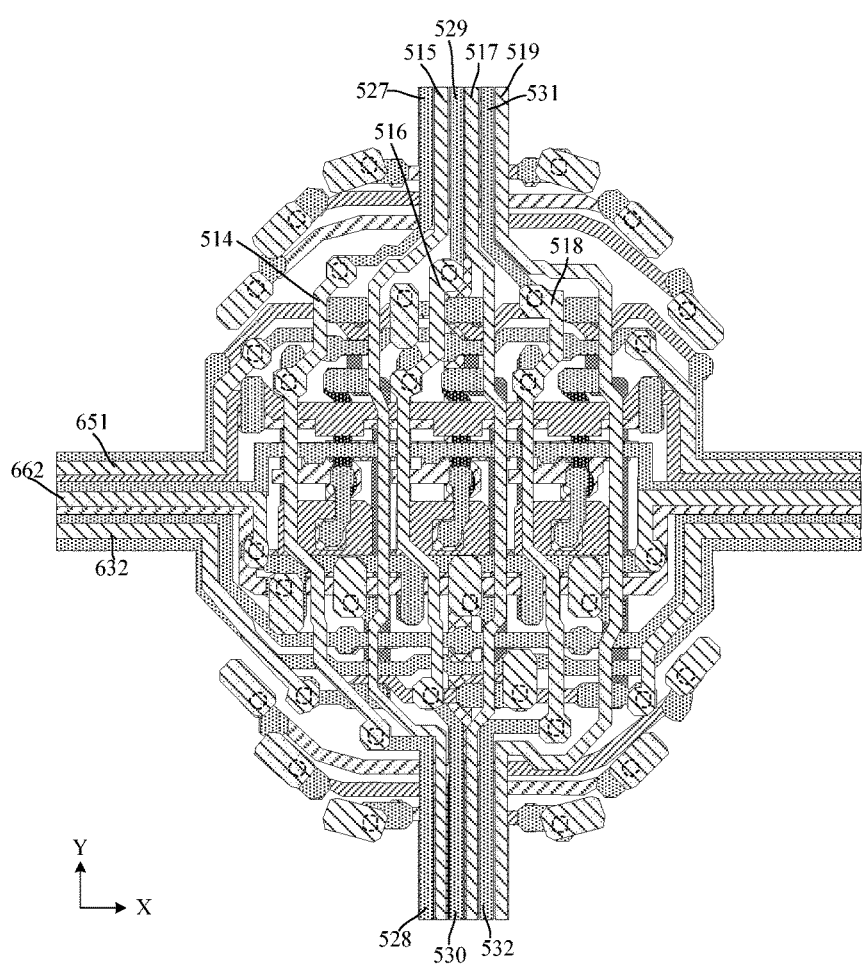
FIG. 22A is a partially enlarged schematic diagram of a display substrate after a fifth conductive layer is formed in a first display region according to at least one embodiment of the present disclosure.
Figures 23A, 23B:
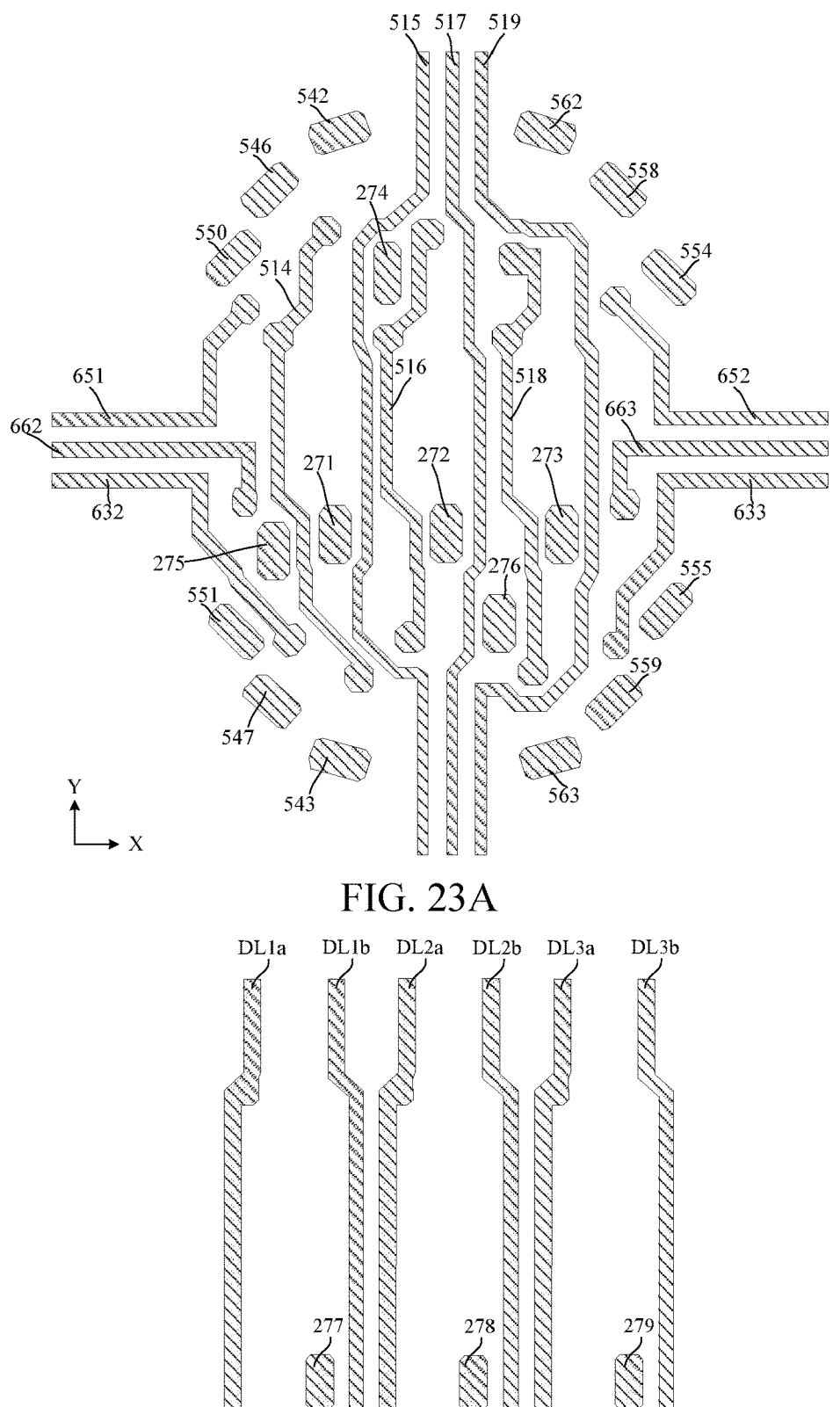
FIG. 23A is a schematic diagram of the fifth conductive layer in FIG. 22A.
FIG. 23B is a schematic diagram of the fifth conductive layer in FIG. 22B.

FIG. 22A is a partially enlarged schematic diagram of a display substrate after a fifth conductive layer is formed in a first display region according to at least one embodiment of the present disclosure. FIG. 23A is a schematic diagram of the fifth conductive layer in FIG. 22A. In some examples, as shown in FIG. 22A and FIG. 23A, the fifth conductive layer of a single display island region of the first display region may at least include multiple connection electrodes (including, for example, a forty-first connection electrode 271 to a forty-sixth connection electrode 276), a first scan connection line 651, a second scan connection line 652, a second power supply transmission line 662, a third power supply transmission line 663, a twelfth initial transmission line 632, and a thirteenth initial transmission line 633.

In some examples, as shown in FIG. 21A, FIG. 22A, and FIG. 23A, the forty-first connection electrode 271 may be electrically connected to the fifth connection electrode 235 through the 119th via hole V119, to achieve an electrical connection with a second region of the sixth active layer of the sixth transistor of the first pixel circuit. The forty-second connection electrode 272 may be electrically connected to the eleventh connection electrode 241 through the 120th via hole V120, to achieve an electrical connection with a second region of the sixth active layer of the sixth transistor of the second pixel circuit. The forty-third connection electrode 273 may be electrically connected to the seventeenth connection electrode 247 through the 121st via hole V121, to achieve an electrical connection with a second region of the sixth active layer of the sixth transistor of the third pixel circuit.

In some examples, as shown in FIG. 21A, FIG. 22A, and FIG. 23A, the forty-fourth connection electrode 274 may be electrically connected to the seventh connection electrode 237 through the 110th via hole V110 to achieve an electrical connection with the first initial transmission line 611. The forty-fifth connection electrode 275 may be electrically connected to the first power supply transmission line 661 through the 117th via hole V117. The forty-sixth connection electrode 276 may be electrically connected to the twelfth connection electrode 242 through the 123rd via hole V123 to achieve an electrical connection with the eleventh initial transmission line 631.

In some examples, as shown in FIG. 21A, FIG. 22A, and FIG. 23A, the first scan connection line 651 and the second scan connection line 652 may extend to the display island region from the connection regions on the opposite sides in the first direction X, respectively, and extend along the second direction Y in the display island region. The first scan connection line 651 may be electrically connected to one terminal of the third scan signal line RST1(n) through the 111th via hole V111, and the second scan connection line 652 may be electrically connected to the other terminal of the third scan signal line RST1(n) through the 112th via hole V112. In this example, transmission of the first reset control signal in the first display region can be achieved by the electrical connections of the first scan connection line 651, the third scan signal line, and the second scan connection line 652.

In some examples, as shown in FIG. 21A, FIG. 22A, and FIG. 23A, the second power supply transmission line 662 and the third power supply transmission line 663 may extend from the connection regions on both sides of the display island region to the display island region in the first direction X. The second power supply transmission line 662 may be electrically connected to one terminal of the first power supply transmission line 661 through the 116th via hole V116, and the third power supply transmission line 663 may be electrically connected to the other terminal of the first power supply transmission line 661 through the 118th via hole V118.

In some examples, as shown in FIG. 21A, FIG. 22A, and FIG. 23A, the twelfth initial transmission line 632 and the thirteenth initial transmission line 633 may extend from the connection regions on both sides of the display island region to the display island region in the first direction X. The twelfth initial transmission line 632 may be electrically connected to the sixth connection electrode 236 through the 122nd via hole V122, thereby achieving an electrical connection with the eleventh initial transmission line 631. The thirteenth initial transmission line 633 may be electrically connected to the eighteenth connection electrode 248 through the 124th via hole V124, thereby achieving an electrical connection with the eleventh initial transmission line 631.

In some examples, as shown in FIG. 22A and FIG. 23A, the fifth conductive layer of the single display island region of the first display region may further include: multiple data connection electrodes (e.g. including: a second data connection electrode 542, a third data connection electrode 543, a sixth data connection electrode 546, a seventh data connection electrode 547, a tenth data connection electrode 550, an eleventh data connection electrode 551, a fourteenth data connection electrode 554, a fifteenth data connection electrode 555, an eighteenth data connection electrode 558, a nineteenth data connection electrode 559, a twenty-second data connection electrode 562, and a twenty-third data connection electrode 563), and multiple data lines (e.g. including: a fourth data line 514 to a ninth data line 519).

In some examples, as shown in FIG. 21A, FIG. 22A, and FIG. 23A, the second data connection electrode 542 may be electrically connected to the first data connection electrode 541 through the 101st via hole V101. The third data connection electrode 543 may be electrically connected to the fourth data connection electrode 544 through the 128th via hole V128. The sixth data connection electrode 546 may be electrically connected to the fifth data connection electrode 545 through the 103rd via hole V103. The seventh data connection electrode 547 may be electrically connected to the eighth data connection electrode 548 through the 127th via hole V127. The tenth data connection electrode 550 may be electrically connected to the ninth data connection electrode 549 through the 105th via hole V105. The eleventh data connection electrode 551 may be electrically connected to the twelfth data connection electrode 552 through the 126th via hole V126. The fourteenth data connection electrode 554 may be electrically connected to the thirteenth data connection electrode 553 through the 106th via hole V106. The fifteenth data connection electrode 555 may be electrically connected to the sixteenth data connection electrode 556 through the 130th via hole V130. The eighteenth data connection electrode 558 may be electrically connected to the seventeenth data connection electrode 557 through the 104th via hole V104. The nineteenth data connection electrode 559 may be electrically connected to the twentieth data connection electrode 560 through the 131st via hole V131. The twenty-second data connection electrode 562 may be electrically connected to the twenty-first data connection electrode 561 through the 102nd via hole V102. The twenty-third data connection electrode 563 may be electrically connected to the twenty-fourth data connection electrode 564 through the 132nd via hole V132.

In some examples, as shown in FIG. 21A, FIG. 22A, and FIG. 23A, the fourth data line 514, the sixth data line 516, and the eighth data line 518 extend in the second direction Y within the display island region. The fifth data line 515, the seventh data line 517, and the ninth data line 519 extend from the connection region to the display island region in the second direction Y, and then extend to another connection region. The fourth data line 514 to the ninth data line 519 may be sequentially arranged in the first direction X. One terminal of the fourth data line 514 may be electrically connected to the seventh data connection line 527 through a 107th via hole V107, and the other terminal of the fourth data line 514 may be electrically connected to the eighth data connection line 528 through a 129th via hole V129. The fourth data line 514 may also be electrically connected to the third connection electrode 233 through the 113rd via hole V113, thereby achieving an electrical connection with the first region of the fourth active layer of the fourth transistor of the first pixel circuit. One terminal of the sixth data line 516 may be electrically connected to the ninth data connection line 529 through a 108th via hole V108, and the other terminal of the sixth data line 516 may be electrically connected to the tenth data connection line 530 through a 125th via hole V125. The sixth data line 516 may also be electrically connected to the ninth connection electrode 239 through the 114th via hole V114, thereby achieving an electrical connection with the first region of the fourth active layer of the fourth transistor of the second pixel circuit. One terminal of the eighth data line 518 may be electrically connected to the eleventh data connection line 531 through the 109th via hole V109, and the other terminal of the eighth data line 518 may be electrically connected to the twelfth data connection line 532 through the 133rd via hole V133. The eighth data line 518 may also be electrically connected to the fifteenth connection electrode 245 through the 115th via hole V115, thereby achieving an electrical connection with the first region of the fourth active layer of the fourth transistor of the third pixel circuit.

In this example, the fourth data line 514 may be configured to provide a data signal to the first pixel circuit, the sixth data line 516 may be configured to provide a data signal to the second pixel circuit, and the eighth data line 518 may be configured to provide a data signal to the third pixel circuit. The fifth data line 515 may pass through the display island region from the region where the first pixel circuit is located, the seventh data line 517 may pass through the display island region from the region where the second pixel circuit is located, and the ninth data line 519 may pass through the display island region from the region where the third pixel circuit is located. The fifth data line 515, the seventh data line 517, and the ninth data line 519 may extend directly to the connection region in the second direction Y. The fourth data line 514, the sixth data line 516, and the eighth data line 518 may be electrically connected to the data connection line of the connection region, respectively.

In this example, an orthographic projection of a first region pixel circuit on the base may overlap with orthographic projections of two data lines on the base. An orthographic projection of a first semiconductor layer of a first region pixel circuit on the base may overlap with orthographic projections of two data lines on the base. In particular, an orthographic projection of the first semiconductor layer of the first pixel circuit (including the active layers of multiple first-type transistors) on the base may overlap with orthographic projections of the fourth data line 514 and the fifth data line 515 on the base. An orthographic projection of the first semiconductor layer of the second pixel circuit on the base may overlap with orthographic projections of the sixth data line 516 and the seventh data line 517 on the base. An orthographic projection of the first semiconductor layer of the third pixel circuit on the base may overlap with orthographic projections of the eighth data line 516 and the ninth data line 517 on the base.

Figure 22B:
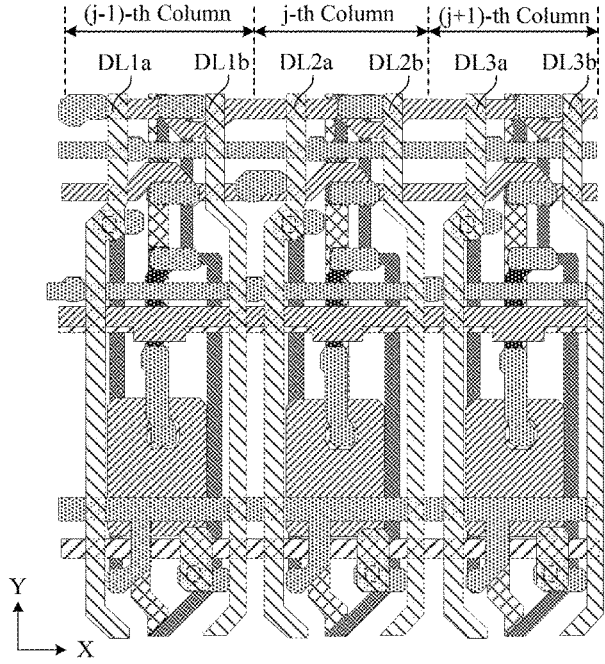
FIG. 22B is a partially enlarged schematic diagram of a display substrate after a fifth conductive layer is formed in a second display region according to at least one embodiment of the present disclosure.

FIG. 22B is a partially enlarged schematic diagram of a display substrate after a fifth conductive layer is formed in a second display region according to at least one embodiment of the present disclosure. FIG. 23B is a schematic diagram of the fifth conductive layer in FIG. 22B. In some examples, as shown in FIG. 22B and FIG. 23B, the fifth conductive layer of the second display region may include multiple connection electrodes (for example, including the forty-seventh connection electrode 277 to the forty-ninth connection electrode 279), and multiple data lines extending in the second direction Y (for example, including the data lines DL1a, DL1b, DL2a, DL2b, DL3a and DL3b). The data lines DL1a, DL1b, DL2a, DL2b, DL3a and DL3b may be arranged in sequence in the first direction X. The forty-seventh connection electrode 277 may be electrically connected to the twenty-sixth connection electrode 256 through the 142nd via hole V142. The forty-eighth connection electrode 278 may be electrically connected to the thirtieth connection electrode 260 through the 144th via hole V144. The forty-ninth connection electrode 279 may be electrically connected to the thirty-second connection electrode 262 through the 146th via hole V146.

In some examples, illustration is made by taking a case where the fourth pixel circuit is located in the (j−1)-th column and the n-th row, the fifth pixel circuit is located in the j-th column and the n-th row, and the sixth pixel circuit is located in the (j+1)-th column and the n-th row as an example. The data line DL1a may be electrically connected to the twenty-third connection electrode 253 through the 141st via hole V141, and is configured to provide a data signal to the fourth pixel circuit located in the n-th row and the (j−1)-th column. The data line DL2a may be electrically connected to the twenty-ninth connection electrode 259 through the 143rd via hole V143, and is configured to provide a data signal to the fifth pixel circuit located in the n-th row and the j-th column. The data line DL3a may be electrically connected to the thirty-first connection electrode 261 through the 145th via hole V145, and is configured to provide a data signal to the sixth pixel circuit located in the n-th row and the (j+1)-th column.

In some examples, the data line DL1b may be configured to provide a data signal to a fourth pixel circuit located in the (n−1)-th row and the (j−1)-th column, the data line DL2b may be configured to provide a data signal to a fifth pixel circuit located in the n-th row and the j-th column, and the data line DL3b may be configured to provide a data signal to a sixth pixel circuit located in the n-th row and the (j+1)-th column. In this example, the second region pixel circuits of the odd-numbered rows and the even-numbered rows are electrically connected with different data lines, which can ensure that the data signals better match the parasitic capacitors of the second region pixel circuits, thereby ensuring the display effect.

In some examples, a fifth conductive layer of at least one connection region of the first display region may include a first scan connection line 651 and a second scan connection line 652, a second power supply transmission line 662 and a third power supply transmission line 663, a twelfth initial transmission line 632 and a thirteenth initial transmission line 633 extending in the first direction X; or, it may include a fifth data line 515, a seventh data line 517, and a ninth data line 519 extending in the second direction Y.

In some examples, the film structure of the light-transmissive region of the first display region does not change after the fifth conductive layer is formed.

(11) A seventh insulating layer is formed. In some examples, a seventh insulating thin film is coated on the base on which the aforementioned patterns are formed, and the seventh insulating thin film is patterned through a patterning process to form a seventh insulating layer.

Figure 24A:
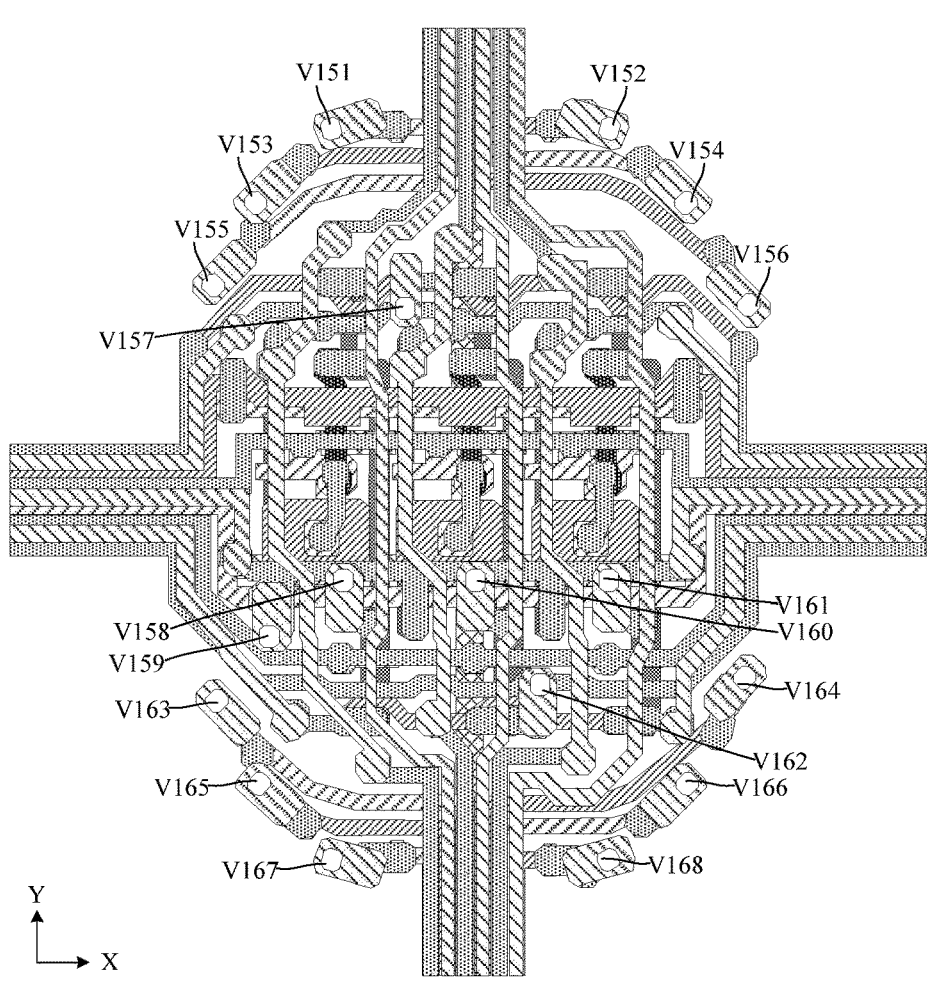
FIG. 24A is a partially enlarged schematic diagram of a display substrate after a seventh insulating layer is formed in a first display region according to at least one embodiment of the present disclosure.

FIG. 24A is a partially enlarged schematic diagram of a display substrate after a seventh insulating layer is formed in a first display region according to at least one embodiment of the present disclosure. In some examples, as shown in FIG. 24A, the seventh insulating layer of a single display island region of the first display region may be provided with multiple via holes, which may include, for example, the 151th via hole V151 to the 168th via hole V168. The seventh insulating layers within the 151st to the 168th via holes V151 to 168th are removed, exposing the surface of the fifth conductive layer.

Figure 24B:
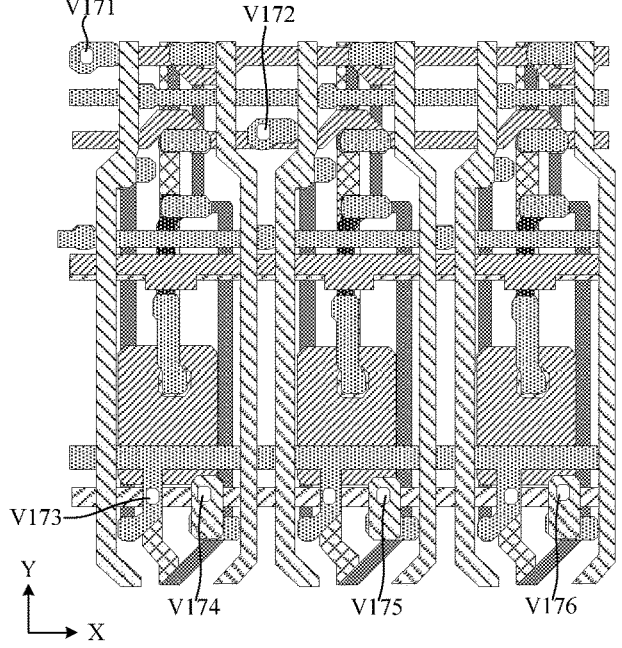
FIG. 24B is a partially enlarged schematic diagram of a display substrate after a seventh insulating layer is formed in a second display region according to at least one embodiment of the present disclosure.

FIG. 24B is a partially enlarged schematic diagram of a display substrate after a seventh insulating layer is formed in a second display region according to at least one embodiment of the present disclosure. In some examples, as shown in FIG. 24B, the seventh insulating layer of the second display region may be provided with multiple via holes. The via holes provided in the seventh insulating layer in the region where one second pixel unit of the second display region is located may include, for example, the 171th to the 176th via holes V171 to V176. The seventh insulating layers and the sixth insulating layers in the 171th via hole V171 to the 173th via hole V173 are removed, exposing the surface of the fourth conductive layer. The seventh insulating layers in the 174th via hole V174 and the 176th via hole V176 are removed, exposing the surface of the fifth conductive layer.

In some examples, after the seventh insulating layer is formed, the connection region of the first display region may include a base, and a first conductive layer, a first insulating layer, a second insulating layer, a second conductive layer, a third insulating layer, a fourth insulating layer, a third conductive layer, a fifth insulating layer, a fourth conductive layer, a sixth insulating layer, a fifth conductive layer, and a seventh insulating layer disposed sequentially on the base. The light-transmissive region of the first display region may include a base, and a first to seventh insulating layers disposed sequentially on the base.

(12) A sixth conductive layer is formed. In some examples, a sixth conductive thin film is deposited on the base on which the aforementioned patterns are formed, and the sixth conductive thin film is patterned by a patterning process to form a sixth conductive layer disposed on the seventh insulating layer. In some examples, the sixth conductive layer may also be referred to as a third source-drain metal layer.

Figure 25A:
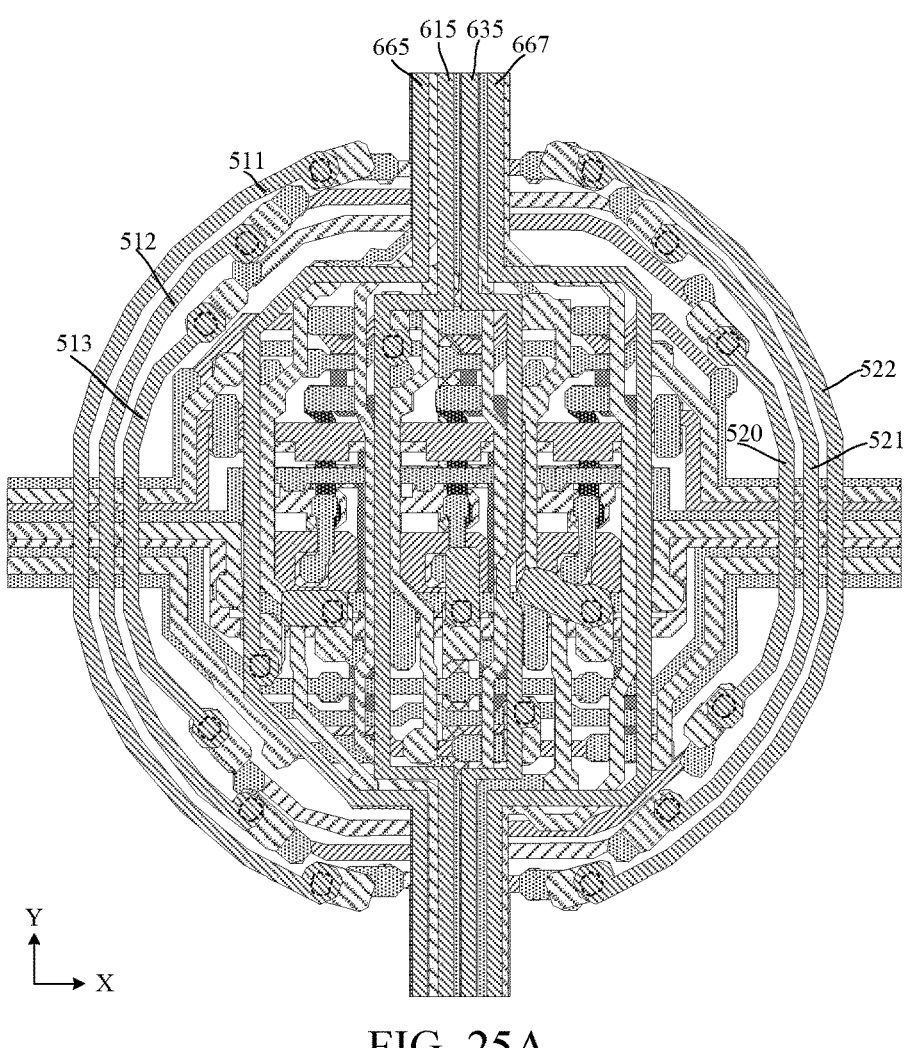
FIG. 25A is a partially enlarged schematic diagram of a display substrate after a sixth conductive layer is formed in a first display region according to at least one embodiment of the present disclosure.
Figures 26A, 26B:
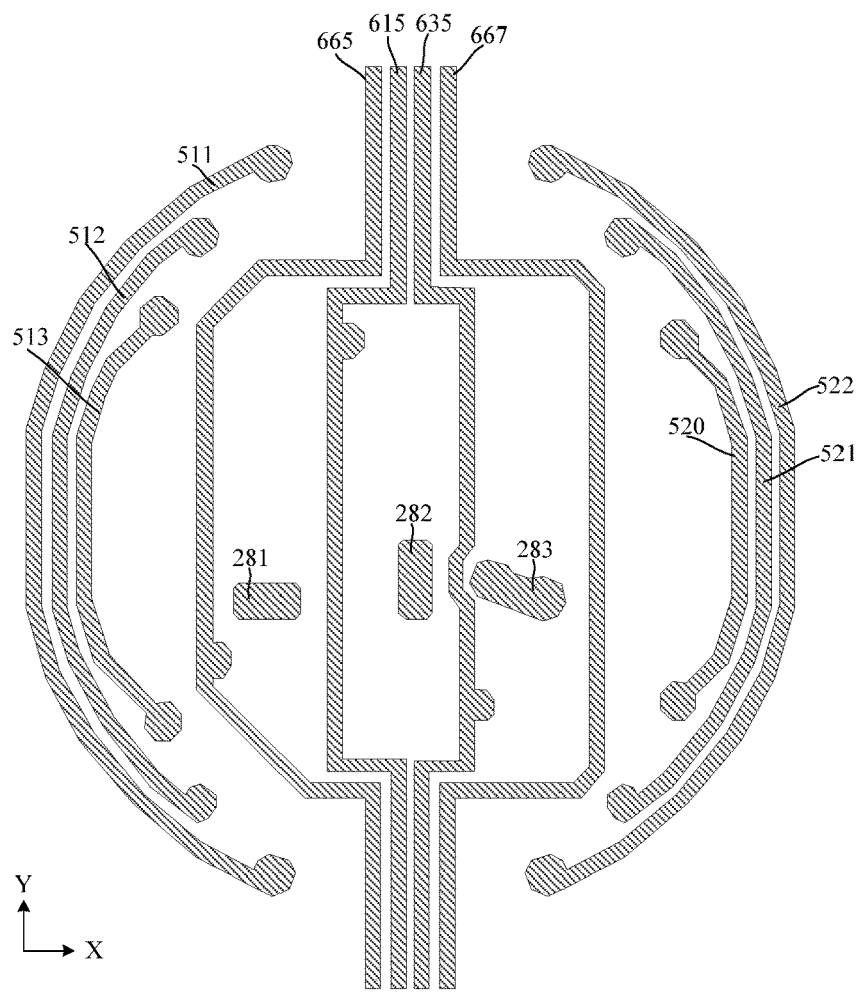
FIG. 26A is a schematic diagram of the sixth conductive layer in FIG. 25A.
FIG. 26B is a schematic diagram of the sixth conductive layer in FIG. 25B.

FIG. 25A is a partially enlarged schematic diagram of a display substrate after a sixth conductive layer is formed in a first display region according to at least one embodiment of the present disclosure. FIG. 26A is a schematic diagram of the sixth conductive layer in FIG. 25A. In some examples, as shown in FIG. 25A and FIG. 26A, a sixth conductive layer of a single display island region of the first display region may at least include: multiple connection electrodes (e.g. including a fifty-first connection electrode 281 to a fifty-third connection electrode 583), multiple data lines (e.g. including a first data line 511 to a third data line 513, a tenth data line 520 to a twelfth data line 522), a fifth initial transmission line 615, a fifteenth initial transmission line 635, a fifth power supply transmission line 665, and a seventh power supply transmission line 667.

In some examples, as shown in FIG. 24A, FIG. 25A, and FIG. 26A, the fifty-first connection electrode 281 may be electrically connected to the forty-first connection electrode 271 through a 158th via hole V158. The fifty-second connection electrode 282 may be electrically connected to the forty-second connection electrode 272 through the 160th via hole V160. The fifty-third connection electrode 283 may be electrically connected to the forty-third connection electrode 273 through the 161th via hole V161.

In some examples, as shown in FIG. 25A and FIG. 26A, the first data line 511, the second data line 512, and the third data line 513 may be located within the display island region and arranged in sequence along the first direction X and on a side of the fifth power supply transmission line 665 away from the fifth initial transmission line 615. The first data line 511, the second data line 512, and the third data line 513 may be of an arc shape. The tenth data line 520, the eleventh data line 521, and the twelfth data line 522 may be located within the display island region and arranged in sequence along the first direction X and on a side of the seventh power supply transmission line 668 away from the fifteenth initial transmission line 635. The tenth data line 520, the eleventh data line 521, and the twelfth data line 522 may be of an arc shape.

In some examples, as shown in FIG. 24A, FIG. 25A, and FIG. 26A, one terminal of the first data line 511 may be electrically connected to the second data connection electrode 542 through a 151st via hole V151, and the other terminal of the first data line 511 may be electrically connected to the third data connection electrode 543 through a 167th via hole V167. One terminal of the second data line 512 may be electrically connected to the sixth data connection electrode 546 through a 153rd via hole V153, and the other terminal of the second data line 512 may be electrically connected to the seventh data connection electrode 547 through a 165th via hole V165. One terminal of the third data line 513 may be electrically connected to the tenth data connection electrode 550 through a 155th via hole V155, and the other terminal of the third data line 513 may be electrically connected to the eleventh data connection electrode 551 through a 163rd via hole V163. One terminal of the tenth data line 520 may be electrically connected to the fourteenth data connection electrode 554 through a 156th via hole V156, and the other terminal of the tenth data line 520 may be electrically connected to the fifteenth data connection electrode 555 through a 164th via hole V164. One terminal of the eleventh data line 521 may be electrically connected to the eighteenth data connection electrode 558 through a 154th via hole V154, and the other terminal of the eleventh data line 521 may be electrically connected to the nineteenth data connection electrode 559 through a 166th via hole V166. One terminal of the twelfth data line 522 may be electrically connected to the twenty-second data connection electrode 562 through a 152nd via hole V152, and the other terminal of the twelfth data line 522 may be electrically connected to the twenty-third data connection electrode 563 through a 168th via hole V168.

In this example, the first data line 511 to the third data line 513, and the tenth data line 520 to the twelfth data line 522 may surround the periphery of the three first region pixel circuits in the display island region, and bypass the region where the first region pixel circuits are located. And the first data line 511 to the third data line 513 and the tenth data line 520 to the twelfth data line 522 may each be arc, the first data line 511 to the third data line 513 may be bent towards a side away from the first pixel circuit in the first direction X, and the tenth data line 520 to the twelfth data line 522 may be bent towards a side away from the third pixel circuit in the first direction X. In this way, the edge of the display island region may be an arc edge, and interference between the multiple data lines and the first region pixel circuits can be reduced.

In some examples, within the first display region, the fifth power supply transmission line 665 may transmit the first voltage signal in the second direction Y, and the first voltage signal may be transmitted in the first direction X by electrically connecting the first power supply transmission line 661, the second power supply transmission line 662, and the third power supply transmission line 663. A fifth power supply transmission line 665 located at the sixth conductive layer is electrically connected to a first power supply transmission line 661 located at the fourth conductive layer through a forty-fifth connection electrode 275 located at the fifth conductive layer. A mesh transmission path of the first voltage signal may be provided in the first display region, so that the load of the transmission wiring of the first voltage signal can be reduced, and the transmission uniformity of the first voltage signal in the first display region can be improved.

In some examples, within the first display region, a seventh power supply transmission line 667 may be configured to transmit a second voltage signal.

In some examples, within the first display region, a fifth initial transmission line 615 may transmit a first initial signal in a second direction Y. A first initial signal may be transmitted in a first direction X by electrically connecting the second initial transmission line 612, the first initial transmission line 611, and the third initial transmission line 613. The fifth initial transmission line 615 at the sixth conductive layer may be electrically connected to the first initial transmission line 611 located in the third conductive layer through the forty-fourth connection electrode 274 located in the fifth conductive layer and the seventh connection electrode 237 located in the fourth conductive layer. A mesh transmission path of the first initial signal may be provided in the first display region, so that the load of the transmission wiring of the first initial signal can be reduced, and the transmission uniformity of the first initial signal in the first display region can be improved.

In some examples, within the first display region, a fifteenth initial transmission line 635 may transmit a second initial signal in a second direction Y. The second initial signal may be transmitted in the first direction X by electrically connecting the twelfth initial transmission line 632, the eleventh initial transmission line 631, and the thirteenth initial transmission line 633. The fifteenth initial transmission line 635 located in the sixth conductive layer may be electrically connected to the eleventh initial transmission line 631 located in the third conductive layer through the forty-sixth connection electrode 276 located in the fifth conductive layer and the twelfth connection electrode 242 located in the fourth conductive layer. A mesh transmission path of the second initial signal may be provided in the first display region, so that the load of the transmission wiring of the second initial signal can be reduced, and the transmission uniformity of the second initial signal in the first display region can be improved.

In some examples, a single display island region of the first display region may be provided with twelve data lines, of which six data lines may pass through the region where the first region pixel circuits are located, and the remaining six data lines may surround the periphery of the three first region pixel circuits.

Figure 25B:
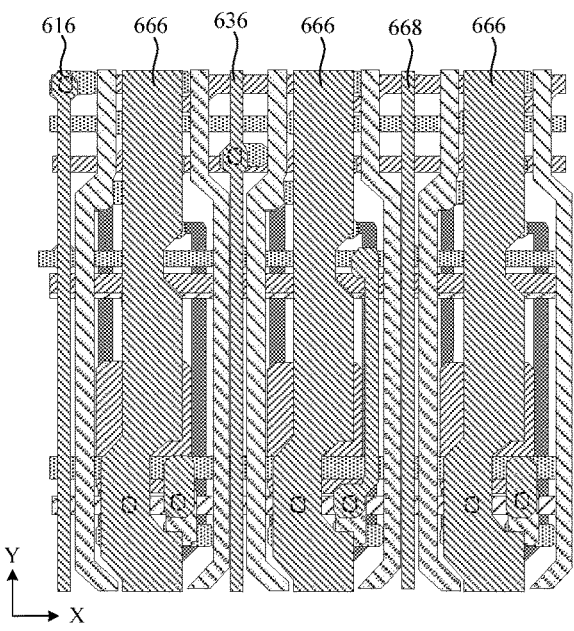
FIG. 25B is a partially enlarged schematic diagram of a display substrate after a sixth conductive layer is formed in a second display region according to at least one embodiment of the present disclosure.

FIG. 25B is a partially enlarged schematic diagram of a display substrate after a sixth conductive layer is formed in a second display region according to at least one embodiment of the present disclosure. FIG. 26B is a schematic diagram of the sixth conductive layer in FIG. 25B. In some examples, as shown in FIG. 25B and FIG. 26B, the sixth conductive layer of the second display region may include multiple connection electrodes (e.g. including a fifty-fourth connection electrode 284 to a fifty-sixth connection electrode 286), a sixth initial transmission line 616, a sixteenth initial transmission line 636, a sixth power supply transmission line 666, and an eighth power supply transmission line 668.

In some examples, the fifty-fourth connection electrode 284 may be electrically connected to the forty-seventh connection electrode 277 through the 174th via hole V174. The fifty-fifth connection electrode 285 may be electrically connected to the forty-eighth connection electrode 278 through the 175th via hole V175. The fifty-fifth connection electrode 285 may extend in the second direction Y. The fifty-sixth connection electrode 286 may be electrically connected to the forty-ninth connection electrode 279 through the 176th via hole V176.

In some examples, the sixth initial transmission line 616, the sixteenth initial transmission line 636, the sixth power supply transmission line 666, and the eighth power supply transmission line 668 may all extend in the second direction Y. The sixth initial transmission line 616 may be electrically connected to the twenty-seventh connection electrode 257 located in the fourth conductive layer through the 171st via hole V171 to achieve an electrical connection with the fourth initial transmission line 614. The sixteenth initial transmission line 636 located in the sixth conductive layer may transmit a second initial signal in the second direction Y. The fourteenth initial transmission line 634 located in the third conductive layer may transmit a second initial signal in the first direction X. By electrically connecting the sixteenth initial transmission line 636 to the fourteenth initial transmission line 634, a mesh transmission path of the second initial signal may be provided in the second display region, so that the load of the transmission wiring of the second initial signal can be reduced, and the transmission uniformity of the second initial signal in the second display region can be improved.

In some examples, the sixteenth initial transmission line 636 may be electrically connected to the twenty-eighth connection electrode 258 through the 172nd via hole V172 to achieve an electrical connection to the fourteenth initial transmission line 634. A sixth initial transmission line 616 located in the sixth conductive layer may transmit a first initial signal in the second direction Y. A fourth initial transmission line 614 located in the third conductive layer may transmit a first initial signal in a first direction X. By electrically connecting the sixth initial transmission line 616 to the fourth initial transmission line 614, a mesh transmission path of the first initial signal may be provided in the second display region, so that the load of the transmission wiring of the first initial signal can be reduced, and the transmission uniformity of the first initial signal in the second display region can be improved.

In some examples, the sixth power supply transmission line 666 may be electrically connected to the fourth power supply transmission line 664 located in the fourth conductive layer through the 173rd via hole V173. By electrically connecting the sixth power supply transmission line 666 to the fourth power supply transmission line 664, a mesh transmission path of the first voltage signal may be provided in the second display region, so that the load of the transmission wiring of the first voltage signal can be reduced, and the transmission uniformity of the first voltage signal in the second display region can be improved.

In some examples, in a second pixel unit of the second display region, the sixteenth initial transmission line 636 may be located between the fourth pixel circuit and the fifth pixel circuit, the sixth initial transmission line 634 may be located between the fourth pixel circuit and the sixth pixel circuit of an adjacent second pixel unit, and the eighth power supply transmission line 668 may be located between the fifth pixel circuit and the sixth pixel circuit.

In some examples, the sixth conductive layer of at least one connection region of the first display region may include a fifth power supply transmission line 665, a fifth initial transmission line 615, a fifteenth initial transmission line 635, and a seventh power supply transmission line 667 extending in the second direction Y.

In some examples, the film structure of the light-transmissive region of the first display region does not change after the sixth conductive layer is formed.

At this point, preparation of the drive circuit layer 102 may be completed. In this example, the display island region of the first display region and the drive circuit layer 102 of the second display region may include a first conductive layer, a first insulating layer, a first semiconductor layer, a second insulating layer, a second conductive layer, a third insulating layer, a second semiconductor layer, a fourth insulating layer, a third conductive layer, a fifth insulating layer, a fourth conductive layer, a sixth insulating layer, a fifth conductive layer, a seventh insulating layer, and a sixth conductive layer, which are stacked on the base. The drive circuit layer 102 of the connection region of the first display region may include a first conductive layer, a first insulating layer, a second insulating layer, a second conductive layer, a third insulating layer, a fourth insulating layer, a third conductive layer, a fifth insulating layer, a fourth conductive layer, a sixth insulating layer, a fifth conductive layer, a seventh insulating layer, and a sixth conductive layer, which are stacked on the base. The drive circuit layer 102 of the light-transmissive region of the first display region may include a first insulating layer to a seventh insulating layer stacked on the base.

In some examples, the first data line 511 to the third data line 513 and the tenth data line 520 to the twelfth data line 522 in the display island region are of an arc shape, so that the peripheral edge of the display island region (i.e., the second edge of the light-transmissive region in contact with the display island region) may be of an arc shape. The signal wirings (including, for example, data connection lines, data lines, scan signal lines, etc.) provided at multiple conductive film layers in the connection region may all be line segments or strips, and the peripheral edge of the connection region (i.e., the first edge of the light-transmissive region in contact with the connection region) may extend in one direction. The shape of the first edge of the light-transmissive region may be determined by the peripheral edge shape of the signal wirings nearest the light-transmissive region in the connection region (for example, the second initial transmission line 612, the third initial transmission line 613, the first scan signal line GL1(*n*+1), etc. located in the fifth conductive layer). However, this embodiment is not limited thereto. In other examples, in the connection region, an orthographic projection of the first shielding wiring 211 located in the first conductive layer on the base may cover orthographic projections of the signal wirings of the remaining conductive layers on the base, and an orthographic projection of the second shielding wiring 212 on the base may cover orthographic projections of the signal wirings of the remaining conductive layers on the base. In this way, the shape of the edge of the connection region near the light-transmissive region (i.e., the first edge of the light-transmissive region) may be determined by the shape of the peripheral edge of the first and second shielding wirings.

(13) An eighth insulating layer is formed. In some examples, an eighth insulating thin film is coated on the base on which the aforementioned patterns are formed, and the eighth insulating thin film is patterned by a patterning process to form an eighth insulating layer.

Figure 27A:
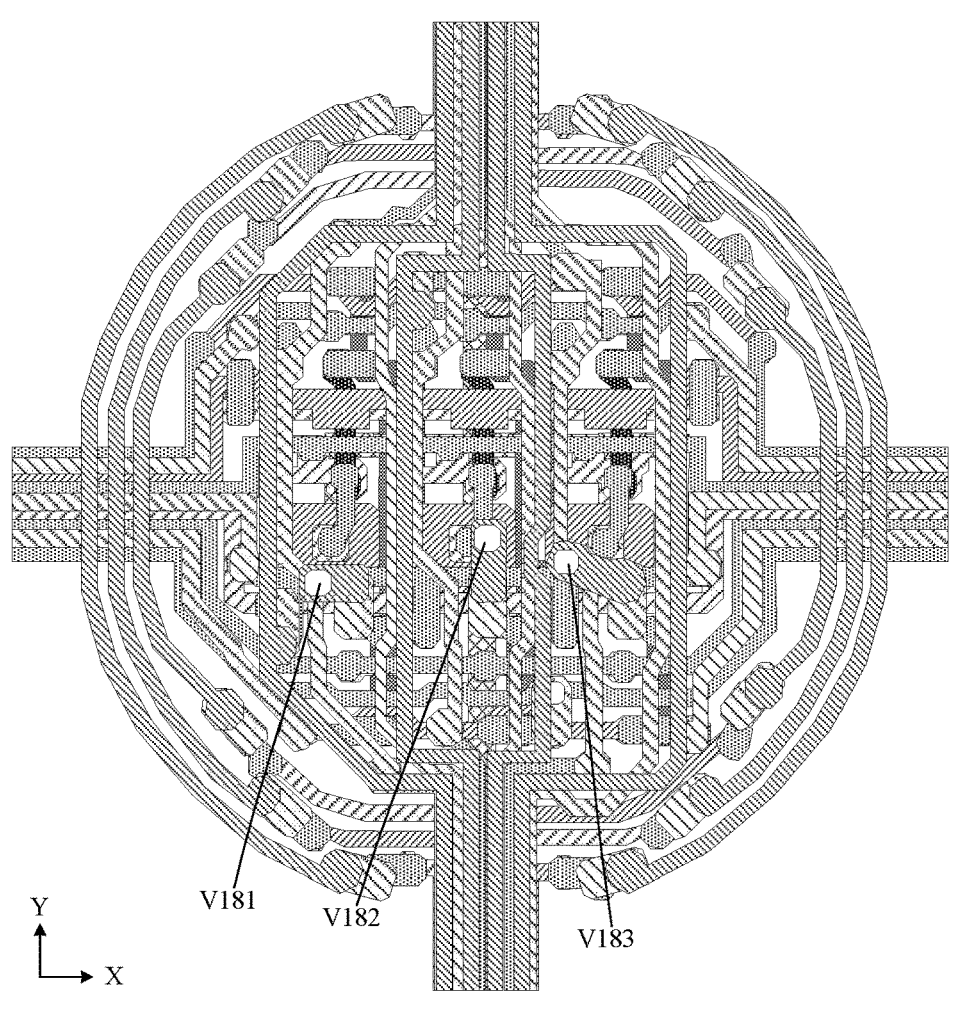
FIG. 27A is a partially enlarged schematic diagram of a display substrate after an eighth insulating layer is formed in a first display region according to at least one embodiment of the present disclosure.

FIG. 27A is a partially enlarged schematic diagram of a display substrate after an eighth insulating layer is formed in a first display region according to at least one embodiment of the present disclosure. In some examples, as shown in FIG. 27A, the eighth insulating layer of a single display island region of the first display region may be provided with multiple via holes, which may include, for example, the 181st via hole V181 to the 183rd via hole V183. The eighth insulating layers in the 181st via hole V181 to the 183rd via hole V183 may be removed exposing the surface of the sixth conductive layer.

Figure 27B:
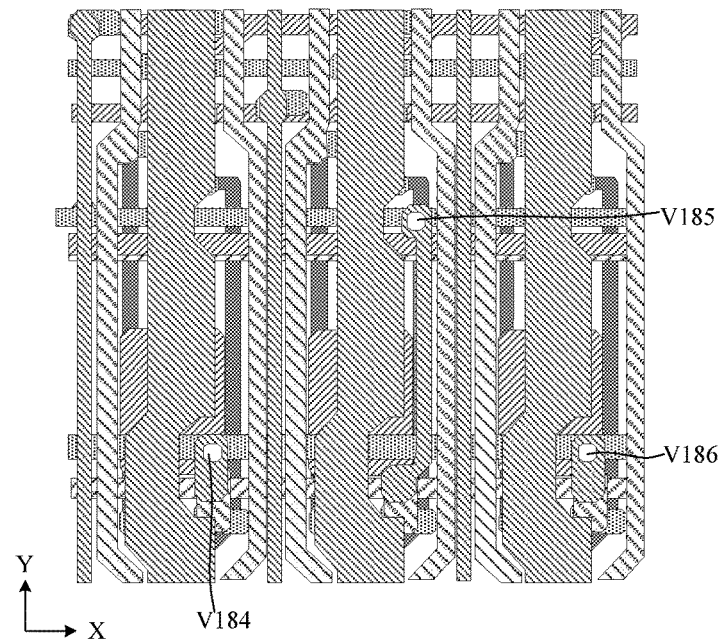
FIG. 27B is a partially enlarged schematic diagram of a display substrate after an eighth insulating layer is formed in a second display region according to at least one embodiment of the present disclosure.

FIG. 27B is a partially enlarged schematic diagram of a display substrate after an eighth insulating layer is formed in a second display region according to at least one embodiment of the present disclosure. In some examples, as shown in FIG. 27B, the eighth insulating layer of the second display region may be provided with multiple via holes. The via holes provided in the eighth insulating layer in the region where one second pixel unit of the second display region is located may include, for example, the 184th to the 186th via holes V184 to V186. The eighth insulating layers in the 184th via hole V184 to the 186th via hole V186 are removed, exposing the surface of the seventh conductive layer.

(14) An anode layer is formed. In some examples, an anode thin film is deposited on the base on which the aforementioned patterns are formed, and the anode thin film is patterned through a patterning process to form an anode layer.

Figure 28A:
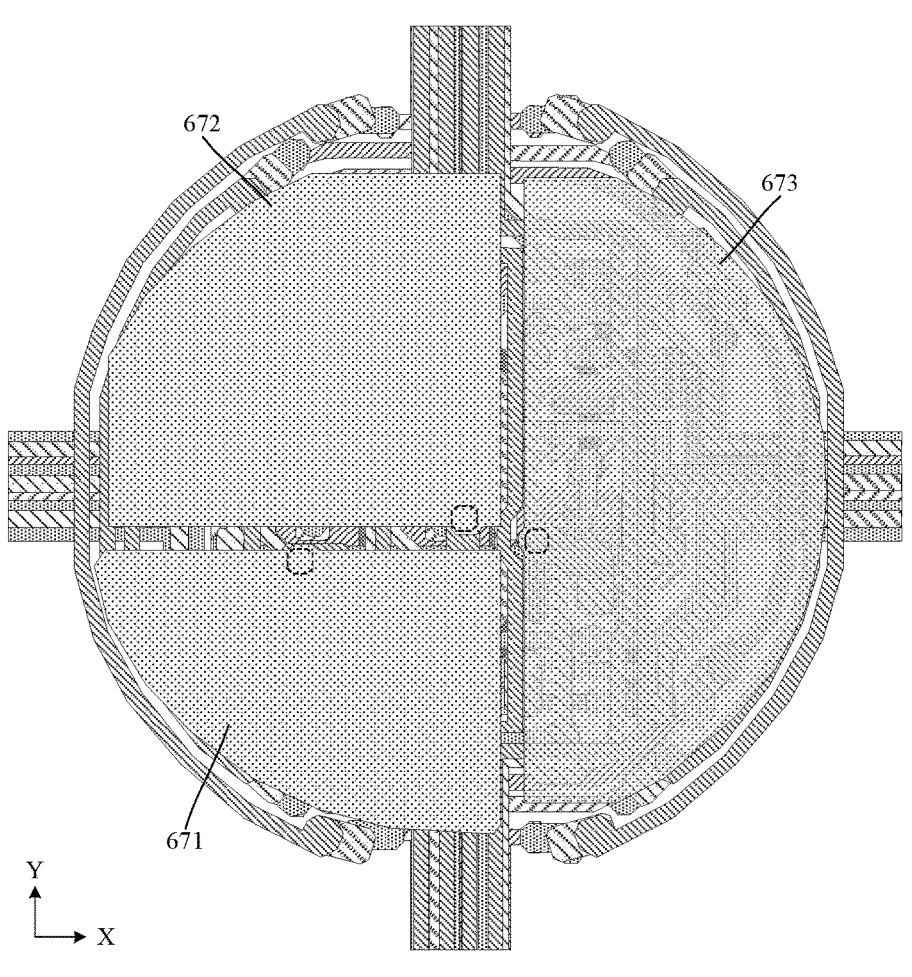
FIG. 28A is a partially enlarged schematic diagram of a display substrate after an anode layer is formed in a first display region according to at least one embodiment of the present disclosure.
Figure 29A:
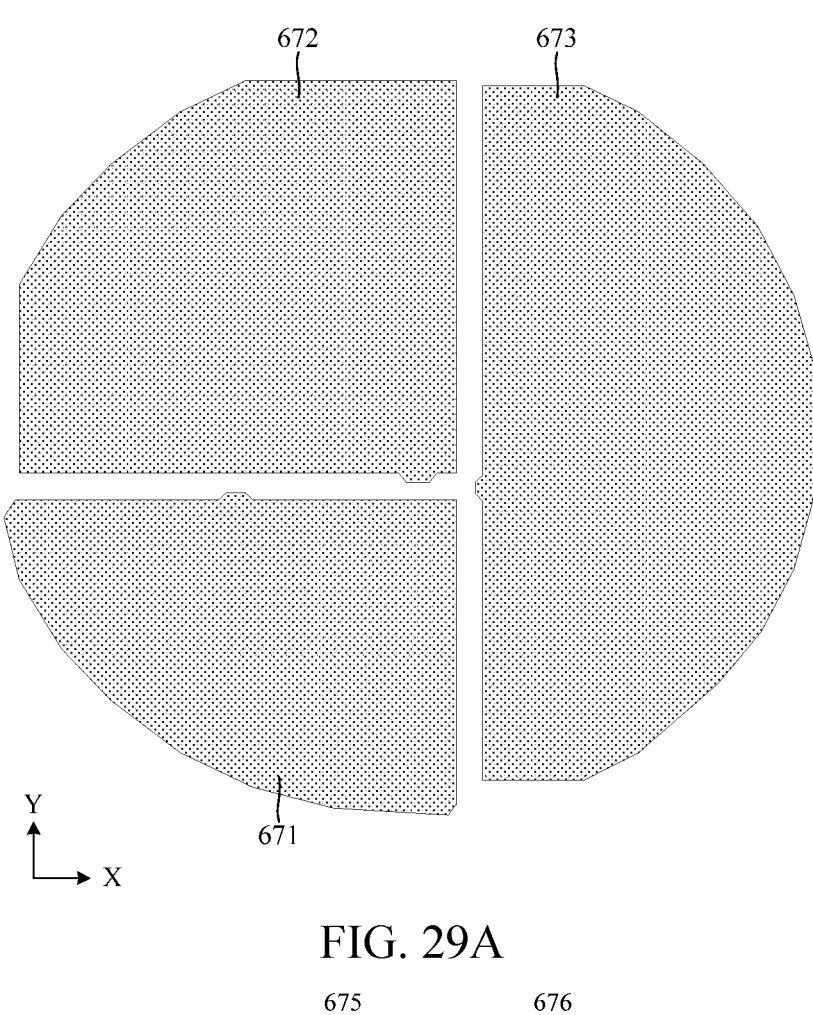
FIG. 29A is a schematic diagram of the anode layer in FIG. 28A.

FIG. 28A is a partially enlarged schematic diagram of a display substrate after an anode layer is formed in a first display region according to at least one embodiment of the present disclosure. FIG. 29A is a schematic diagram of the anode layer in FIG. 28A. In some examples, as shown in FIG. 28A and FIG. 29A, the anode layer of a single display island region of the first display region may include a first anode 671 of a first light emitting element, a second anode 672 of a second light emitting element, and a third anode 673 of a third light emitting element. The first anode 671 and the second anode 672 may be arranged in the second direction Y, and the third anode 673 may be located on a same side of the first anode 671 and the second anode 672 in the first direction X. The first anode 671, the second anode 672, and the third anode 673 may be combined to be a whole to substantially form a circular shape.

In some examples, as shown in FIG. 28A and FIG. 29A, the first anode 671 may be electrically connected to the 51st connection electrode 281 located in the sixth conductive layer through the 181st via hole V181, so that it may be electrically connected to the second region of the sixth active layer of the sixth transistor of the first pixel circuit through the 41st connection electrode 271 located in the fifth conductive layer and the fifth connection electrode 235 located in the fourth conductive layer. The second anode 672 may be electrically connected to the fifty-second connection electrode 282 located in the sixth conductive layer through the 182nd via hole V182, so that it may be electrically connected to the second region of the sixth active layer of the sixth transistor of the second pixel circuit through the forty-second connection electrode 272 located in the fifth conductive layer and the eleventh connection electrode 241 located in the fourth conductive layer. The third anode 673 may be electrically connected to the fifty-third connection electrode 283 located in the sixth conductive layer through the 183rd via hole V183, so that it may be electrically connected to the second region of the sixth active layer of the sixth transistor of the third pixel circuit through the forty-third connection electrode 273 located in the fifth conductive layer and the seventeenth connection electrode 247 located in the fourth conductive layer.

Figure 28B:
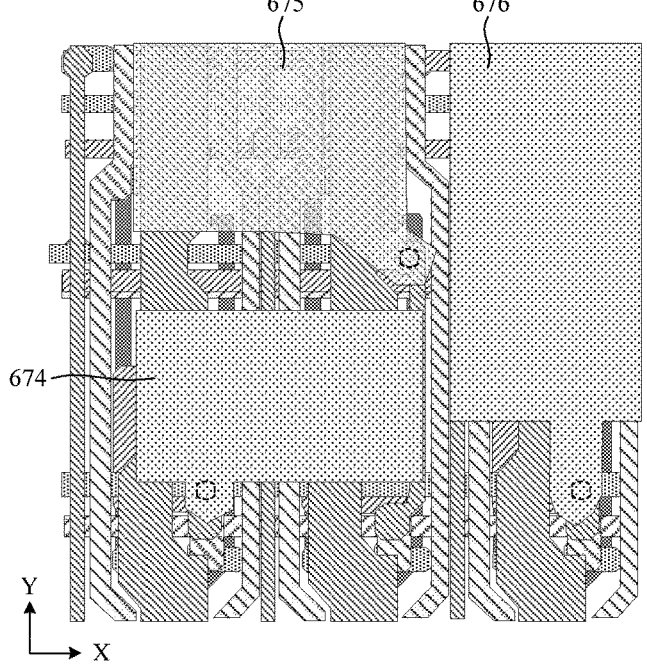
FIG. 28B is a partially enlarged schematic diagram of a display substrate after an anode layer is formed in a second display region according to at least one embodiment of the present disclosure.
Figure 29B:
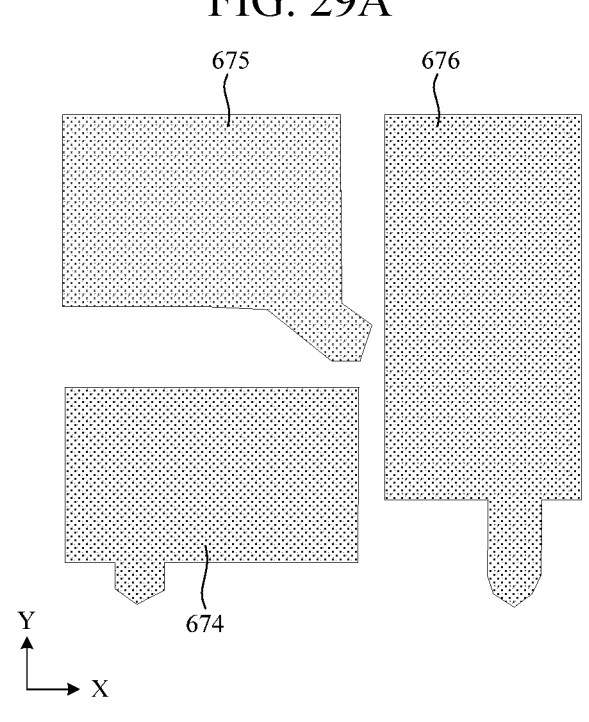
FIG. 29B is a schematic diagram of the anode layer in FIG. 28B.

FIG. 28B is a partially enlarged schematic diagram of a display substrate after an anode layer is formed in a second display region according to at least one embodiment of the present disclosure. FIG. 29B is a schematic diagram of the anode layer in FIG. 28B. In some examples, as shown in FIG. 29A and FIG. 29B, the anode layer of the second display region may include: multiple anodes (for example, including a fourth anode 674 of the fourth light emitting element, a fifth anode 675 of the fifth light emitting element, and a sixth anode 676 of the sixth light emitting element). The fourth and fifth anodes 674 and 675 may be arranged in the second direction Y, and the sixth anode 676 may be located on a same side of the fourth and fifth anodes 674 and 675 in the first direction X. The shape of the fourth anode 674, the fifth anode 675, and the sixth anode 676 as a whole may be substantially a rectangular.

In some examples, as shown in FIG. 29A and FIG. 29B, the fourth anode 674 may be electrically connected to the fifty-fourth connection electrode 284 located in the sixth conductive layer through the 184th via hole V184, so that it may be electrically connected to the second region of the sixth active layer of the sixth transistor of the fourth pixel circuit through the forty-seventh connection electrode 277 located in the fifth conductive layer and the twenty-sixth connection electrode 256 located in the fourth conductive layer. The fifth anode 675 may be electrically connected to the fifty-fifth connection electrode 285 located in the sixth conductive layer through the 185th via hole V185, so that it may be electrically connected to the second region of the sixth active layer of the sixth transistor of the fifth pixel circuit through the forty-eighth connection electrode 278 located in the fifth conductive layer and the thirtieth connection electrode 260 located in the fourth conductive layer. The sixth anode 676 may be electrically connected to the fifty-sixth connection electrode 286 located in the sixth conductive layer through the 186th via hole V186, so that it may be electrically connected to the second region of the sixth active layer of the sixth transistor of the sixth pixel circuit through the forty-ninth connection electrode 279 located in the fifth conductive layer and the thirty-second connection electrode 262 located in the fourth conductive layer.

(15) A pixel define layer is formed. In some examples, a pixel define thin film is coated on the base on which the aforementioned patterns are formed, and a pixel define layer (PDL) is formed by masking, exposure and development processes.

Figure 30A:
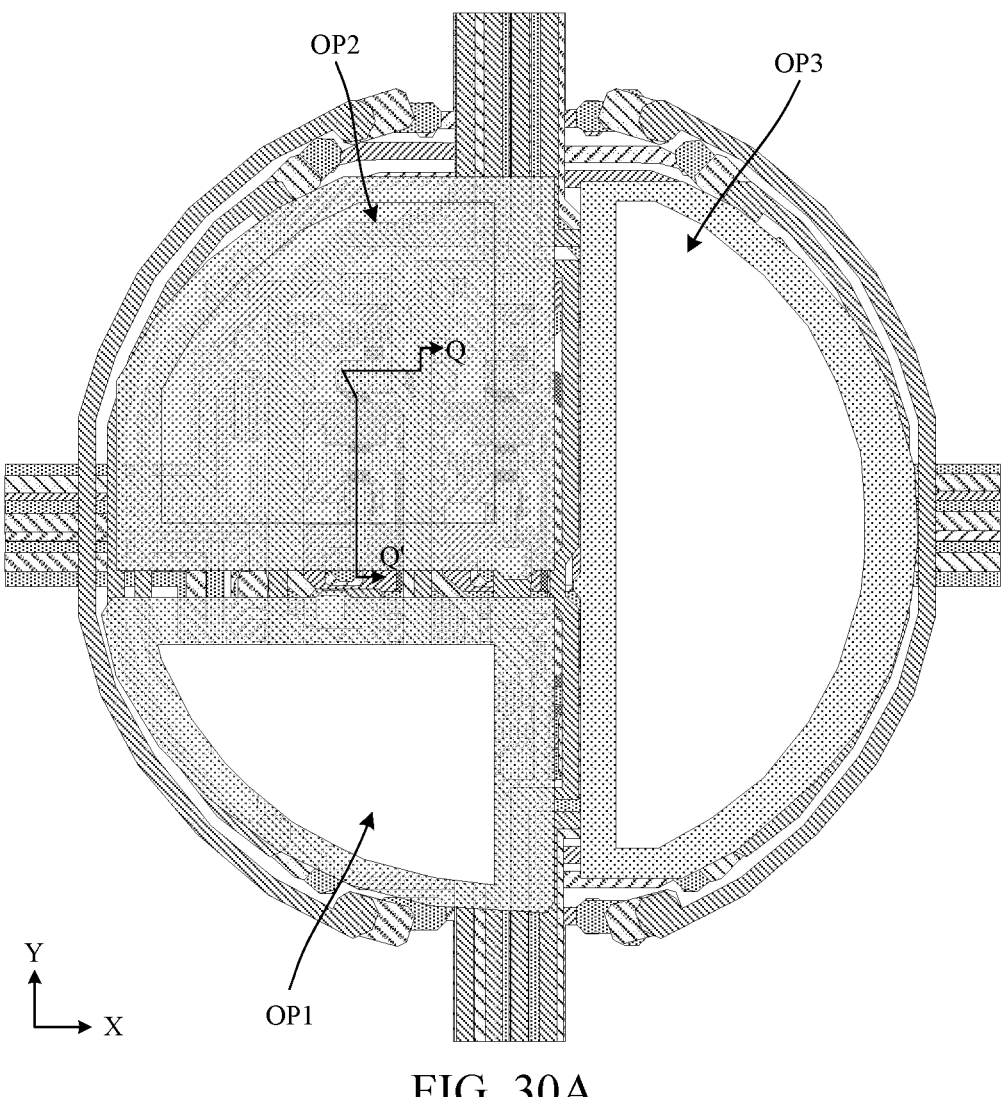
FIG. 30A is a partially enlarged schematic diagram of a display substrate after a pixel define layer is formed in a first display region according to at least one embodiment of the present disclosure.

FIG. 30A is a partially enlarged schematic diagram of a display substrate after a pixel define layer is formed in a first display region according to at least one embodiment of the present disclosure. In some examples, as shown in FIG. 30A, the pixel define layer of a single display island region of the first display region may be provided with a first pixel opening OP1, a second pixel opening OP2 and a third pixel opening OP3. The first pixel opening OP1 may expose the surface of the first anode 671, the second pixel opening OP2 may expose the surface of the second anode 672, and the third pixel opening OP3 may expose the surface of the third anode 673.

Figure 30B:
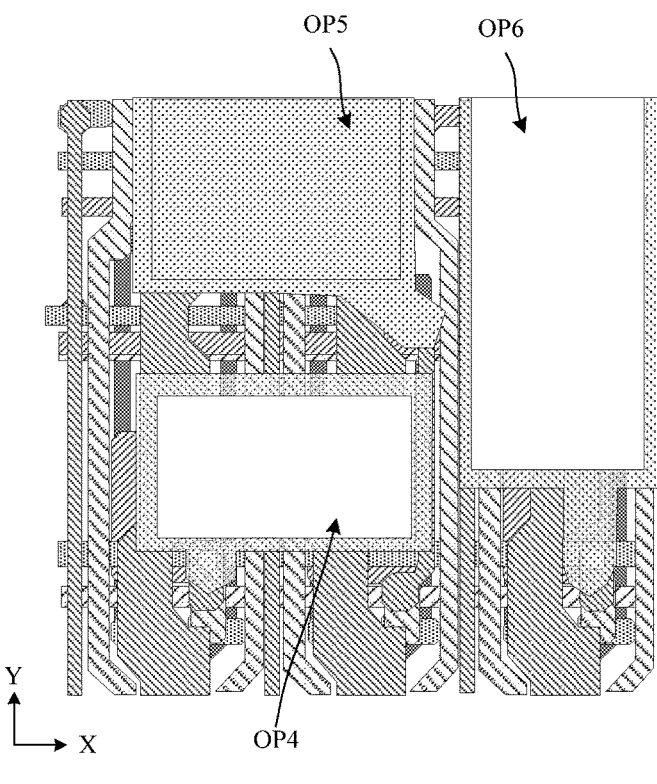
FIG. 30B is a partially enlarged schematic diagram of a display substrate after a pixel define layer is formed in a second display region according to at least one embodiment of the present disclosure.

FIG. 30B is a partially enlarged schematic diagram of a display substrate after a pixel define layer is formed in a second display region according to at least one embodiment of the present disclosure. In some examples, as shown in FIG. 30B, the pixel define layer of the second display region may be provided with multiple pixel openings (for example, including a fourth pixel opening OP4 to a sixth pixel opening OP6). The fourth pixel opening OP4 may expose the surface of the fourth anode 674, the fifth pixel opening OP5 may expose the surface of the fifth anode 675, and the sixth pixel opening OP6 may expose the surface of the sixth anode 676.

(16) An organic light emitting layer, a cathode layer and an encapsulation layer are formed. In some examples, organic light emitting layers may be formed within the previously formed pixel openings, and the organic light emitting layers are connected with the anode. Subsequently, a cathode thin film is deposited, and the cathode thin film is patterned through a patterning process to form a cathode layer, and the cathode layer is electrically connected to the organic light emitting layer and the second power supply line, respectively. Then, an encapsulation layer is formed on the cathode layer. The encapsulation layer may include a stacked structure of an inorganic material/an organic material/an inorganic material.

Figure 31:
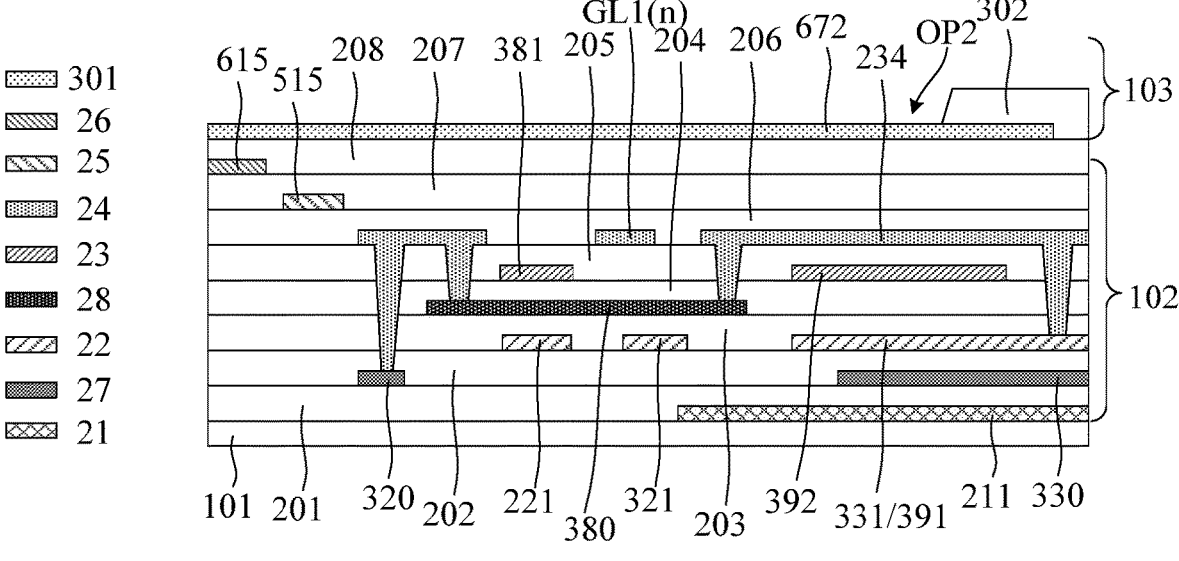
FIG. 31 is a partial cross-sectional schematic diagram along a Q-Q' direction in FIG. 30A.

FIG. 31 is a partial cross-sectional schematic diagram along a Q-Q' direction in FIG. 30A. In some examples, as shown in FIG. 31, in a direction perpendicular to the display substrate, a single display island region of the first display region may include: a base 101, and a drive circuit layer 102 and a light emitting structure layer 103 disposed on the base 101. The drive circuit layer 102 may include: a first conductive layer 21, a first insulating layer 201, a first semiconductor layer 27, a second insulating layer 202, a second conductive layer 22, a third insulating layer 203, a second semiconductor layer 28, a fourth insulating layer 204, a third conductive layer 23, a fifth insulating layer 205, a fourth conductive layer 24, a sixth insulating layer 206, a fifth conductive layer 25, a seventh insulating layer 207, and a sixth conductive layer 26. An eighth insulating layer 208 is provided between the drive circuit layer 102 and the light emitting structure layer 103. The light emitting structure layer 103 may include an anode layer 301, a pixel define layer 302, an organic emitting layer, and a cathode layer. The structure of each film layer is as described above, and it will not be repeated here.

In some exemplary embodiments, the first conductive layer to the sixth conductive layer may be made of a metal material, such as any one or more of silver (Ag), copper (Cu), aluminum (Al) and molybdenum (Mo), or an alloy material of the above metals, such as aluminum neodymium alloy (AlNd) or molybdenum niobium alloy (MoNb), and may be a single-layer structure or a multi-layer composite structure, such as Mo/Cu/Mo. The first insulating layer to the fifth insulating layer may be any one or more of silicon oxide (SiOx), silicon nitride (SiNx), and silicon oxynitride (SiON), and may be in a single layer, multiple layers, or a composite layer. The sixth insulating layer to the eighth insulating layer may also be referred to as planarization layers, and may adopt an organic material such as polyimide, acrylic or polyethylene terephthalate. The pixel define layer may be made of an organic material, such as polyimide, acrylic, or polyethylene terephthalate. The anode layer may be made of a reflective material such as a metal, and the cathode layer may be made of a transparent conductive material. However, this embodiment is not limited thereto.

The display substrate provided by the embodiments can reduce the wiring space of four corner regions of the display island region by adjusting the wiring of the display island region, so that the display island region is circular or oval, thereby reducing the diffraction defect of the display substrate, for example, improving the shooting effect of a camera under the display substrate. Moreover, the area of the light-transmissive region can be increased, thereby improving the light transmittance of the first display region. Moreover, in the second display region of the display substrate, the second region pixel circuits of odd and even rows are connected with different data lines, which can ensure that the data signal matches the parasitic capacitor of the pixel circuit. The wiring of the first display region may be consistent with the wiring of the second display region, and multiple data lines are surrounded around the periphery of the first region pixel circuit to reduce interference of the data lines passing through the display island region to the first region pixel circuit.

A structure and the preparation process of the display substrate of the embodiment are merely illustrative. In some exemplary implementations, a corresponding structure may be changed and a patterning process may be increased or decreased according to actual needs. For example, the first conductive layer may not be provided. However, this embodiment is not limited thereto.

The preparation process of the exemplary embodiment may be implemented using an existing mature preparation device, and can be compatible well with an existing preparation process, thereby it is simple in process implementation, easy to implement, high in a production efficiency, low in a production cost, and high in a yield.

Figure 32A:
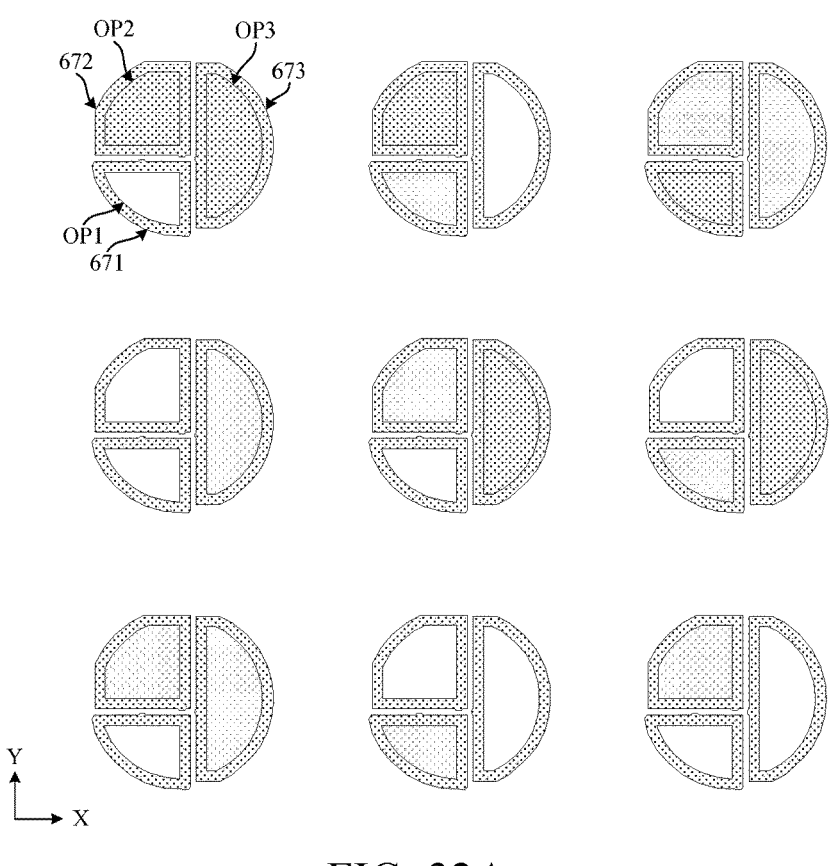
FIG. 32A is a partial schematic diagram of a first display region according to at least one embodiment of the present disclosure.
Figure 32B:
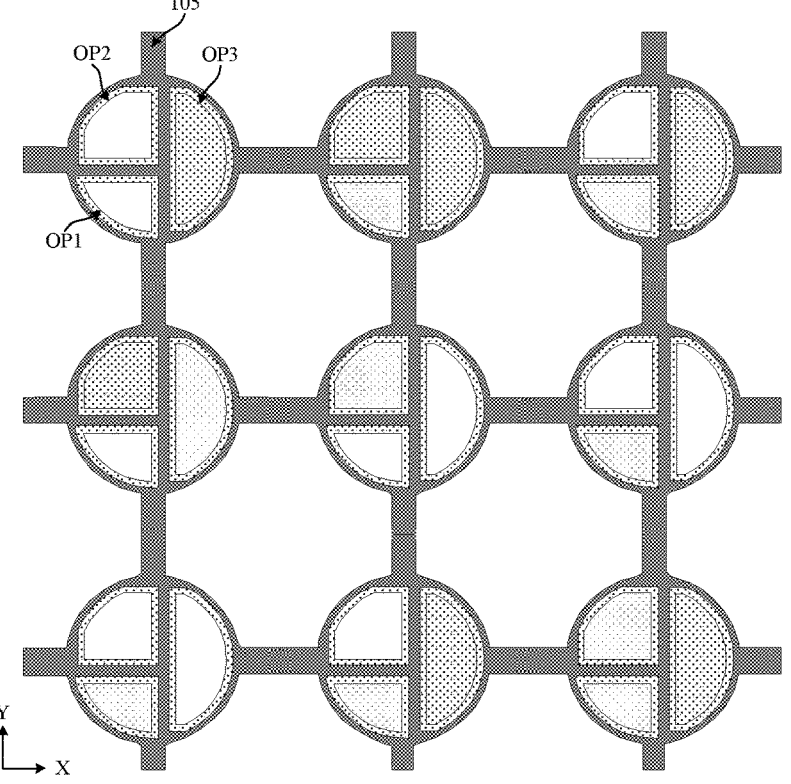
FIG. 32B is a partial schematic diagram of a display substrate after a black matrix is formed in the first display region according to at least one embodiment of the present disclosure.
Figures 32C, 33:
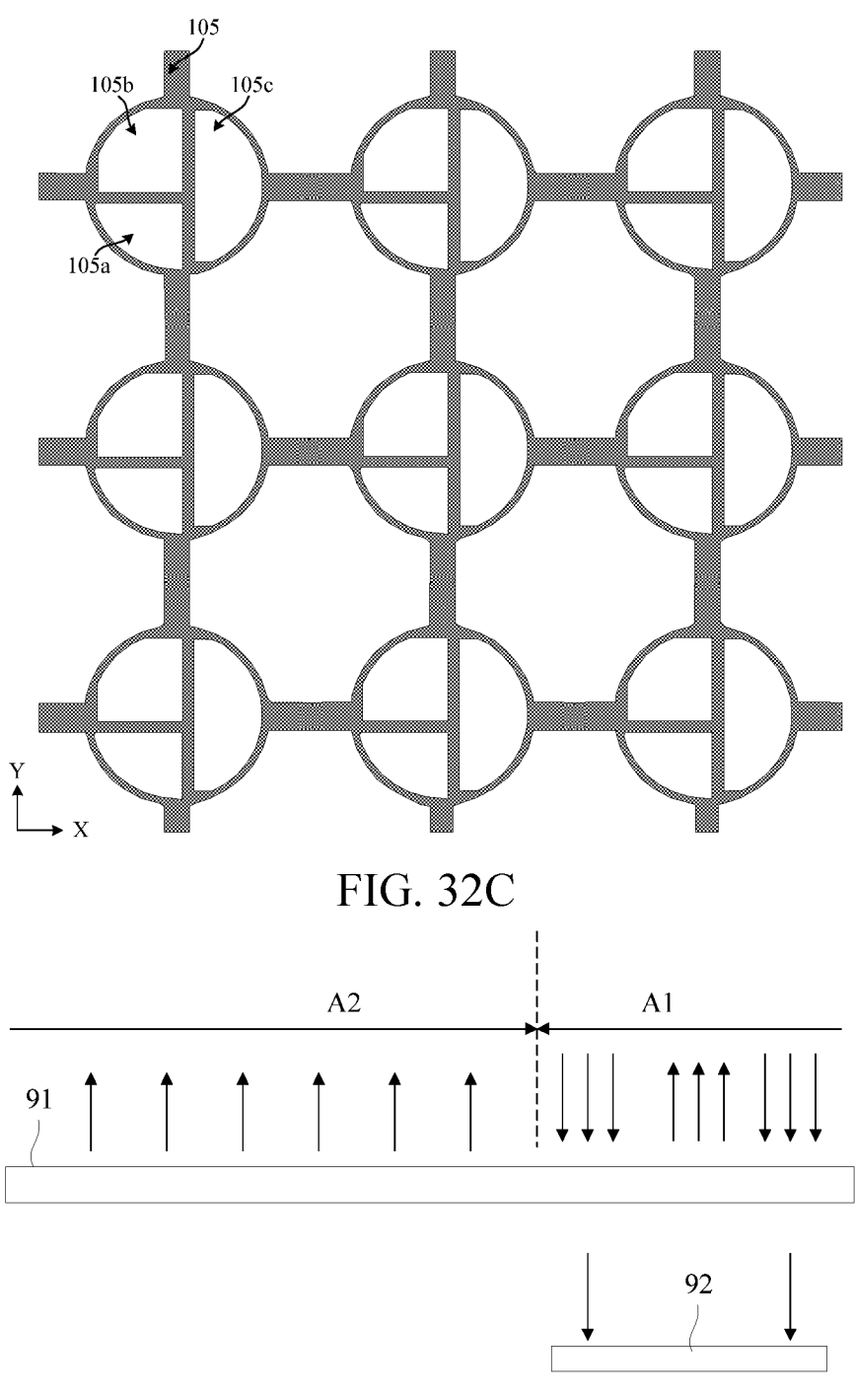
FIG. 32C is a schematic diagram of the black matrix in FIG. 32B.
FIG. 33 is a schematic diagram of a display apparatus according to at least one embodiment of the present disclosure.

FIG. 32A is a partial schematic diagram of a first display region according to at least one embodiment of the present disclosure. FIG. 32B is a partial schematic diagram of a display substrate after a black matrix is formed in the first display region according to at least one embodiment of the present disclosure. FIG. 32C is a schematic diagram of a black matrix in FIG. 32B. Anode layers of multiple first pixel units (e.g. including a first anode 671 of a first light emitting element, a second anode 672 of a second light emitting element, and a third anode 673 of a third light emitting element) and pixel openings of a pixel define layer (e.g. a first pixel opening OP1, a second pixel opening OP2, and a third pixel opening OP3) are illustrated in FIG. 32A.

In some examples, the black matrix 105 may be located on a side of the encapsulation layer away from the base. For example, the black matrix may be provided in both the first display region and the second display region, or the black matrix may be provided only in the first display region. In the first display region, the black matrix 105 may be located in the connection region and the display island region. An orthographic projection of the black matrix 105 on the base and the light-transmissive region may not overlap. The black matrix 105 in the display island region may include a first matrix opening 105a, a second matrix opening 105b, and a third matrix opening 105c. An orthographic projection of the first pixel opening OP1 on the base may be within the range of an orthographic projection of the first matrix opening 105a on the base. An orthographic projection of the second pixel opening OP2 on the base may be within the range of an orthographic projection of the second matrix opening 105b on the base. An orthographic projection of the third pixel opening OP3 on the base may be within the range of an orthographic projection of the third matrix opening 105c on the base. An orthographic projection of the first matrix opening 105a on the base may be within the range of an orthographic projection of the first anode 671 on the base. An orthographic projection of the second matrix opening 105b on the base may be within the range of an orthographic projection of the second anode 672 on the base. An orthographic projection of the third matrix opening 105c on the base may be within the range of an orthographic projection of the third anode 673 on the base. In this example, the anode layer of the display island region may cover the gap between the black matrix 105 and the pixel openings of the pixel define layer, so that light leakage from the gap can be avoided, and diffraction caused by the gap can be reduced. Moreover, the connection region may be covered by the black matrix, which can reduce the extension caused by gaps between wirings. In some other examples, the anode layer of the second display region may also cover the gap between the black matrix and the pixel openings of the pixel define layer. However, this embodiment is not limited thereto.

In this example, the black matrix may cover the non-light emitting region and the connection region of the display island region. The shapes of the first edge and the second edge of the light-transmissive region may be determined by the shape of the peripheral edge of the black matrix. For example, the first edge and the second edge of the light-transmissive region may both be flat edges. Alternatively, the first and second edges of the light-transmissive region may be uneven edges, for example, there may be some minor deformation caused by tolerances.

At least one embodiment of the present disclosure further provides a display apparatus which includes the display substrate as described above.

FIG. 33 is a schematic diagram of a display apparatus according to at least one embodiment of the present disclosure. As shown in FIG. 33, a display apparatus is provide in this embodiment, which includes a display substrate 91 and a photosensitive sensor 92 located on a light exit side of a light emitting structure layer away from the display substrate 91. The photosensitive sensor 92 is located on the non-display side of the display substrate 91. An orthographic projection of the photosensitive sensor 92 on the display substrate 91 is overlapped with the first display region A1.

In some exemplary implementations, the display substrate 91 may be a flexible OLED display substrate, a QLED display substrate, a Micro-LED display substrate or a Mini-LED display substrate. The display apparatus may be a product having an image (including a still image or a moving image, wherein the moving image may be a video) display function. For example, the display apparatus may be: displays, televisions, billboards, digital photo frames, laser printers with display function, telephones, mobile phones, picture screens, personal digital assistants (PDA), digital cameras, portable camcorders, viewfinders, navigators, vehicles, large-area walls, information inquiry equipment (such as business inquiry equipment in e-government, banks, hospitals, power departments, etc.), monitors, etc. As another example, the display apparatus may be any one of a micro-display, a VR device including a micro-display, or an AR device.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising a first display region, wherein the first display region comprises a plurality of display island regions spaced apart from each other, a light-transmissive region between adjacent display island regions, and a connection region connecting adjacent display island regions;

a display island region comprises a first pixel unit arranged on a base, wherein the first pixel unit comprises a first region pixel circuit and a first region light emitting element electrically connected with the first region pixel circuit; an orthographic projection of the first region pixel circuit on the base overlaps with an orthographic projection of the first region light emitting element electrically connected with the first region pixel circuit on the base;

and the display island region has an arc edge;

wherein the display island region further comprises a plurality of data lines; the first region pixel circuit is electrically connected with a data line, and an orthographic projection of the first region pixel circuit on the base overlaps with orthographic projections of two data lines on the base;

at least one of the plurality of data lines surrounds out sides of all first region pixel circuits of the first pixel unit.

2. The display substrate according to claim 1, wherein the display island region is circular or oval.

3. The display substrate according to claim 1, wherein edges of the light-transmissive region comprise: a first edge contacting the connection region, and a second edge contacting the display island region; first edges and second edges are connected in an interleaved mode, and the second edge is arc-shaped.

4. The display substrate according to claim 3, wherein the light-transmissive region is octagonal.

5. The display substrate according to claim 1, wherein the display island region comprises a first pixel unit, the first pixel unit comprises three first region light emitting elements; the three first region light emitting elements comprise a first light emitting element emitting light of a first color, a second light emitting element emitting light of a second color, and a third light emitting element emitting light of a third color.

6. The display substrate according to claim 5, wherein light emitting regions of the first light emitting element, the second light emitting element, and the third light emitting element as a whole are formed as a circular or oval shape.

7. The display substrate according to claim 5, wherein the first pixel unit further comprises three first region pixel circuits, the three first region pixel circuits and the three first region light emitting elements are electrically connected in a one-to-one correspondence;

the three first region pixel circuits are sequentially arranged along a first direction; the first light emitting element and the second light emitting element are sequentially arranged in a second direction, and the third light emitting element is located on a same side of the first light emitting element and the second light emitting element in the first direction; wherein the first direction intersects the second direction.

8. The display substrate according to claim 1, wherein the first pixel unit comprises three first region pixel circuits; the three first region pixel circuits comprise a first pixel circuit, a second pixel circuit and a third pixel circuit arranged in sequence along a first direction;

the display island region comprises a first data line to a twelfth data line arranged in sequence along the first direction;

the first to third data lines are located on a side of the three first region pixel circuits in the first direction, and the tenth to twelfth data lines are located on the other side of the three first region pixel circuits in the first direction;

the first pixel circuit is electrically connected with the fourth data line, and an orthographic projection of the first pixel circuit on the base overlaps with orthographic projections of the fourth data line and the fifth data line on the base;

the second pixel circuit is electrically connected with the sixth data line, and an orthographic projection of the second pixel circuit on the base overlaps with orthographic projections of the sixth data line and the seventh data line on the base; and the third pixel circuit is electrically connected to the eighth data line, and an orthographic projection of the third pixel circuit on the base overlaps with orthographic projections of the eighth data line and the ninth data line on the base.

9. The display substrate according to claim 8, wherein the first data line to the third data line, and the tenth data line to the twelfth data line are all arc-shaped wirings that bend towards a direction away from the first region pixel circuit in the first direction, wherein a bending direction of the first data line to the third data line is different from a bending direction of the tenth data line to the twelfth data line; and/or the first data line to the third data line and the tenth data line to the twelfth data line are of a same layer structure and are located on a side of the fourth data line to the ninth data line away from the base.

10. The display substrate according to claim 1, wherein the first region pixel circuit comprises: at least one first-type transistor, at least one second-type transistor, and a storage capacitor, and a transistor type of the first-type transistor is different from that of the second-type transistor.

11. The display substrate according to claim 10, wherein in a direction perpendicular to the display substrate, the first display region at least comprises: a base, and a first semiconductor layer, a second conductive layer, a second semiconductor layer, a third conductive layer, a fourth conductive layer, a fifth conductive layer and a sixth conductive layer that are disposed on the base;

the first semiconductor layer at least comprises an active layer of the first-type transistor of the first region pixel circuit;

the second conductive layer at least comprises: a gate of the first-type transistor of the first region pixel circuit;

the second semiconductor layer at least comprises an active layer of the second-type transistor of the first region pixel circuit;

the third conductive layer at least comprises a gate of the second-type transistor of the first region pixel circuit;

the fourth conductive layer at least comprises: a plurality of scan signal lines electrically connected to the first region pixel circuit;

the fifth conductive layer at least comprises a plurality of data lines electrically connected or overlapped with the first region pixel circuit; and the sixth conductive layer at least comprises a plurality of data lines located on periphery of the first region pixel circuit.

12. The display substrate according to claim 11, wherein the first semiconductor layer, the second conductive layer, the second semiconductor layer, the third conductive layer, the fourth conductive layer, the fifth conductive layer and the sixth conductive layer are sequentially arranged on the base.

13. The display substrate according to claim 11, wherein the sixth conductive layer of the display island region further comprises: a power supply transmission line for transmitting a first voltage signal, a power supply transmission line for transmitting a second voltage signal, an initial transmission line for transmitting a first initial signal, and an initial transmission line for transmitting a second initial signal.

14. The display substrate according to claim 1, further comprising: a second display region located on at least one side of the first display region; the second display region comprises a plurality of second pixel units disposed on the base, a second pixel unit of the plurality of second pixel units comprises a second region pixel circuit and a second region light emitting element electrically connected with the second region pixel circuit; an orthographic projection of the second region pixel circuit on the base overlaps with an orthographic projection of the second region light emitting element electrically connected with the second region pixel circuit on the base;

wherein, a density of first pixel units in the first display region is lower than a density of the plurality of second pixel units in the second display region.

15. The display substrate according to claim 14, wherein two rows of second pixel units of the second display region correspond to one row of first pixel units of the first display region, and two columns of second pixel units of the second display region correspond to one column of first pixel units of the first display region.

16. The display substrate according to claim 14, wherein the second display region further comprises a plurality of data lines, a second region pixel circuit in a 2n-th row and a j-th column is connected to a different data line from a second region pixel circuit in a (2n−1)-th row and a j-th column, wherein both n and j are integers.

17. The display substrate according to claim 1, wherein the display island region further comprises: a pixel define layer, and a black matrix located on a side of the pixel define layer away from the base;

the pixel define layer has a pixel opening that exposes a portion of an anode of the first region light emitting element; the black matrix has a matrix opening; an orthographic projection of the matrix opening on the base covers an orthographic projection of the pixel opening on the base, and an orthographic projection of the anode of the first region light emitting element on the base covers the orthographic projection of the matrix opening on the base.

18. The display substrate according to claim 17, wherein the black matrix covers the connection region.

19. A display apparatus, comprising: the display substrate according to claim 1, and a sensor located on a non-display side of the display substrate, and an orthographic projection of the sensor on the display substrate overlaps with the first display region of the display substrate.

20. The display substrate according to claim 8, wherein the first data line to the third data line and the tenth data line to the twelfth data line are of a same layer structure and are located on a side of the fourth data line to the ninth data line away from the base.

* * * * *